(12) United States Patent
Thyssen et al.

(10) Patent No.: US 9,197,181 B2
(45) Date of Patent: Nov. 24, 2015

(54) LOUDNESS ENHANCEMENT SYSTEM AND METHOD

(75) Inventors: Jes Thyssen, Laguna Niguel, CA (US); Wilfrid LeBlanc, Vancouver (CA); Juin-Hwey Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1774 days.

(21) Appl. No.: 12/510,445

(22) Filed: Jul. 28, 2009

(65) Prior Publication Data

US 2009/0287496 A1 Nov. 19, 2009

Related U.S. Application Data

(63) Continuation-in-part of application No. 12/464,355, filed on May 12, 2009.

(60) Provisional application No. 61/052,553, filed on May 12, 2008.

(51) Int. Cl.
*G10L 19/00* (2013.01)
*H03G 9/02* (2006.01)
*H03G 7/00* (2006.01)
*H03G 9/00* (2006.01)

(52) U.S. Cl.
CPC ............. *H03G 9/025* (2013.01); *H03G 7/007* (2013.01); *H03G 9/005* (2013.01)

(58) Field of Classification Search
CPC .. G10L 21/0364; H03G 7/00; H03F 2200/66; H04L 27/2623; H04L 27/2624
USPC ............ 704/500, 233, 226, 225, 205; 381/88, 381/99, 60, 57; 379/406.08
See application file for complete search history.

(56) References Cited

U.S. PATENT DOCUMENTS

| | | | |
|---|---|---|---|
| 4,630,305 A | 12/1986 | Borth et al. | |
| 4,811,404 A | 3/1989 | Vilmur et al. | |
| 5,278,912 A | 1/1994 | Waldhauer | |
| 5,295,225 A | 3/1994 | Kane et al. | |
| 5,467,393 A | 11/1995 | Rasmusson | |
| 5,544,250 A | 8/1996 | Urbanski | |
| 5,615,270 A * | 3/1997 | Miller et al. | 381/57 |

(Continued)

OTHER PUBLICATIONS

Boillot et al., "A Loudness Enhancement Technique for Speech", ISCAS, IEEE, 2004, pp. 616-619.

(Continued)

*Primary Examiner* — Douglas Godbold
*Assistant Examiner* — Mark Villena
(74) *Attorney, Agent, or Firm* — Fiala & Weaver P.L.L.C.

(57) ABSTRACT

A loudness enhancement system and method is described that increases the loudness of an audio signal being played back by an audio device that places limits on the dynamic range of the audio signal. In an embodiment, the loudness enhancement system and method compresses the audio signal to an adaptively-determined compression limit that is greater than or equal to a maximum desired output level and then applies an adaptively-determined degree of soft clipping to the compressed audio signal. The compression limit and degree of soft clipping may be determined based on an overload measure that is calculated for successive portions of the audio signal. The loudness enhancement system and method advantageously operates in a manner that generates less distortion than the method of simply over-driving the audio signal such that hard-clipping occurs.

45 Claims, 40 Drawing Sheets

(56) References Cited

U.S. PATENT DOCUMENTS

| | | | |
|---|---|---|---|
| 5,666,429 A | 9/1997 | Urbanski | |
| 5,706,352 A | 1/1998 | Engebretson et al. | |
| 5,724,480 A | 3/1998 | Yamaura | |
| 6,233,548 B1 | 5/2001 | Schwartz et al. | |
| 6,275,596 B1 | 8/2001 | Fretz et al. | |
| 6,418,408 B1 | 7/2002 | Bhaskar et al. | |
| 6,453,289 B1 | 9/2002 | Ertem et al. | |
| 6,535,846 B1 | 3/2003 | Shashoua | |
| 6,542,864 B2 | 4/2003 | Cox et al. | |
| 6,735,567 B2 | 5/2004 | Gao et al. | |
| 6,741,966 B2* | 5/2004 | Romesburg | 704/500 |
| 6,766,020 B1* | 7/2004 | Tian et al. | 379/406.05 |
| 6,810,273 B1 | 10/2004 | Mattila et al. | |
| 6,848,012 B2 | 1/2005 | LeBlanc et al. | |
| 6,928,495 B2 | 8/2005 | LeBlanc et al. | |
| 6,931,373 B1 | 8/2005 | Bhaskar et al. | |
| 6,959,275 B2* | 10/2005 | Erell | 704/225 |
| 6,993,480 B1 | 1/2006 | Klayman | |
| 7,165,130 B2 | 1/2007 | LeBlanc et al. | |
| 7,190,795 B2 | 3/2007 | Simon | |
| 7,242,783 B1 | 7/2007 | Weeks et al. | |
| 7,272,556 B1 | 9/2007 | Aguilar et al. | |
| 7,283,585 B2 | 10/2007 | LeBlanc et al. | |
| 7,283,956 B2 | 10/2007 | Ashley et al. | |
| 7,333,475 B2 | 2/2008 | LeBlanc et al. | |
| 7,409,056 B2 | 8/2008 | LeBlanc et al. | |
| 7,457,757 B1* | 11/2008 | McNeill et al. | 704/500 |
| 7,464,029 B2 | 12/2008 | Visser et al. | |
| 7,610,196 B2 | 10/2009 | Nongpiur et al. | |
| 7,716,046 B2 | 5/2010 | Nongpiur et al. | |
| 7,804,914 B2 | 9/2010 | Nagatani et al. | |
| 7,983,907 B2 | 7/2011 | Visser et al. | |
| 7,995,975 B2 | 8/2011 | Sundström | |
| 8,090,576 B2 | 1/2012 | Erell | |
| 8,107,643 B2 | 1/2012 | Oh et al. | |
| 8,225,207 B1* | 7/2012 | Ramirez | 715/716 |
| 8,254,478 B2 | 8/2012 | Hellberg | |
| 8,352,052 B1* | 1/2013 | Green et al. | 700/94 |
| 8,645,129 B2 | 2/2014 | LeBlanc et al. | |
| 2001/0002930 A1 | 6/2001 | Kates | |
| 2001/0010704 A1 | 8/2001 | Schelstraete | |
| 2002/0019733 A1 | 2/2002 | Erell | |
| 2002/0114474 A1* | 8/2002 | Finn | 381/111 |
| 2002/0133356 A1* | 9/2002 | Romesburg | 704/500 |
| 2002/0172378 A1* | 11/2002 | Bizjak | 381/106 |
| 2002/0191799 A1* | 12/2002 | Nordqvist et al. | 381/60 |
| 2003/0004710 A1 | 1/2003 | Gao | |
| 2003/0055635 A1 | 3/2003 | Bizjak | |
| 2003/0059034 A1 | 3/2003 | Etter | |
| 2003/0081804 A1 | 5/2003 | Kates | |
| 2003/0088408 A1 | 5/2003 | Thyssen et al. | |
| 2003/0112088 A1 | 6/2003 | Bizjak | |
| 2003/0130839 A1 | 7/2003 | Beaucoup et al. | |
| 2003/0135364 A1 | 7/2003 | Chandran et al. | |
| 2004/0002313 A1 | 1/2004 | Peace et al. | |
| 2004/0024591 A1 | 2/2004 | Boillot et al. | |
| 2004/0037440 A1* | 2/2004 | Croft, III | 381/119 |
| 2004/0057586 A1 | 3/2004 | Licht | |
| 2004/0148166 A1 | 7/2004 | Zheng | |
| 2004/0151303 A1 | 8/2004 | Park et al. | |
| 2004/0153317 A1 | 8/2004 | Chamberlain | |
| 2004/0196994 A1 | 10/2004 | Kates | |
| 2004/0213420 A1* | 10/2004 | Gundry et al. | 381/104 |
| 2005/0004796 A1 | 1/2005 | Trump et al. | |
| 2005/0027520 A1 | 2/2005 | Mattila et al. | |
| 2005/0111683 A1* | 5/2005 | Chabries et al. | 381/317 |
| 2005/0114127 A1* | 5/2005 | Rankovic | 704/233 |
| 2005/0249272 A1 | 11/2005 | Kirkeby et al. | |
| 2006/0133358 A1 | 6/2006 | Li et al. | |
| 2006/0149532 A1 | 7/2006 | Boillot et al. | |
| 2006/0256980 A1* | 11/2006 | Pritchard | 381/104 |
| 2006/0270467 A1 | 11/2006 | Song et al. | |
| 2006/0271354 A1 | 11/2006 | Sun et al. | |
| 2006/0271358 A1 | 11/2006 | Erell | |
| 2006/0293882 A1 | 12/2006 | Giesbrecht et al. | |
| 2007/0019803 A1* | 1/2007 | Merks et al. | 379/406.08 |
| 2007/0021958 A1 | 1/2007 | Visser et al. | |
| 2007/0100614 A1 | 5/2007 | Yoshida et al. | |
| 2007/0136050 A1* | 6/2007 | Tourwe | 704/205 |
| 2007/0140513 A1* | 6/2007 | Furge | 381/120 |
| 2007/0150264 A1 | 6/2007 | Tackin et al. | |
| 2007/0156395 A1 | 7/2007 | Ojala | |
| 2007/0192088 A1 | 8/2007 | Oh et al. | |
| 2007/0237334 A1* | 10/2007 | Willins et al. | 381/57 |
| 2007/0254592 A1 | 11/2007 | McCallister et al. | |
| 2007/0263891 A1* | 11/2007 | Von Buol et al. | 381/321 |
| 2008/0004869 A1 | 1/2008 | Herre et al. | |
| 2008/0137872 A1* | 6/2008 | Croft | 381/55 |
| 2008/0159422 A1 | 7/2008 | Chen et al. | |
| 2008/0189116 A1 | 8/2008 | LeBlanc et al. | |
| 2008/0212799 A1* | 9/2008 | Breitschadel | 381/106 |
| 2008/0232612 A1* | 9/2008 | Tourwe | 381/99 |
| 2008/0240467 A1 | 10/2008 | Oliver | |
| 2008/0269926 A1 | 10/2008 | Xiang et al. | |
| 2009/0006096 A1 | 1/2009 | Li et al. | |
| 2009/0063142 A1 | 3/2009 | Sukkar | |
| 2009/0080675 A1* | 3/2009 | Smirnov et al. | 381/98 |
| 2009/0116664 A1* | 5/2009 | Smirnov et al. | 381/106 |
| 2009/0132248 A1 | 5/2009 | Nongpiur | |
| 2009/0181628 A1 | 7/2009 | Feder et al. | |
| 2009/0271186 A1* | 10/2009 | LeBlanc et al. | 704/226 |
| 2009/0281800 A1 | 11/2009 | LeBlanc et al. | |
| 2009/0281801 A1 | 11/2009 | Thyssen et al. | |
| 2009/0281802 A1 | 11/2009 | Thyssen et al. | |
| 2009/0281803 A1 | 11/2009 | Chen et al. | |
| 2009/0281805 A1 | 11/2009 | LeBlanc et al. | |
| 2014/0188466 A1 | 7/2014 | Leblanc et al. | |

OTHER PUBLICATIONS

Chen J., "Adaptive Postfiltering for Quality Enhancement of Coded Speech", IEEE, Trans on Speech and Audio Processing, 1995, pp. 59-71.

Westerlund et al.,"Speech enhancement for personal communication using an adaptive gain equalizer", Signal Processing, vol. 85, 2005, pp. 1089-1101.

Bastian, et al., "Near End Listening Enhancement: Speech Intelligibity Improvement in Noisy Environments", IEEE, 2006, pp. 493-496.

U.S. Appl. No. 12/109,017, filed Apr. 24, 2008.

Droney et al., "Compression Applications", TC Electronic, 2001, 10 pages.

"Automatic Gain Control", Wikipedia, webpage available at: <http://web.archive.org/web/20071103162745/http://en.wikipedia.org/wiki/Automaticgain_control>, retrieved on Apr. 18, 2013, 3 pages.

* cited by examiner

LOUDNESS ENHANCEMENT SYSTEM AND METHOD

CROSS-REFERENCE TO RELATED APPLICATIONS

This application is a continuation-in-part of U.S. patent application Ser. No. 12/464,355, filed May 12, 2009, which claims priority to U.S. Provisional Patent Application No. 61/052,553, filed May 12, 2008. The entirety of each of these applications is incorporated by reference herein.

BACKGROUND OF THE INVENTION

1. Field of the Invention

The present invention generally relates to the processing of an audio signal by an audio device for playback to a user. In particular, the present invention relates to systems and methods for increasing the loudness of an audio signal being played back by an audio device that places limits on the dynamic range of the audio signal.

BACKGROUND

For various reasons, conventional audio devices may be incapable of playing back an audio signal at a level of loudness that is satisfactory to the user. This may be due to limitations inherent in the audio device itself. For example, to achieve low cost, portability, and/or reduced power consumption, some conventional audio devices are implemented using small power amplifiers and speakers that are capable of producing only very low volume levels.

The inability of an audio device to play back an audio signal at a level of loudness that is satisfactory to a user may also be due to external factors relating to the context or manner in which the audio device is being used. For example, the level of background noise surrounding the audio device may be so great that a user will have difficulty perceiving an audio signal played back by the audio device even when the device is set at a maximum volume. As another example, if the positioning of the audio device provides a poor acoustic coupling between the device and a user's ear it may result in an unsatisfactory level of loudness.

Other factors contributing to the inability of an audio device to play back an audio signal at a level of loudness that is satisfactory to a user may include issues relating to a user's physical ability to hear. For example, a hearing-impaired user may require an audio signal to be played back at a volume greater than that utilized by other users in order to perceive the same level of loudness.

Conventional audio devices that process an audio signal for playback to a user typically process the audio signal in stages. Each of these stages may limit the dynamic range of the audio signal. For example, in a stage that processes a digital version of the audio signal, the dynamic range may be limited due to the audio bit depth used to digitally represent samples of the audio signal. As another example, in a stage that processes an analog version of the audio signal, the dynamic range may be limited due to voltage and current limits associated with an amplifier that comprises part of the stage.

To achieve a satisfactory level of loudness, a user may increase the playback volume of an audio device. When the user increases the playback volume of the audio device, the dynamic range of the audio signal to be played back is increased. If the dynamic range of the audio signal is increased to a point at which it exceeds the limits associated with any of the processing stages, distortion of the audio signal may result. For example, in the absence of any logic to address such over-driving of a processing stage, hard clipping of the audio signal may result. In hard clipping, the portions of the audio signal that cannot be passed or represented by the processing stage (typically the positive and negative peaks of the audio waveform in the time domain) are simply cut off. Such hard clipping distorts the audio waveform, thereby degrading the quality of the audio signal as perceived by the user.

An example of such hard clipping will now be described in reference to FIGS. 1 and 2. In particular, FIG. 1 is a time-domain representation of an example audio signal 102 to be played back by an audio device. Due to limits imposed by one or more processing stages of the audio device, portions of the audio signal that exceed a maximum digital amplitude cannot be played back. These limits are shown in FIG. 1 as a positive amplitude limit 104 and a negative amplitude limit 106. As also shown in FIG. 1, audio signal 102 is scaled such that the largest positive waveform peaks of audio signal 102 come close to, but do not exceed, positive amplitude limit 104 and the largest negative waveform peaks of audio signal 102 come close to, but do not drop below, negative amplitude limit 106. Thus, audio signal 102 should be able to be played back with little or no distortion.

FIG. 2 is a time-domain representation of another example audio signal 202 to be played back by the audio device. Example audio signal 202 is intended to represent audio signal 102 after a user has increased the volume of the audio device. As can be seen in FIG. 2, the application of the increased volume has caused many of the positive waveform peaks of audio signal 202 to exceed positive amplitude limit 104 and many of the negative waveform peaks of audio signal 202 to drop below negative amplitude limit 106. This will result in hard clipping of these waveform peaks, which will cause audio signal 202 to be distorted during playback.

The foregoing problem is especially prevalent in portable audio devices where components are required to be small and power consumption is limited to preserve battery life. In such audio devices, amplification of the analog representation of the audio signal is limited. To compensate for this, the components that process a digital representation of the audio signal are often over-driven to achieve audio playback at a desired loudness, thereby resulting in distortion of the audio signal. Consequently, users of such devices are forced to choose between reducing the playback volume to preserve audio quality, which may result in unsatisfactory loudness, or increasing the volume to achieve satisfactory loudness and tolerating the distortion.

This tradeoff between loudness and quality will now be further described with reference to FIGS. 3-5. In particular, FIG. 3 is a graph that demonstrates the relationship between an increase in volume (i.e., a gain) applied to an audio signal to be played back by an audio device and the perceived quality of the audio signal during playback. The increase in volume is measured in decibels (dB) and the perceived quality is measured using the Perceptual Evaluation of Speech Quality (PESQ) testing methodology. The audio signal used for this example was scaled to a maximum digital amplitude prior to the application of any gain and the system used to play back the audio signal was configured such that hard clipping of the audio signal would occur when it exceeded the maximum digital amplitude. The perceived quality is shown at integer levels of gain ranging from 0 up to 36 dB. As shown in FIG. 3, as the amount of gain applied to the audio signal increases, the perceived quality decreases. This is due at least in part to the hard clipping of the played-back audio signal.

FIG. 4 is a graph that demonstrates the relationship between the various levels of increased volume shown in FIG. 3 and the perceived loudness of the played-back audio signal, wherein the perceived loudness is approximated by measuring A-weighted level and is represented in dBov (dB overload). Thus, in the following description of FIG. 4 and FIG. 5, when reference is made to loudness, what is meant is an approximated loudness.

By combining the information shown in FIG. 3 with that shown in FIG. 4, the graph of FIG. 5 can be obtained. The graph of FIG. 5 demonstrates the relationship between the quality and the loudness of the played-back audio signal, wherein the quality and loudness are each shown at the same levels of increased volume (i.e., 0, 1, 2, . . . , 36 dB) shown in FIGS. 3 and 4. As demonstrated in FIG. 5, as the loudness of the played-back audio signal increases, the perceived quality of the played-back audio signal decreases. As further demonstrated in FIG. 5, as the amount of gain applied to the audio signal grows larger, the amount of additional loudness achieved grows smaller. For example, as the amount of gain applied to the audio signal increases from 30 to 36 dB, very little additional loudness is achieved. This is likely due to the fact that most of the waveform peaks of the audio signal are being hard clipped at this point.

In view of the foregoing, what is needed is an improved system and method for increasing the loudness of an audio signal being played back by an audio device that places limits on the dynamic range of the audio signal. The desired system and method should operate in a manner that introduces less distortion than the aforementioned method of simply over-driving the signal such that hard-clipping occurs.

BRIEF SUMMARY OF THE INVENTION

A loudness enhancement system and method is described herein that may be used to increase the loudness of an audio signal being played back by an audio device that places limits on the dynamic range of the audio signal. In an embodiment, the loudness enhancement system and method operates in a manner that generates less distortion than the method of simply over-driving the signal such that hard-clipping occurs.

In particular, a method for processing a portion of an audio signal to be played back by an audio device is described herein. In accordance with the method, an overload associated with the portion of the audio signal is determined. A compression limit associated with the portion of the audio signal is then determined based on the overload, wherein the compression limit is greater than or equal to a maximum desired output level. The portion of the audio signal is then compressed to generate a compressed portion of the audio signal having a level that does not exceed the compression limit.

In accordance with one embodiment of the foregoing method, determining the overload associated with the portion of the audio signal includes determining a level of the audio signal after application of a gain thereto and subtracting the maximum desired output level from the determined level.

In accordance with a further embodiment of the foregoing method, determining the compression limit associated with the portion of the audio signal based on the overload includes determining a compression boost as a function of the overload and adding the compression boost to the maximum desired output level. Determining the compression boost as a function of the overload may include applying a function that increases the compression boost as the overload increases.

The foregoing method may further include applying soft clipping to the compressed portion of the audio signal to generate a soft-clipped portion of the audio signal having a level that does not exceed the maximum desired output level. The foregoing method may alternatively include applying hard clipping to the compressed portion of the audio signal to generate a hard-clipped portion of the audio signal having a level that does not exceed the maximum desired output level. In a still further embodiment, the foregoing method additionally includes applying adaptive soft clipping to the compressed portion of the audio signal to generate an adaptively-soft-clipped portion of the audio signal having a level that does not exceed the maximum desired output level.

A system for processing a portion of an audio signal to be played back by an audio device is also described herein. The system includes overload determination logic and compression logic. The overload determination logic is configured to determine an overload associated with the portion of the audio signal. The compression logic is configured to determine a compression limit associated with the portion of the audio signal based on the overload, wherein the compression limit is greater than or equal to a maximum desired output level, and to compress the portion of the audio signal to generate a compressed portion of the audio signal having a level that does not exceed the compression limit.

An alternative method for processing a portion of an audio signal to be played back by an audio device is also described herein. In accordance with the method, a characteristic associated with the portion of the audio signal is determined. Adaptive soft clipping is then applied to the portion of the audio signal to generate an adaptively-soft-clipped portion of the audio signal having a level that does not exceed a maximum desired output level, wherein the adaptive soft clipping is controlled based on at least the characteristic.

In accordance with one embodiment, determining the characteristic associated with the portion of the audio signal comprises determining an overload associated with the portion of the audio signal. In accordance with such an embodiment, applying adaptive soft clipping to the compressed portion of the audio signal may include modifying a soft clipping function to be applied to the compressed portion of the audio signal based on the overload. Alternatively, in accordance with such an embodiment, applying adaptive soft clipping to the compressed portion of the audio signal may include applying hard clipping to the compressed portion of the audio signal to generate a hard-clipped portion of the audio signal having a level that does not exceed a maximum desired output level, applying soft clipping to the compressed portion of the audio signal to generate a soft-clipped portion of the audio signal having a level that does not exceed the maximum desired output level, weighting the soft-clipped portion of the audio signal and the hard-clipped portion of the audio signal based on the overload to generate weighted versions thereof, and combining the weighted versions of the soft-clipped portion of the audio signal and the hard-clipped portion of the audio signal. Weighting the soft-clipped portion of the audio signal and the hard-clipped portion of the audio signal based on the overload may include increasing a weight applied to the soft-clipped portion of the audio signal as the overload increases and reducing a weight applied to the hard-clipped portion of the audio signal as the overload increases.

An alternative system for processing a portion of an audio signal to be played back by an audio device is also described herein. The system includes characteristic determination logic and adaptive soft clipping logic. The characteristic determination logic is configured to determine a characteristic associated with the portion of the audio signal. The adaptive soft clipping logic is configured to apply adaptive soft clipping to the portion of the audio signal to generate an adaptively-soft-clipped portion of the audio signal having a level that does not exceed a maximum desired output level, wherein the adaptive soft clipping is controlled based on the characteristic.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
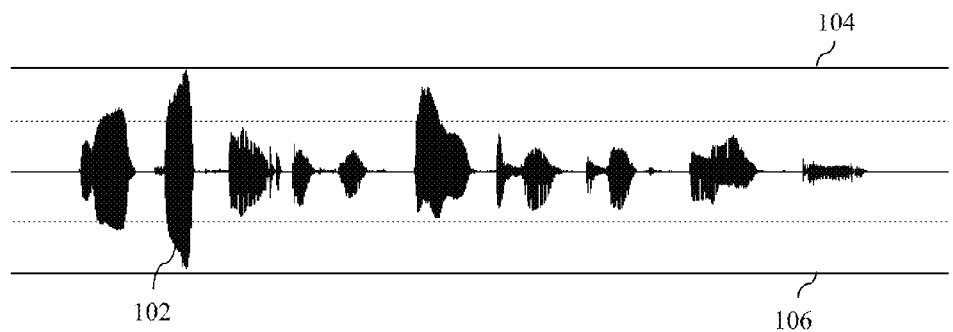
FIG. 1 is a time domain representation of an example audio signal to be played back by an audio device, wherein no hard clipping of the example audio signal has occurred.
Figure 2:
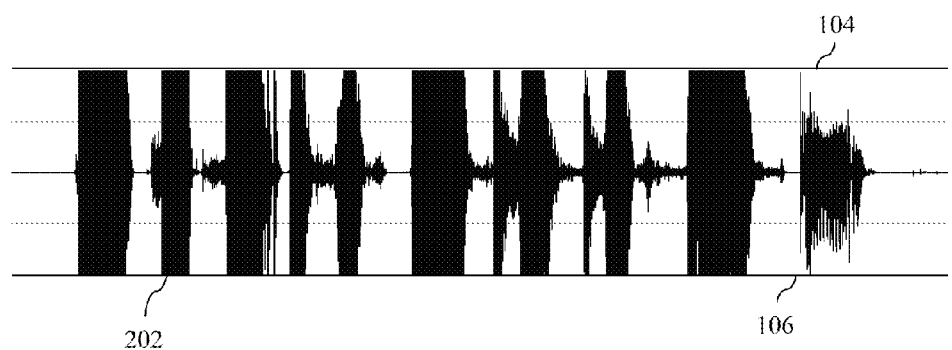
FIG. 2 is a time domain representation of an example audio signal to be played back by an audio device, wherein hard clipping of the example audio signal has occurred.
Figure 3:
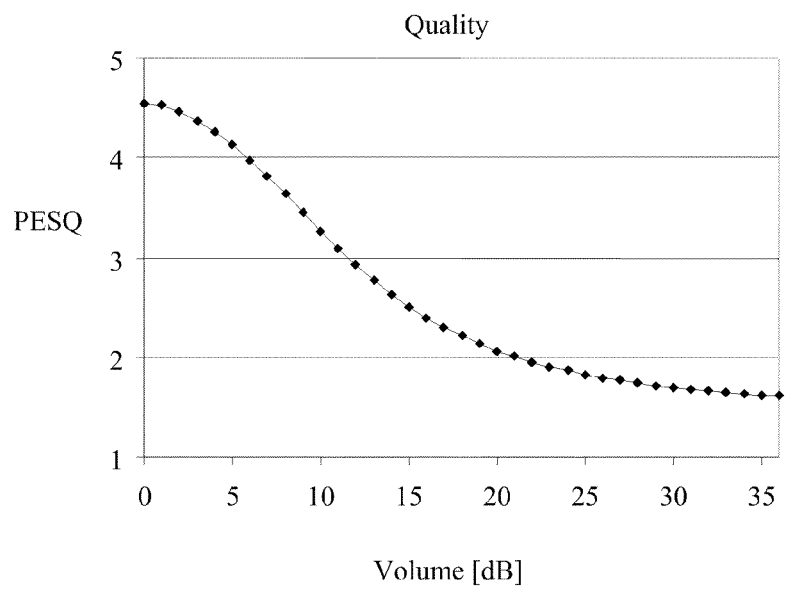
FIG. 3 is a graph that demonstrates a relationship between an amount of gain applied to an audio signal to be played back by an audio device and a perceived quality of the audio signal during playback.
Figure 4:
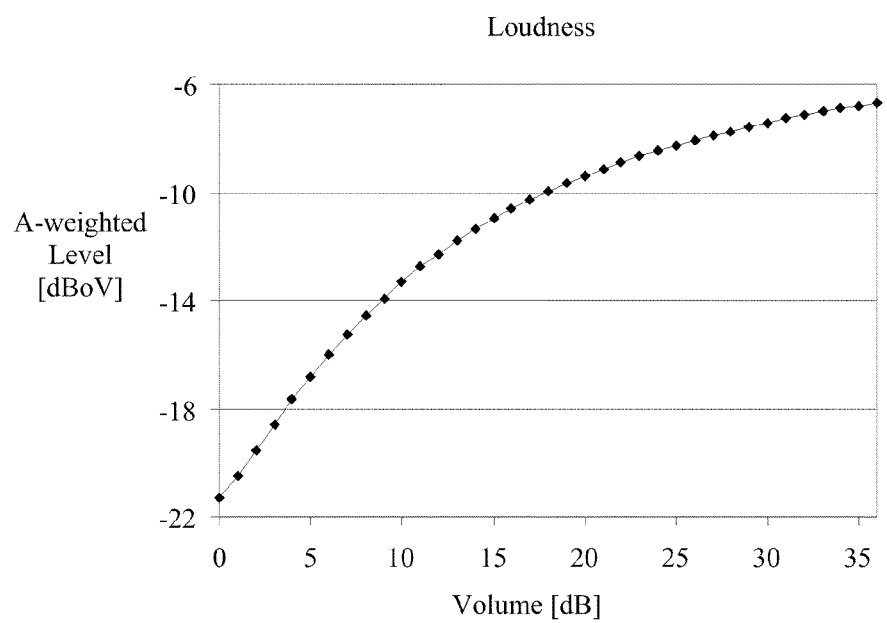
FIG. 4 is a graph that demonstrates a relationship between an amount of gain applied to an audio signal to be played back by an audio device and a perceived loudness of the played back audio signal.
Figure 5:
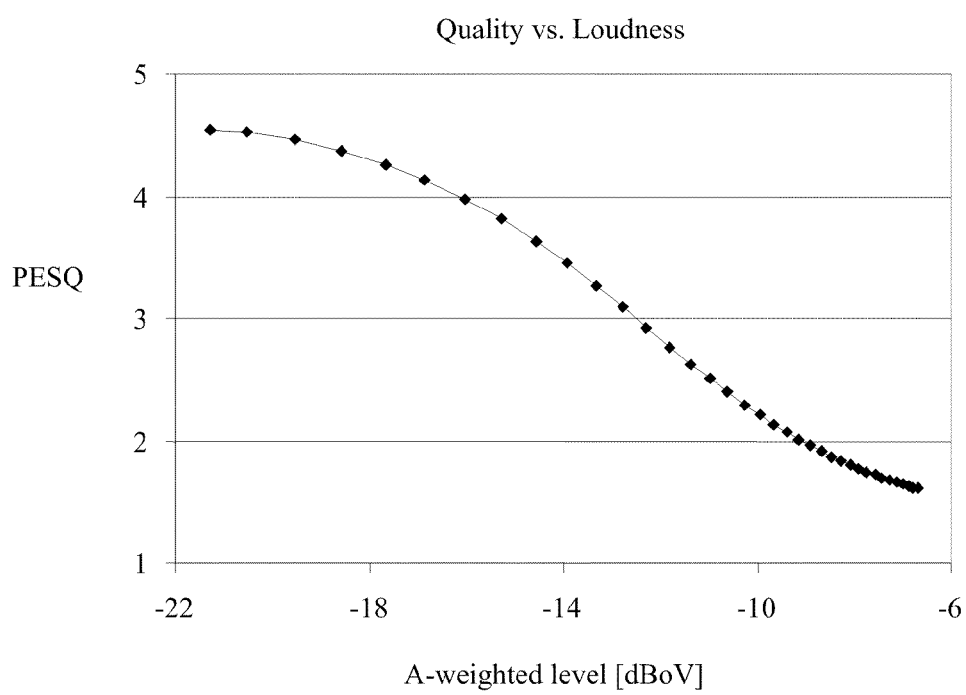
FIG. 5 depicts a graph that demonstrates a relationship between a perceived quality and loudness of a played back audio signal.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of persons skilled in the relevant art(s) to implement such feature, structure, or characteristic in connection with other embodiments whether or not explicitly described.

A loudness enhancement system and method is described herein that may be used to increase the loudness of an audio signal being played back by an audio device that places limits on the dynamic range of the audio signal. An embodiment of the loudness enhancement system and method operates in a manner that introduces less distortion than the method of simply over-driving the audio signal such that hard-clipping occurs. The loudness enhancement system and method may be integrated with a speech intelligibility enhancement (SIE) system and method implemented in the same audio device. The SIE system and method can be used to improve the intelligibility of a speech signal received over a communication network for playback by the audio device. Example implementations of such an SIE system and method will be described below in Section II. Example implementations of the loudness enhancement system and method will then be described in Section III. An example computer system that may be used to implement various features of the SIE and loudness enhancement systems and methods will then be described in Section IV. Concluding remarks will be provided in Section V.

II. Speech Intelligibility Enhancement System and Method

A. Introduction to Speech Intelligibility Enhancement

Various background concepts relevant to SIE will now be discussed in reference to an example conventional communication system 600 shown in FIG. 6. Communication system 600 includes a first telephony terminal 602 and a second telephony terminal 604 that are communicatively connected to each other via one or more communication network(s) 606. For the purposes of this example, first telephony terminal 602 will be referred to as the "near end" of the network connection and second telephony terminal 604 will be referred to as the "far end" of the network connection. Each telephony terminal may comprise a telephony device, such as a corded telephone, cordless telephone, cellular telephone or Bluetooth® headset.

First telephony terminal 602 operates in a well-known manner to pick up speech signals representing the voice of a near-end user 608 via a microphone 614 and to transmit such speech signals over network(s) 606 to second telephony terminal 604. Second telephony terminal 604 operates in a well-known manner to play back the received speech signals to a far-end user 610 via a loudspeaker 618. Conversely, second telephony terminal 604 operates in a well-known manner to pick up speech signals representing the voice of far-end user 610 via a microphone 616 and to transmit such speech signals over network(s) 606 to first telephony terminal 602. First telephony terminal 602 operates in a well-known manner to play back the received speech signals to near-end user 608 via a loudspeaker 612.

Figure 6:
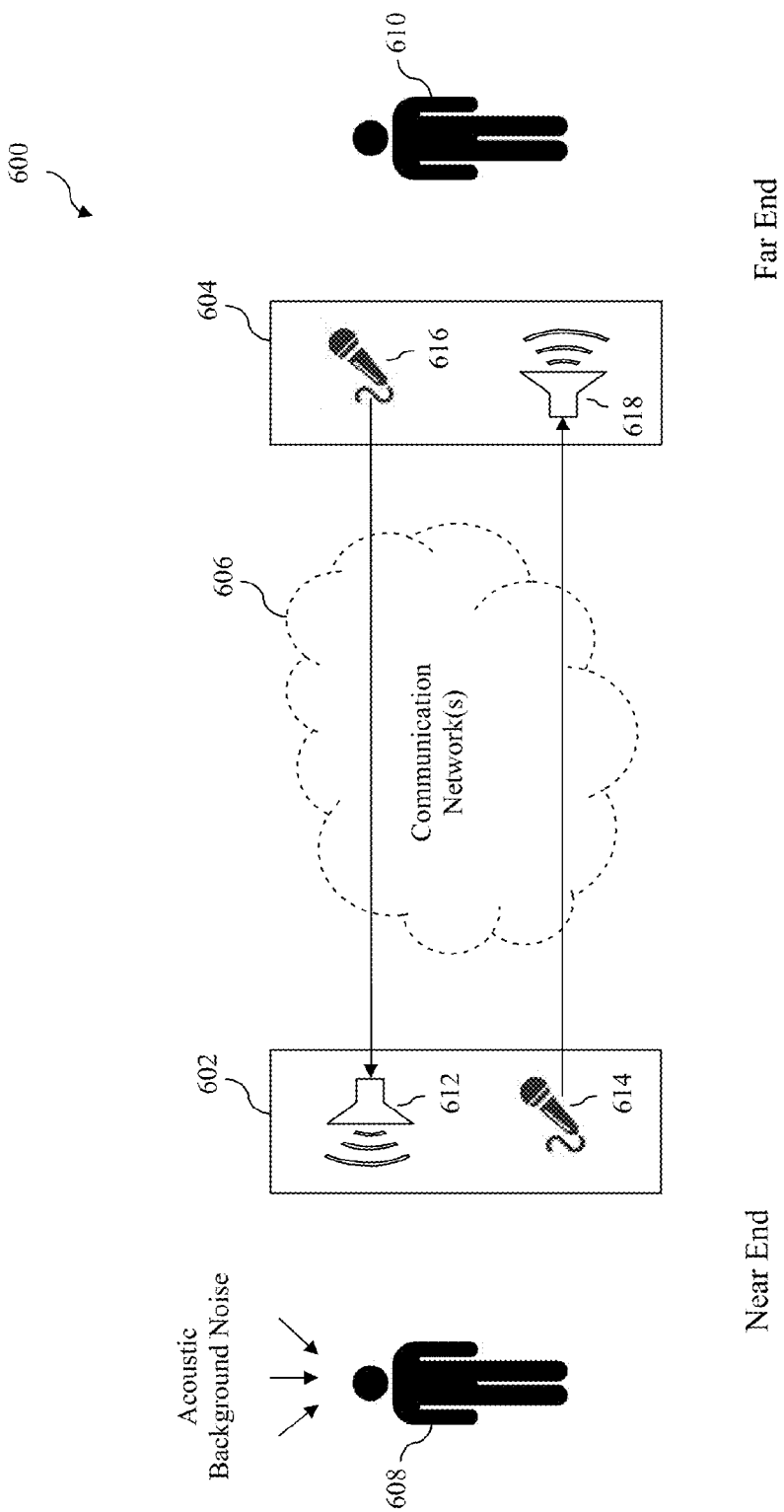
FIG. 6 is a block diagram of an example conventional communication system.

As further shown in FIG. 6, near-end user 608 is using first telephony terminal 602 in an environment that is subject to acoustic background noise. When this acoustic background noise becomes too loud, near-end user 608 may find the voice of far-end user 610 difficult to understand. This is because such loud acoustic background noise will tend to mask or drown out the voice of far-end user 610 that is being played back through loudspeaker 612 of first telephony terminal 602. When this occurs, the natural response of near-end user 608 may be to adjust the volume of loudspeaker 612 (assuming that first telephony terminal 602 includes a volume control button or some other volume control means) so that the perceived loudness of the voice of far-end user 610 is increased. However, it may be inconvenient for near-end user 608 to have to manually adjust the volume in this manner; it would be far more convenient if first telephony terminal 602 could automatically adjust the volume to the appropriate level in response to an increase in acoustic background noise.

Furthermore, although near-end user 608 may increase the volume of loudspeaker 612, there is typically a limit on how much amplification can be applied to the speech signal received from far-end user 610 before that signal is subject to digital saturation or clipping. Additionally, even when the speech signal received from far-end user 610 has been amplified to a level immediately below which clipping occurs or to a level at which slight clipping occurs, the speech signal may still not be loud enough to be intelligible over the acoustic background noise.

Various techniques have been described in the literature that can be used to increase the loudness of a speech signal subject to a magnitude limit (such as amplitude compression) or to make the speech signal more intelligible. However, many of these techniques distort the speech signal.

An SIE system and method is described herein that can be used to improve the intelligibility of a speech signal received over a communication network from a far-end telephony terminal for playback at a near-end telephony terminal. The SIE system and method is particularly useful in a scenario in which a user of the near-end telephony terminal attempts to conduct a telephone call in an environment with loud acoustic background noise, such as that described above in reference to FIG. 6. Generally speaking, the SIE system and method, which may be implemented as part of the near-end telephony terminal, monitors both the speech signal received from the far-end telephony terminal and a near-end background noise signal and, based on both signals, modifies the speech signal to increase the intelligibility while minimizing the distortion thereof.

In one embodiment, the SIE system and method increases intelligibility by maintaining a desired minimum signal-to-noise ratio (SNR) between the speech signal being played back on a loudspeaker of the near-end telephony terminal and the ambient background noise. The minimum SNR is determined such that the speech remains intelligible in the presence of the ambient background noise.

In a further embodiment, the SIE system and method is configured to attain the minimum SNR by applying a pure linear gain to the speech signal received from the far-end telephony terminal. However, should digital saturation of the output waveform be reached before the minimum SNR has been reached, then the SIE system and method performs amplitude compression to allow greater subsequent amplification of lower level segments of the received speech signal.

In accordance with a particular implementation of the SIE system and method, the performance of amplitude compression followed by amplification is carried out in such a manner that digital saturation is impossible. Thus, the system and method is guaranteed never to saturate and cause clipping of the speech output signal. As will be described in more detail herein, this is achieved in part by using a frame-by-frame instant attack approach to tracking the waveform envelope of the received speech signal and then using information derived from such waveform envelope tracking to limit the amount of gain that may ultimately be applied to the received speech signal.

In a still further embodiment, the SIE system and method monitors the degree of amplitude compression and uses this information as an input (in a feedback manner) to control an amount of spectral shaping that is applied to the received speech signal. If no amplitude compression is applied, then no spectral shaping is applied since the minimum SNR was attained without amplitude compression. However, if amplitude compression is applied, then this indicates that there was not enough digital "headroom" to attain the minimum SNR through the application of a simple linear gain. The application of amplitude compression allows for further increases in loudness, but at some point this technique is also not sufficient to ensure intelligibility. Hence, at a certain point spectral shaping is enabled based on the amount of amplitude compression. The amount of amplitude compression can also be thought of as the amount of linear gain that had to be discarded (on the highest amplitudes), but was required to reach the minimum SNR. Viewed this way, the amount of amplitude compression provides a good indicator of the remaining shortage of intelligibility, which must be provided using different means in order to reach the minimum SNR for intelligibility. Hence, in accordance with this embodiment, the amount of spectral shaping applied is a function of at least the amount of amplitude compression that was applied.

In an alternative implementation, the amount of spectral shaping applied is a function of the amount of digital headroom (or lack thereof) between the signal level required to achieve the minimum SNR and the digital saturation point or some other point at which amplitude compression will be applied. Note that in additional implementations, spectral shaping may be applied to the received speech signal in a manner that is not dependent on feedback concerning the degree of amplitude compression or the amount of digital headroom available.

The example SIE systems and methods described herein may advantageously be implemented in a wide variety of telephony terminals including but not limited to, corded telephones, cordless telephones, cellular telephones, Bluetooth® headsets, or any other telephony terminals configured to pick up and transmit speech signals representative of the voice of a near-end user to a far-end user and to receive and play back speech signals representative of the voice of the far-end user to the near-end user. More generally, the example SIE systems and methods may also be implemented in any audio device that processes an audio signal for playback to a user.

B. Example Speech Intelligibility Enhancement System

Figure 7:
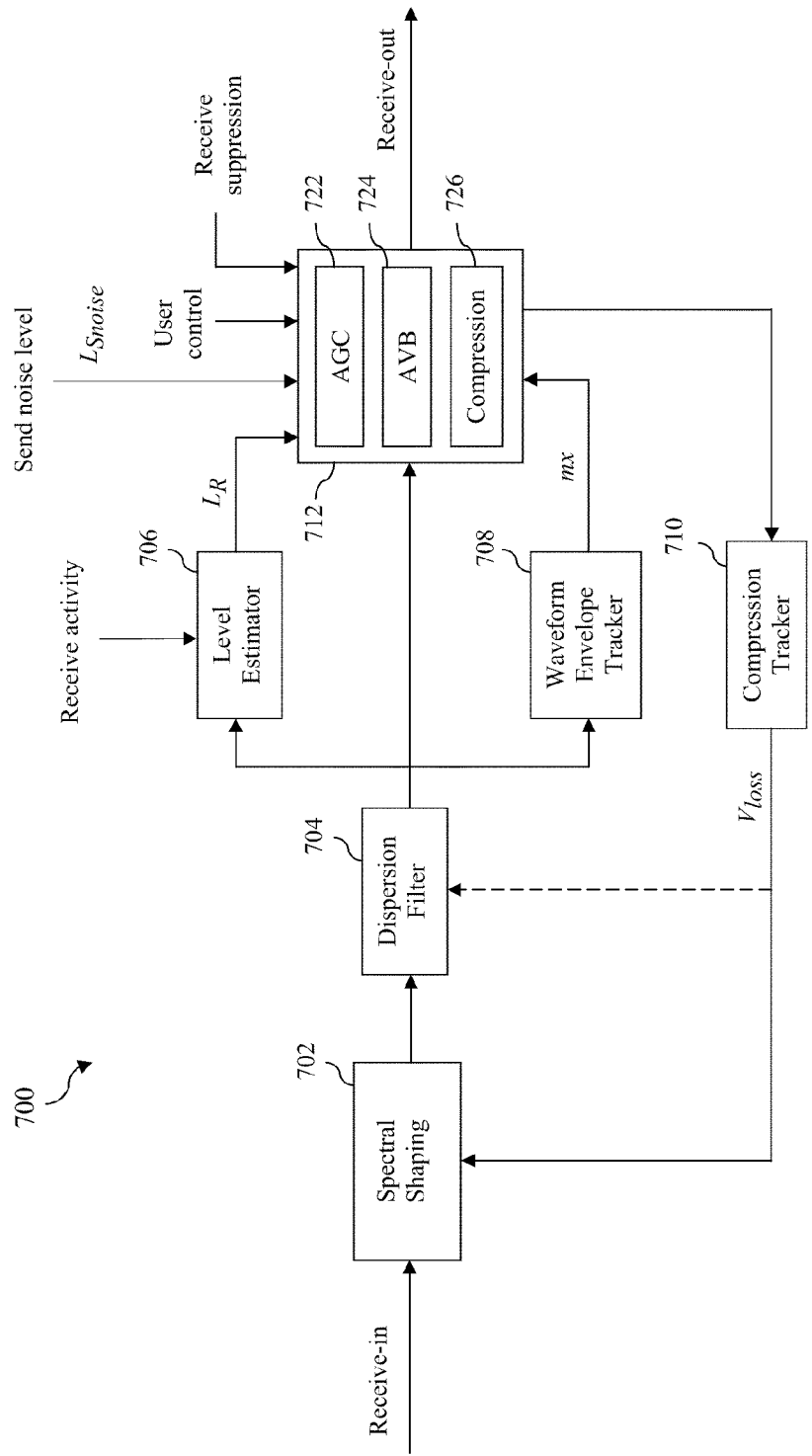
FIG. 7 is a block diagram of an example speech intelligibility enhancement (SIE) system.

FIG. 7 is a block diagram of an example SIE system 700. As shown in FIG. 7, SIE system 700 includes a spectral shaping block 702, a dispersion filter 704, a level estimator 706, a waveform envelope tracker 708, a compression tracker 710, and an Automatic Gain Control (AGC)/Automatic Volume Boosting (AVB)/compression block 712. AGC/AVB/compression block 712 includes AGC logic 722, AVB logic 724, and compression logic 726.

Generally speaking, the components of example SIE system 700 operate together to improve the intelligibility of a speech signal received over a communication network from a far-end telephony terminal (referred to herein as the "far-end speech signal") for playback by a near-end telephony terminal of which SIE system 700 is a part. In FIG. 7, the far-end speech signal is denoted "Receive-in." This signal may be received from another component in the telephony terminal. For example, the far-end speech signal may be received from a buffer that stores digital samples produced by an audio decoder within the telephony terminal. The audio decoder in turn may produce the digital samples by decoding an encoded bit stream transported over a communication network. The output of SIE system 700 is the modified far-end speech signal, denoted "Receive-out" in FIG. 7, which is provided directly or indirectly to a loudspeaker for playback to a user.

Certain components of system 700 will now be briefly described and additional details about each component will be provided in the sub-sections below.

AGC logic 722 is configured to compensate for variations in the level of the far-end speech signal. For example, such variations may be due to variation of network connections, acoustic coupling, or the like. AGC logic 722 calculates a gain scaling factor that, when applied to the far-end speech signal, brings the far-end speech signal to a nominal signal level.

AVB logic 724 is configured to automatically boost the level of the far-end speech signal to maintain at least a minimum SNR as the level of near-end background noise increases. In particular, AVB logic 724 is configured to maintain at least a predetermined minimum far-end speech signal to near-end noise ratio by calculating an additional gain to be applied to the far-end speech signal if the level of the near-end background noise is such that the level of the far-end speech signal after AGC yields an SNR below the predetermined minimum SNR.

Level estimator 706 is configured to determine an estimated level of the far-end speech signal and to provide this information to AGC logic 722 and AVB logic 724 for use in performing gain calculations.

Compression logic 726 is configured to apply a time-varying gain to the far-end speech signal that allows for application of the full AVB gain to attain the desired minimum SNR without digital saturation or clipping of the output signal. In determining the time varying gain, compression logic 726 takes into account all the gains to be applied to the far-end speech signal before playback (for example, user volume gain, echo suppression gain, or the like). In one implementation, a single gain is applied to the far-end speech signal to achieve the intended effect while in an alternate implementation a separate gain is applied by each of AGC logic 722, AVB logic 724 and compression logic 726 in order to achieve the intended effect.

Generally speaking, compression logic 726 operates by applying more attenuation to larger waveform peaks than to lower peaks. Effectively, compression logic 726 boosts the low-amplitude regions of the far-end speech signal when AVB logic 724 cannot maintain the intelligibility of the far-end speech signal without causing saturation. In particular, compression logic 726 applies smaller gains to the high-amplitude regions of the far-end speech signal and larger gains to the low-amplitude regions. This has the effect of compressing the high-amplitude regions relative to the low-amplitude regions, thus the name. Such amplitude compression may be simply referred to as "compression" elsewhere in this document as shorthand. In effect, compression logic 726 amplifies the low-amplitude regions relative to the high-amplitude regions without exceeding the digital saturation level, and therefore has the effect of increasing the loudness of the far-end speech signal without introducing digital saturation.

Waveform envelope tracker 708 is configured to perform waveform envelope tracking on the far-end speech signal and to provide waveform tracking information to AGC/AVB/compressor block 712 that can be used by that block to determine exactly how much headroom there is to digital saturation in the far-end speech signal prior to modifying it.

Dispersion filter 704 is configured to reduce a peak-to-average ratio of the waveform samples of the far-end speech signal so that the filtered speech signal has smaller peak values and thus allows more headroom for AVB logic 724 to boost the far-end speech signal without introducing digital saturation. In an exemplary implementation, dispersion filtering is achieved using an all-pass filter. Such an all-pass filter can be either fixed or adaptive. A fixed all-pass filter is lower in complexity but can achieve only a smaller reduction of the magnitude peak of the far-end speech. Conversely, an adaptive all-pass filter has higher complexity but also has the potential to achieve a larger reduction of the magnitude peak.

Spectral shaping block 702 is configured to boost certain local peaks of the spectral envelope (called "formants") of the far-end speech signal above the near-end noise floor to make the far-end speech signal more intelligible. In particular, spectral shaping block 702 is configured to boost certain formants of the far-end speech signal above the spectral values of the near-end noise at corresponding frequencies. In trying to understand spoken speech, humans normally rely on recognizing the frequencies of the speech formants. Therefore, by boosting certain formants of the far-end speech signal above the noise floor, spectral shaping block 702 makes the far-end speech more intelligible. In one embodiment, the second and third formants of the far-end speech signal are boosted relative to the first formant since the second and third formants are more important from the perspective of speech intelligibility than the first formant.

In one exemplary implementation, spectral shaping is implemented by adaptive high-pass filtering. For example, such adaptive high-pass filtering may be used to boost the second and third formants of the far-end speech signal relative to the first formant, since the second and third formants are located at higher frequencies than the first formant. The degree of high-pass filtering may depend on the far-end speech as well as the near-end noise. The high-pass filter may consist of a single-stage filter or multiple stages of filters, where different stages have different adaptation characteristics. For example, the high-pass filter may contain two stages of high-pass filters, with a slowly-evolving first stage having a relatively long adaptation time constant and a rapidly-evolving second stage having a relatively short adaptation time constant.

In accordance with one implementation of SIE system 700, the signal processing techniques performed by AGC logic 722, AVB logic 724, compression logic 726, dispersion filter 704 and spectral shaping block 702 are applied one-by-one in a specific sequence so as to minimize the distortion introduced to the far-end speech signal, with each new technique being applied only when necessary. For example, AGC may first be applied by AGC logic 722 to bring the far-end speech to a nominal level. If the background noise level is low, AGC may be the only technique applied. As the background noise level increases, AVB may be applied by AVB logic 724 to increase the volume of the far-end speech signal. As the background noise level increases further, compression may then be applied by compression logic 726 to further boost the low-amplitude regions of the far-end speech signal if AVB is not sufficient to maintain the intelligibility of the far-end speech signal. As the background noise level increases even further, dispersion filtering can be applied by dispersion filter 704 to reduce the peak-to-average ratio of the far-end speech signal, thereby providing additional headroom for performing AVB. If the background noise is so loud that the above four techniques are not sufficient, spectral shaping can then be applied by spectral shaping block 702 to further enhance the speech intelligibility by exploiting the properties of human perception.

With further reference to the foregoing example implementation, AGC and AVB are applied first since those techniques hardly introduce any distortion to the far-end speech signal. Compression however can make speech sound slightly unnatural due to the compression of natural dynamic range, and dispersion filtering may introduce a slight distortion to the speech; therefore, these two techniques are applied only when AGC and AVB alone cannot provide sufficient intelligibility of the far-end speech signal. Finally, depending on the telephony terminal, spectral shaping may make the most dramatic and audible modification of the far-end speech signal and thus this technique is only applied when the above four techniques do not provide sufficient intelligibility of the far-end speech.

In alternate implementations, exceptions to this approach may be made. For example, in certain implementations, techniques that increase distortion in a traditional sense are applied before the amount of linear gain that may be applied without reaching digital saturation has been exhausted. One example of such an implementation is a system that limits high waveform amplitudes below a maximum digital amplitude to protect the auditory system of a user from exposure to uncomfortable, or possibly, damaging signal levels.

Each of the foregoing components of system 700 and the manner in which such components operate will now be described. In the following description, it is assumed that the speech signal being processed comprises a series of digital samples and that the series of digital samples is divided into discrete time segments termed frames. In the description, individual frames are referred to by a frame counter, wherein a frame counter k generally refers to the frame currently being processed and frame counter k−1 refers to the immediately previous frame.

It should be understood that while most of the algorithm parameters given below are specified assuming a sampling rate of 8 kHz for telephone-bandwidth speech, persons skilled in the relevant art(s) should have no problem extending the techniques presented below to other sampling rates, such as 16 kHz for wideband speech. Therefore, the parameters specified are only meant to be exemplary values and are not limiting.

1. Spectral Shaping Block 702

In SIE system 700, spectral shaping block 702 is configured to receive the far-end speech signal (shown as "Receive-in" in FIG. 7) and to apply spectral shaping thereto in a manner that is controlled by feedback from compression tracker 710. As will be described in more detail below, such spectral shaping may include both slowly-evolving and rapidly-evolving spectral shaping filters, wherein the combination offers the advantage of not having to drive either filter too hard.

Spectral shaping block 702 is configured to boost certain formants of the far-end speech signal above the near-end noise floor so that they can be recognized by the near-end telephony terminal user and thus help that user understand the speech. Since the far-end speech signal is changing with time, such spectral shaping is preferably adaptive in order to increase effectiveness. Also, to avoid introducing distortion, such spectral shaping is preferably evolved in a smooth manner.

One possible manner of performing such spectral shaping is to perform spectral analysis followed by synthesis. This may be accomplished by using a Fast Fourier Transform (FFT) and inverse FFT, or using sub-band analysis and sub-band synthesis. For example, with FFT or sub-band analysis of both the far-end speech and the near-end noise, a determination can be made as to whether the formants of the far-end speech signal are below the noise floor. If so, those spectral components of the far end speech signal around the formants are boosted (i.e., a gain is applied) such that they are at least Y dB above the noise floor, where Y is determined and tuned empirically. Then, the modified frequency-domain representation of the far-end speech is converted back to a time domain signal.

Although the foregoing method allows for precise control of the SNR at each formant frequency, one drawback of the method is that it requires significant complexity. In an exemplary implementation, the spectral shaping is achieved with very-low-complexity time-domain filtering using a low-order high-pass filter. The use of such a high-pass filter achieves two goals. First, it helps to boost the second and third formants of the far-end speech signal. The second and third formants are more critical to speech intelligibility and are often much lower in intensity as compared with the first formant and thus are frequently buried under the noise floor when in a noisy environment. Second, it attenuates the first formant around or below 500 Hz, which normally dominates the energy content of the voiced speech signal and which often overloads the tiny loudspeakers used in many telephony devices. By attenuating the first formant relative to the second and third formants, the high-pass filter allows more energy that is useful for intelligibility to be emitted from such tiny loudspeakers before overloading them.

Figure 8:
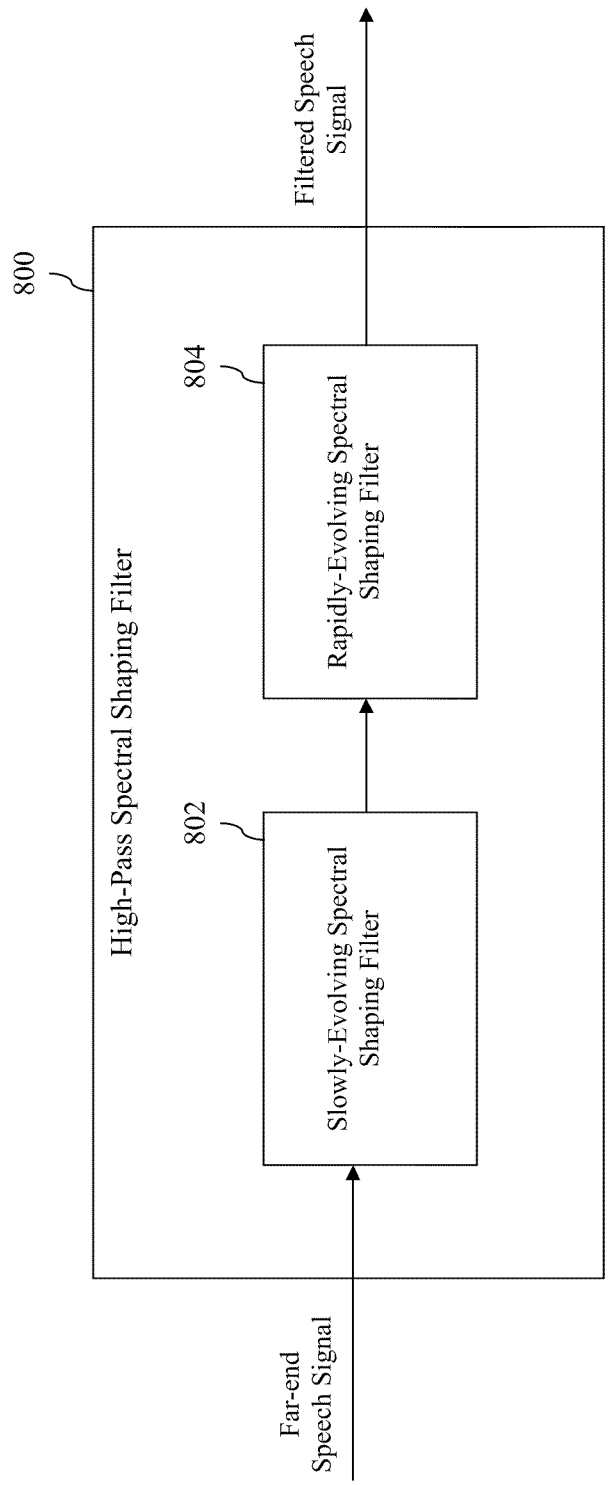
FIG. 8 depicts a block diagram of a high-pass spectral shaping filter that may be used to implement the SIE system of FIG. 7.

In one implementation, the high-pass spectral shaping filter consists of two cascaded filters: a slowly-evolving spectral shaping filter and a rapidly-evolving spectral shaping filter, each of which is controlled by different adaptation mechanisms. FIG. 8 depicts a block diagram of such a high-pass spectral shaping filter 800. As shown in FIG. 8, the high-pass spectral shaping filter 800 consists of a slowly-evolving spectral shaping filter 802 and a rapidly-evolving spectral shaping filter 804.

In accordance with one implementation, slowly-evolving spectral shaping filter 802 has the form of $$x(n)=r_{in}(n)-b \cdot r_{in}(n-1), \tag{1}$$

where $x(n)$ is the output, $r_{in}(n)$ is the input, and b is the filter coefficient. The filter coefficient is determined according to a table lookup $$b=b_{tbl}[idx], \tag{2}$$

where the table can be $$b_{tbl}[\,]=\{0.0, 0.1, 0.2, 0.3, 0.4, 0.5, 0.6, 0.7, 0.8\}, \tag{3}$$

and the index is determined according to $$idx = (N_{b_{tbl}} - 1) \cdot \left\lfloor \frac{\min(V_{loss}(k-1), mxV_{loss})}{mxV_{loss}} \right\rfloor \tag{4}$$

in which $N_{b_{tbl}}$ is the table size, e.g., $N_{b_{tbl}}=9$ above, $V_{loss}(k-1)$ the smoothed volume loss (or loss in headroom) due to compression applied by compression logic 726 as tracked by compression tracker 710, and $mxV_{loss}$ is a smoothed volume loss at which maximum slowly varying spectral shaping is applied, e.g., $mxV_{loss}=27$.

Figure 9:
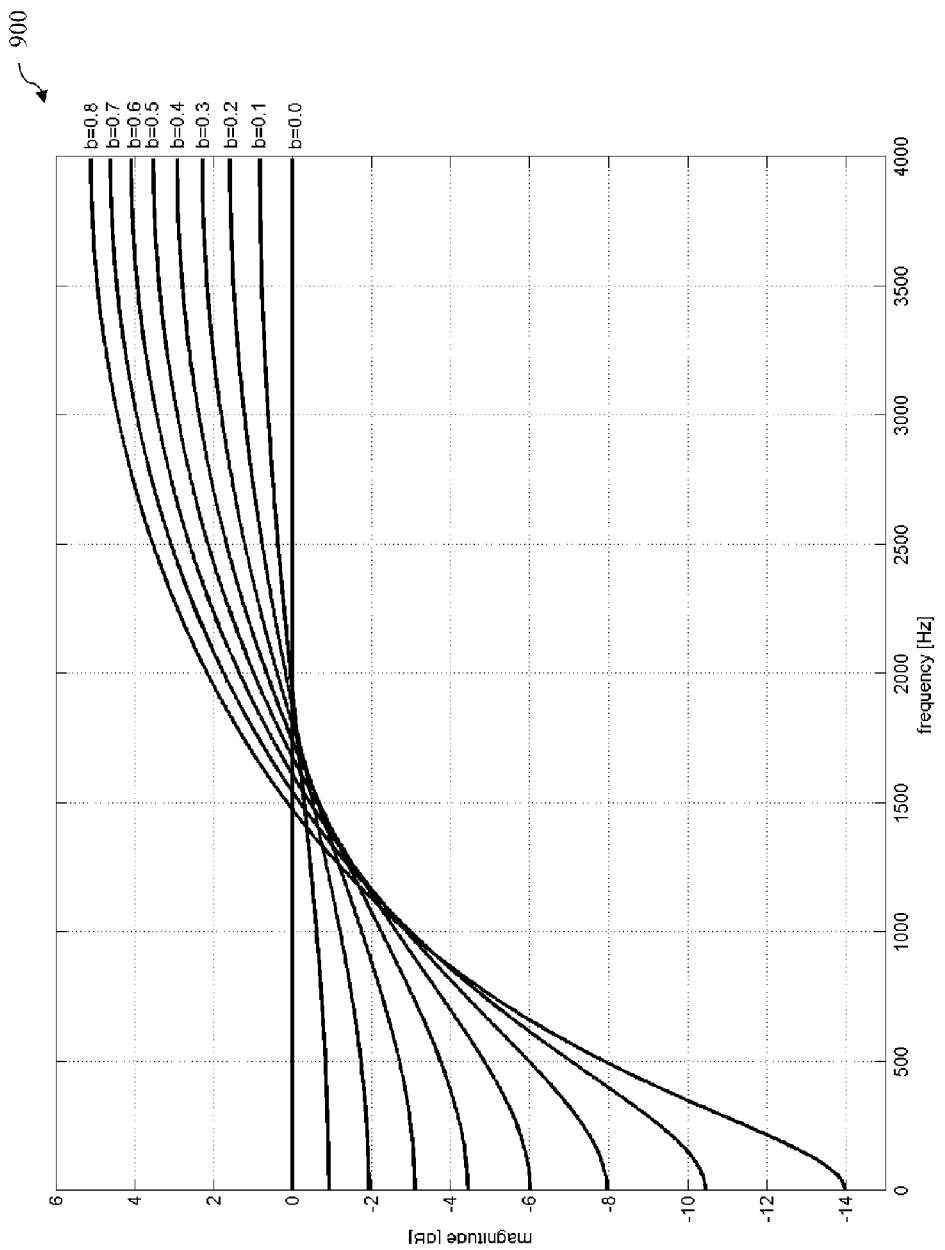
FIG. 9 is a graph showing a family of frequency response curves for a slowly-evolving spectral shaping filter.

The frequency response of the filters given by the coefficients in Eq. 3 and the filter of Eq. 1 are shown in graph 900 of FIG. 9. As can be seen, the filters will generally attenuate the first formant while amplifying formants 2 and above, thereby increasing intelligibility. In a possible configuration for wideband speech where this filter is applied to the 0-4 kHz band, a constant gain can be applied to the 4-8 kHz band to prevent a spectral discontinuity at 4 kHz, and instead facilitate a continuous full-band modification of the signal. The gain for the 4-8 kHz band would depend on the filter coefficient. The gains corresponding to the filter coefficients of Eq. 3 are {1.0, 1.1, 1.2, 1.3, 1.4, 1.5, 1.6, 1.7, 1.8}.

In one implementation, rapidly-evolving spectral shaping filter 804 includes two control parameters. The first control parameter is given by $$\text{ratio}=1-10^{-(\alpha \cdot V_{loss}(k-1)/20)}, \tag{5}$$

where α is a control parameter, e.g. α=0.375. The second control parameter is given by $$rho = \frac{r_{sm}(k,1)}{r_{sm}(k,0)}, \quad (6)$$

where $$r_{sm}(k,m) = \lambda \cdot r_{sm}(k-1,m) + (1-\lambda) \cdot r_{cor}(m) \quad (7)$$

The smoothing constant λ can have a value of 0.75, for example. In the equation the auto correlation is calculated as $$r_{cor}(m) = \sum_{n=0}^{N-m} r_{in}(n) \cdot r_{in}(n-m) \quad (8)$$

where N is the frame size, e.g. 40 samples, corresponding to 5 ms at 8 kHz. The final filter coefficient of rapidly evolving spectral shaping filter 804 is given by $$c = \max(\gamma \cdot rho \cdot ratio, 0), \quad (9)$$

where γ controls the maximum filter coefficient, e.g. γ=0.75. The filter equation for the rapidly evolving spectral shaping is given by $$y(n) = x(n) - c \cdot x(n-2) - c \cdot y(n-1). \quad (10)$$

In accordance with the foregoing, rapidly-evolving spectral shaping filter 804 is a second-order pole-zero high-pass filter having one pole and two zeros, with a transfer function of $$H_{re}(z) = \frac{1 - cz^{-2}}{1 + cz^{-1}} \quad (11)$$

where c is the single parameter that controls the shape of the frequency response of the filter. The family of frequency response curves for different values of c is plotted in graph 1000 of FIG. 10. This filter is designed to be totally controlled by a single parameter c. This makes it simple to implement and to adapt from frame to frame.

Rapidly-evolving spectral shaping filter 804 is designed to have relatively sharp attenuation at or below about 500 Hz, where the first formant of voiced speech usually is. Also, it boosts the second and third formants relative to the first formant. This filter is also designed to have exactly the same magnitude response value of 0 dB at half the sampling frequency. This makes it easier to achieve a seamless transition to a higher band when using a split-band system in wideband applications. In other words, a high band filter can always start at 0 dB no matter what the value of the filter control parameter c is, and the corresponding composite magnitude response will always be continuous at the band boundary of the low band (where this filter is) and the high band.

Figure 10:
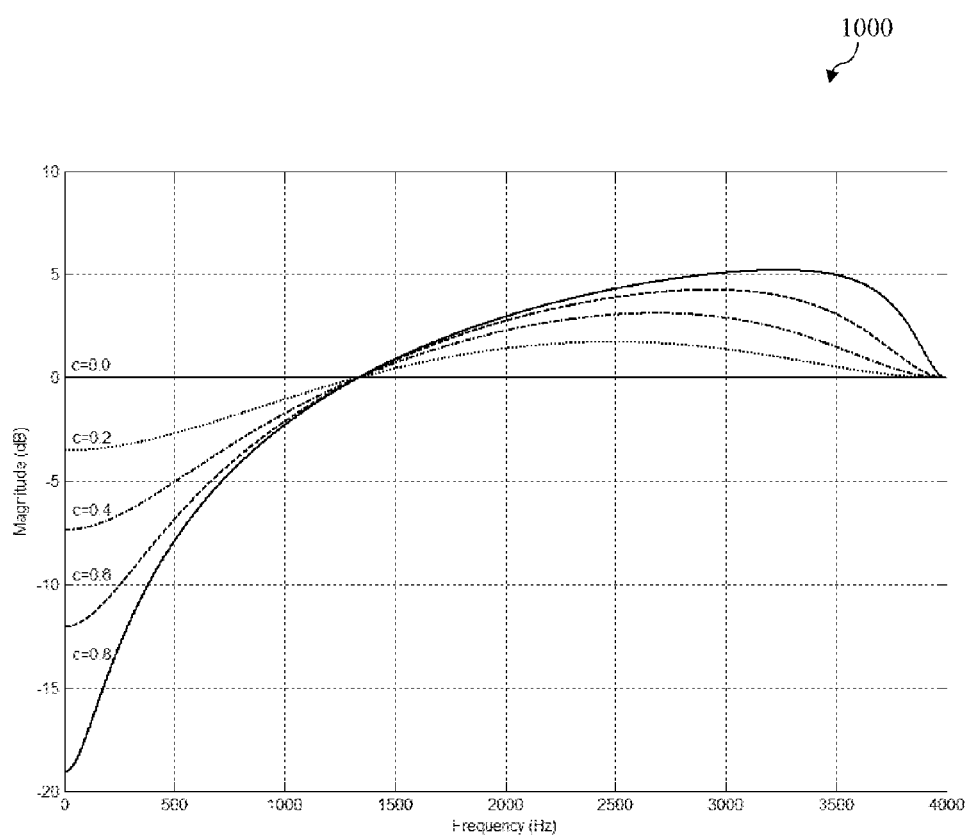
FIG. 10 is a graph showing a family of frequency response curves for a rapidly-evolving spectral shaping filter.

Another important feature is that at frequencies above 3400 Hz, the magnitude responses in FIG. 10 always go down toward 0 dB. This arrangement has the desirable effect of not excessively amplifying the potential noise in the far-end speech signal in the stop band of 3400 to 4000 Hz.

Slowly-evolving spectral shaping filter 802 and rapidly-evolving spectral shaping filter 804 can be combined into a single spectral shaping filter, if desired, by convolving the filter response of slowly evolving spectral shaping filter 802 with the zero section of rapidly evolving spectral shaping filter 804, and maintaining the pole section of rapidly evolving spectral shaping filter 804.

Note that in the specific implementation discussed above, the operation of slowly-evolving spectral shaping filter 802 and rapidly-evolving spectral shaping filter 804 is controlled, in part, by $V_{loss}(k-1)$, which is the smoothed volume loss (or loss in headroom) resulting from compression applied by compression logic 726 and fed back by compression tracker 710. The smoothed volume loss provides an indication of the remaining shortage of intelligibility in the far-end speech signal after the application of compression thereto. This shortage must be compensated for using different means in order to reach a minimum SNR for intelligibility. Hence, in accordance with this embodiment, the amount of spectral shaping applied is a function of the smoothed volume loss.

However, the present invention is not limited to this approach and spectral shaping may be applied to the far-end speech signal in a manner that is not controlled by the smoothed volume loss or by any other measurement of the degree of compression applied to the far-end speech signal by compression logic 726. Furthermore, although spectral shaping is described herein as one of a plurality of techniques used for performing SIE, persons skilled in the relevant art(s) will appreciate that spectral shaping alone can be used to enhance speech intelligibility.

2. Dispersion Filter 704

As shown in FIG. 7, dispersion filter 704 may be inserted after spectral shaping block 702 but before an input level estimator 706. Depending upon the implementation, dispersion filter 704 could also be merged with the spectral shaping filter(s) in spectral shaping block 702 to form a single filter, or it could be moved ahead of spectral shaping block 702.

The function of dispersion filter 704 is to reduce the peak-to-average ratio for waveform sample magnitudes of the far-end speech signal. One way to measure the "average" is the Root-Mean-Square (RMS) value that is well-known in the art. Some of the speech vowel signals are fairly "peaky"—that is, they have a high peak-to-RMS ratio. In this case, such speech signals cannot be amplified to a very loud level before the waveform peaks are clipped at digital saturation level. Dispersion filter 704 can "disperse" or effectively smear out such waveform peaks so that the energy of the waveform peak is more evenly distributed across the time axis after such filtering. When it achieves this, the peak-to-RMS ratio is reduced. In other words, for the same RMS value or energy level, the waveform magnitude peak is reduced, leaving more "headroom" to digital saturation for AVB logic 724 to utilize. The waveform can then be amplified more before clipping occurs, and this will boost the effective volume of the far-end speech signal and enhance the speech intelligibility. Generally speaking, if dispersion filter 704 can reduce the peak-to-RMS ratio by X dB and if AVB logic 724 can fully utilize this additional X dB of headroom, then after application of AVB the output signal level will be X dB higher without clipping.

There are many ways to perform dispersion filtering. Since one of the objectives of the SIE system and method is to minimize the distortion introduced to the far-end speech signal, one exemplary implementation uses an all-pass filter as the dispersion filter, because an all-pass filter has a completely flat magnitude frequency response of value 1 and thus does not introduce any magnitude distortion whatsoever. The only distortion it can introduce is phase distortion, but human ears are generally not very sensitive to phase distortion.

Since the magnitude frequency response of an all-pass filter has value 1 for all frequencies, the input signal and the output signal of an all-pass filter have exactly the same RMS value. Therefore, with all-pass filtering, minimizing the peak-to-RMS ratio is exactly the same as minimizing the waveform peak value.

As is well-known in the art, an all-pass filter is a pole-zero filter with the numerator polynomial and denominator polynomial of its transfer function sharing the same set of polynomial coefficients except with the order reversed. With proper design, even a fixed $6^{th}$-order all-pass filter can provide on average nearly 2 dB of reduction in the peak-to-RMS ratio of high-magnitude speech vowel signals. An example transfer function of such a fixed $6^{th}$-order all-pass filter optimized for 8 kHz sampled speech is given below.

$$H(z) = \frac{a_6 + a_5 z^{-1} + a_4 z^{-2} + a_3 z^{-3} + a_2 z^{-4} + a_1 z^{-5} + z^{-6}}{1 + a_1 z^{-1} + a_2 z^{-2} + a_3 z^{-3} + a_4 z^{-4} + a_5 z^{-5} + a_6 z^{-6}} \quad (12)$$

The filter coefficients may be, for example, $\alpha_1=-1.787$, $\alpha_2=2.432$, $\alpha_3=-2.565$, $\alpha_4=2.171$, $\alpha_5=-1.408$, $\alpha_6=0.699$. An exemplary implementation of the SIE system can use such a fixed all-pass filter. Using such a fixed all-pass filter has the advantage of relatively low complexity.

It is also possible to make the all-pass filter adaptive to achieve more waveform peak reduction, albeit at the cost of higher complexity. The poles and zeros of the all-pass filter can be adapted according to the local characteristics of the speech waveform so as to maximize the reduction of the waveform peak magnitude. In addition, just as the smoothed volume loss, $V_{loss}(k)$, can be used to control the spectral shaping filter(s) in spectral shaping block 702, $V_{loss}(k)$ can also be used to control an adaptive all-pass filter. For example, similarly to how the spectral shaping is gradually increased by an increasing $V_{loss}(k)$, the amount of dispersion can be gradually increased by an increasing $V_{loss}(k)$. This can be achieved by mapping $V_{loss}(k)$ to a scaling factor that is applied to the radii of the poles of the dispersion filter. The mapping maps a low $V_{loss}(k)$ to a scaling factor close to zero (effectively disabling dispersion), and a high $V_{loss}(k)$ to a scaling factor close to one (allowing full dispersion). The usage of $V_{loss}(k)$ to control the dispersion is shown by the dashed line connecting compression tracker 710 to dispersion filter 704 in FIG. 7.

Figure 11:
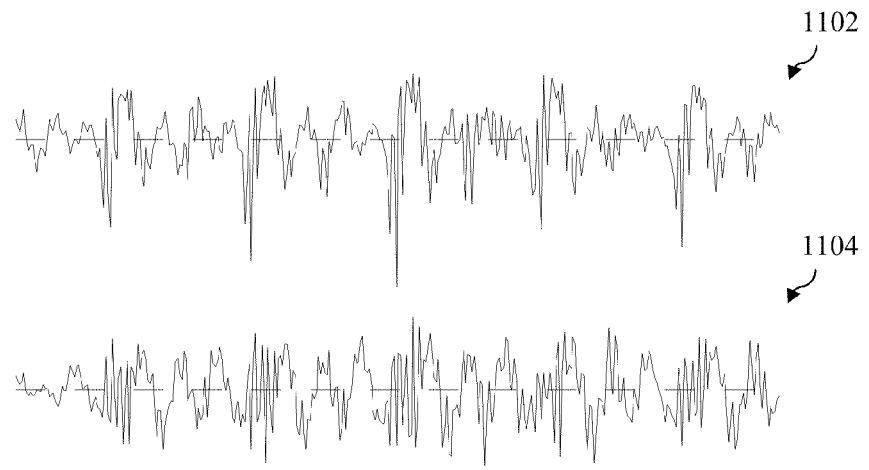
FIG. 11 depicts a first plot that shows an example male speech waveform before dispersion filtering and a second plot that shows the same segment of speech waveform after dispersion filtering.

The effect of all-pass dispersion filtering is illustrated in FIG. 11, where an example male speech waveform before the dispersion filtering is shown in an upper plot 1102, and the same segment of speech waveform after dispersion filtering is shown in a lower plot 1104. The two horizontal dashed lines represent the lines corresponding to zero signal magnitude for these two waveforms, respectively. Note that the two waveforms have identical energy values and even sound essentially the same, because the dispersion filter used was an all-pass filter.

It can be seen from FIG. 11 that the waveform in upper plot 1102 has about five periods of nearly periodic pitch cycle waveform, where each period has a sharp negative peak. After all-pass dispersion filtering, these sharp negative peaks were spread out into many smaller peaks, and the maximum signal magnitude is reduced in the process. Specifically, the speech waveform in upper plot 1102 has the largest negative peak in the middle of the plot with a magnitude of 8822 in a 16-bit linear PCM representation. After all-pass dispersion filtering, the filter output signal in lower plot 1104 has a maximum magnitude of 4544. This represents a peak magnitude reduction of 5.76 dB. In the ideal situation in which AVB logic 724 can fully utilize this reduced peak magnitude (i.e. increased "digital headroom"), AVB logic 724 can boost the intensity of the signal in the lower plot 5.76 dB more than it can boost the intensity of the signal in the upper plot before reaching the digital saturation level. Therefore, in this example of FIG. 11, compared with the unfiltered signal shown in plot 1102, the signal after dispersion filtering shown in plot 1104 can be boosted to be 5.76 dB higher in intensity in an ideal situation.

Figure 12:
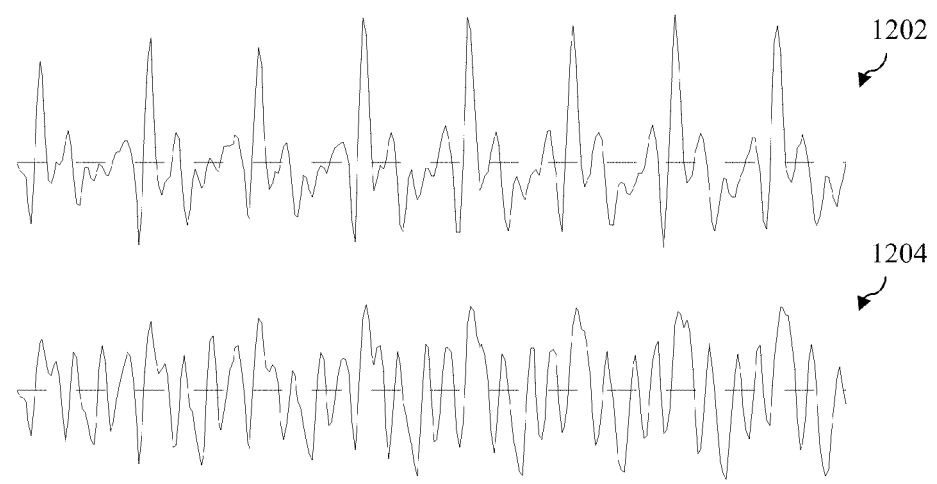
FIG. 12 depicts a first plot that shows an example female speech waveform before dispersion filtering and a second plot that shows the same segment of speech waveform after dispersion filtering.

A similar waveform plot for an example female speech signal is shown in FIG. 12. In particular, an example female speech waveform before dispersion filtering is shown in an upper plot 1202, and the same segment of speech waveform after dispersion filtering is shown in a lower plot 1204. In this case, the sharp positive waveform peaks in upper plot 1202 were reduced in lower plot 1204, and the all-pass filter reduced the peak magnitude by 4.44 dB. In both FIG. 11 and FIG. 12, a $6^{th}$-order all-pass filter optimized for that segment of speech signal was used.

Through experiments, it was found that the optimal all-pass filter for a given frame of voiced speech signal usually has its poles and zeros located near but not exactly at the speech formant frequencies. (Here "optimal" is in the sense of minimizing the peak-to-RMS ratio, or equivalently, minimizing the waveform peak magnitude). Also, it was found that the degree of waveform peak reduction is controlled by how close the poles (and the corresponding zeros) of the all-pass filter are to the unit cycle. As the radii of the poles approach the range of 0.90 to 0.95, large waveform peak reduction can be achieved. On the other hand, as the radii of the poles approaches zero, the effect of all-pass filtering gradually diminishes.

Based on such an observation, an exemplary implementation of the SIE system employs an adaptive all-pass filter where the radii of its poles are set at or near zero during silence regions of the far-end speech signal and are adapted toward the range of 0.90 to 0.95 during high-magnitude vowel regions. Also, at or near the beginning of a voiced region of the far-end speech signal, the frequencies (or equivalently, polar angles) of the poles of the adaptive all-pass filter are set to the pole frequencies of an optimal fixed all-pass filter, such as the $6^{th}$-order fixed all-pass filter shown above. Then, during the syllable of that vowel sound, the pole frequencies are adapted frame by frame to try to maintain near optimality by tracking the change in that vowel speech signal. One example way of performing such tracking is to estimate the formant frequencies and then use such formant frequencies to guide the adaptation of the pole frequencies of the all-pass filter (with the corresponding changes to the frequencies of the zeros).

The estimate of formant frequencies need not be very accurate, and certainly not to the same degree of accuracy required by some formant-based speech synthesis systems. Basically, in terms of minimizing the waveform magnitude peak, what matters is the relative phase relationship between pitch harmonics near prominent peaks of the spectral envelope of the speech signal. Therefore, even a crude estimation of rough formant frequencies based on picking frequencies of spectral peaks in the frequency response of a short-term predictive synthesis filter (often called the "LPC filter" in speech coding literature) will suffice.

In addition to (or in place of) such guidance from estimated formant frequencies, one can also use a closed-loop pole frequency search to find the optimal pole frequencies and to guide the adaptation of such pole frequencies. It was found that when an all-pass filter is used, the pole frequencies cannot change too much from frame to frame, otherwise there will be a significant difference in the group delays of the filtered signals in the adjacent frames which will cause an audible waveform disturbance. To minimize the possibility of such distortion, the closed-loop pole frequency search limits this search range to be in the neighborhoods of the previous pole frequencies. It was found that a frequency resolution of 5 to 10 Hz is sufficient to achieve most of the magnitude peak reduction. Therefore, a few pole frequency candidates, which are in the neighborhood of the pole frequencies used in the last frame and which are 5 to 10 Hz away from each other, are tried, and the set of pole frequencies achieving the maximum waveform peak reduction subject to a constraint of tracking the formant trajectory is selected as the winner for the current frame, and the all-pass filter is constructed from this set of pole frequencies and a given set of default pole radii.

In the example all-pass filters described above, a filter order of 6 was used because that gives three pole pairs (and the corresponding three zero pairs), which are sufficient to track the first three formants in speech signals that account for most of the speech energy. During the search of the optimal pole frequencies for the adaptive all-pass filter, it is advantageous in terms of computational complexity to search one pole pair at a time. For example, the frequency of the first pole pair can be searched in the frequency range of the first speech formant (typically 270 to 730 Hz) using a frequency grid of 5 to 10 Hz. After the frequency of the first pole pair that minimizes the waveform peak magnitude is identified, with the first pole pair fixed at that optimal frequency and with the effect of the first pole pair taken into account, the frequency of the second pole pair can then be searched in the frequency range of the second speech formant (typically 840 to 2290 Hz). Similarly, after the optimal frequency of the second pole pair is also identified and the effect of the optimal second pole pair taken into account, the frequency of the third pole pair can be searched in the frequency range of the third speech formant (typically 1690 to 3010 Hz). It is also possible to perform joint optimization of the frequencies of the pole pairs. Although it has a higher complexity, an adaptive all-pass filter has the potential of achieving significantly more waveform peak reduction than a fixed all-pass filter.

Besides a fixed all-pass filter and a fully adaptive all-pass filter, a third possible implementation for dispersion filter 704 is a switched-adaptive all-pass filter, which achieves a compromise between a fixed all-pass filter and a fully adaptive all-pass filter in terms of complexity and performance. In a switched-adaptive all-pass filter, a collection of N all-pass filter candidates are carefully pre-designed and optimized. Then, in actual filtering, each of the N filter candidates is tried, and the system identifies the filter candidate that minimizes the speech waveform peak magnitude while also satisfying the constraint that the differences between the pole locations (or group delays) of filters in adjacent frames are below pre-set thresholds. Simulations have shown that such a switched-adaptive all-pass filter can achieve significant improvement in waveform peak magnitude reduction over a fixed all-pass filter while also avoiding the waveform distortion due to significant difference between group delays of the filter output signals of adjacent frames.

3. Level Estimator 706

In SIE system 700, level estimator 706 is configured to perform level estimation on the signal output from dispersion filter 704 (i.e., the far-end speech signal after spectral shaping and dispersion filtering have been applied thereto). However, depending upon the implementation, the level of the original far-end speech signal input to spectral shaping block 702 can instead be estimated, or level estimation can be performed on both the signal input to spectral shaping block 702 and the signal output from dispersion filter 704. However, for complexity considerations it may be desirable to perform level estimation on only one of the signals, and in practice SIE system 700 will perform satisfactorily when level estimation is performed only on the output of dispersion filter 704. As shown in FIG. 7, in one implementation, another component within the telephony device in which SIE system 700 is implemented provides a measure of voice activity in the receive-in signal as input to level estimator 706. For example, the other component may be a sub-band acoustic echo canceller (SBAEC). The measure of voice activity can be implemented in many ways. One example is to count the number of sub-bands where the energy significantly exceeds the noise floor.

4. Waveform Envelope Tracker 708

Waveform envelope tracker 708 is configured to perform waveform envelope tracking on the signal output from dispersion filter 704 (i.e., the far-end speech signal after spectral shaping and dispersion filtering have been applied thereto) and to provide waveform tracking information to AGC/AVB/compressor block 712. This allows AGC/AVB/compressor block 712 to determine exactly how much headroom there is to digital saturation in the signal prior to modifying it. In one implementation, waveform envelope tracker 708 is configured to calculate the maximum absolute amplitude of the signal waveform in the current frame, e.g. 5 milliseconds (ms). In further accordance with this implementation, waveform envelope tracker 708 also maintains a buffer of the maximum absolute amplitudes of the past two 5 ms frames. This allows waveform envelope tracker 708 to calculate the maximum absolute amplitude of the signal waveform over the past 15 ms. The intent in covering 15 ms is to make sure that at least one pitch period is considered in the maximum. For some talkers of particular low pitch frequency it may be advantageous to increase this value from 15 ms to a larger value. In accordance with this implementation, waveform envelope tracker 708 calculates the waveform tracking information as $$mx(k) = \max[\phi, 15/16 \cdot mx(k-1))], \quad (13)$$

where k is the frame counter and $\phi$ is the maximum absolute amplitude of the signal waveform over the past 15 ms. Effectively, this implementation of waveform envelope tracker 708 provides instant attack and exponential decay.

5. AGC/AVB/Compressor Block 712

Figure 13:
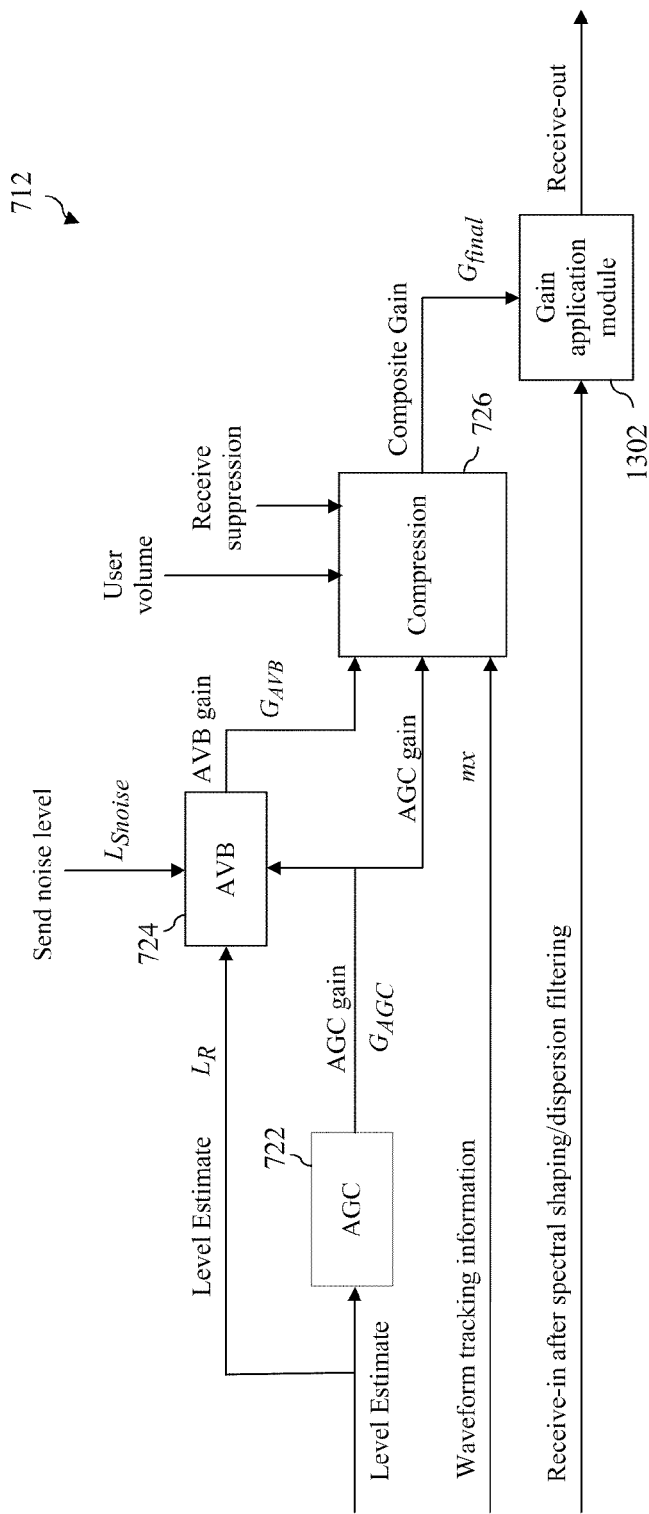
FIG. 13 is a block diagram of an automatic gain control (AGC)/automatic volume boost (AVB)/compression block in accordance with one implementation of the SIE system of FIG. 7.

FIG. 13 is a block diagram that depicts AGC/AVB/compression block 712 of FIG. 7 in more detail in accordance with one implementation. The manner in which this particular implementation of AGC/AVB/compression block 712 operates will now be described. It is noted that all gain and volume arithmetic described in this section is carried out in the log domain.

First, AGC logic 722, if enabled, calculates a logarithmic AGC gain to bring the input signal (i.e., the signal output from dispersion filter 704) to a predefined nominal level:

$$G_{AGC} = L_{nom} - L_R, \quad (14)$$

where $L_{nom}$ is the predefined nominal level and $L_R$ is the estimated input level as provided by level estimator 706. In one embodiment, $G_{AGC}$ is subject to a minimum and maximum, e.g. −20 dB and +20 dB.

Subsequently, AVB logic 724 calculates the receive-to-ambient-background-noise ratio after AGC as $$R2Snoise = \text{default\_volume} + G_{AGC} + L_R + C - L_{Snoise} \quad (15)$$

where default_volume is a constant representing a volume providing a comfortable listening level in quiet conditions, $L_{Snoise}$ is the estimated ambient noise level, and C is a calibration term to ensure that R2Snoise reflects what the user is experiencing. In one embodiment, the parameter $L_{Snoise}$ may be provided from another component within the telephony device in which SIE system 700 is implemented. For example, the other component may be a sub-band acoustic echo canceller (SBAEC).

AVB logic 724 then calculates the target AVB gain as $$TG_{AVB} = \begin{cases} 0 & R2Snoise > TR2Snoise \\ \min[TR2Snoise - R2Snoise, mxG_{AVB}] & \text{otherwise} \end{cases}, \quad (16)$$

where TR2Snoise is the minimum target SNR between speech and ambient background noise, and $mxG_{AVB}$ is a maximum allowable AVB gain, e.g. 20 dB. In order to change the AVB gain gradually, in one implementation it is constrained to change in small step sizes, and the actual AVB gain is calculated as $$G_{AVB}(k) = \begin{cases} G_{AVB}(k-1) + \Delta & TG_{AVB} > G_{AVB}(k-1) + \Delta \\ G_{AVB}(k-1) - \Delta & TG_{AVB} < G_{AVB}(k-1) - \Delta , \\ G_{AVB}(k-1) & \text{otherwise} \end{cases} \quad (17)$$

where $\Delta$ is the step size, e.g. 1 dB.

With respect to the minimum target SNR, in practice a value of 15 dB may work in an implementation in which the telephony terminal is a hanging style Bluetooth® headset. However, it is anticipated that the specific value will depend somewhat on the actual telephony terminal implementation. For example, an alternative Bluetooth® headset having an in-ear style speaker that provides a good acoustic seal will prevent some of the ambient background noise from reaching the auditory system of the user. In that case, a lower minimum SNR such as 6 dB may work. If the attenuation by the seal is accounted for in the calculations in the algorithm, e.g. the SNR is specified at the point of the ear drum, then the desired minimum SNR should be more device independent. However, in practice it may not be simple to account for such factors as the seal.

The receive-signal-to-ambient-background-noise ratio is a key parameter that is monitored by SIE system 700. Note that the far-end speech signal and the near-end noise are two different signals in two different domains. Even for the same far-end speech signal level as "seen" by SIE system 700, different loudness levels may be perceived by the user of the near-end telephony terminal depending on the gain applied to the speech signal before playback, the loudspeaker sensitivity, and a number of other factors. Similarly, even for the same near-end background noise level in the acoustic domain, SIE system 700 may see different noise levels depending on the microphone sensitivity, the gain applied to the microphone signal, or the like. Therefore, it is anticipated that for each type of telephony terminal, some calibration will be needed so that the predetermined SNR target as measured by the SIE system and method makes sense.

After the actual AVB gain has been calculated, AVB logic 724 then calculates the desired total gain as $$G_{desired} = \text{volume} + G_{AGC} + G_{AVB}, \quad (18)$$

where volume is the user volume of the telephony terminal (set by the user). Depending upon the implementation, there could be an additional term corresponding to a loss dictated by an echo suppression algorithm. This term is shown as "receive suppression" in FIGS. 7 and 13 and may be received, for example, from a sub-band acoustic echo cancellation (SBAEC) component or other component within the telephony device.

Compression logic 726 then computes the final gain, wherein the final gain represents any compression that will be applied. The instant attack of the waveform envelope tracking as described above in reference to Eq. 13 taken together with the following gain calculations essentially guarantees that saturation and clipping will never occur.

To compute the final gain, compression logic 726 first calculates a compression point, $C_p$, relative to maximum digital amplitude in a manner that is adaptive and that takes into account the user volume and a calibration value for a "nominal" user (at a nominal listening level in quiet):

$$C_p = \max[C_{p,default\_volume} + (\text{default\_volume} - \text{volume}), 0], \quad (19)$$

where $C_{p,default\_volume}$ is the compression point at a user volume of default_volume. One can think of $C_{p,default\_volume}$ as the maximum comfortable waveform level for a user that would use default_volume in quiet.

This adaptive approach to determining the compression point advantageously allows the compression point to move up and down with the user volume. For example, a compression point of 6 dB means that compression logic 726 will limit the waveform amplitude to 6 dB below maximum digital amplitude. For a user who prefers and uses a higher volume compared to another user, this means that compression point will be closer to maximum digital amplitude, and hence the signal will compressed at a higher level allowing higher waveform levels. For a user with a 3 dB louder volume setting, the compression will occur at a waveform amplitude that is 3 dB higher.

In further accordance with this approach, the waveform amplitude will be limited by compression logic 726 to a level that is below the maximum digital amplitude, and hence the full digital range may not be utilized for some users. In cases where this is undesirable, the compression point could be fixed to 0 dB. For example, this could apply to telephony terminals that are unable to provide sufficient volume for any user. However, where a telephony terminal is capable of providing more than enough loudness for a user (i.e., the loudness can be increased to a point that is uncomfortable for the user), the above approach of adaptively determining the compression point ensures that a level of discomfort will not be exceeded. Instead, loudness is achieved by amplifying the lower level segments while preventing the higher level segments from exceeding the compression point, which can be viewed as representing the maximum waveform amplitude of comfort.

Consequently, using this adaptive approach to determine the compression point, a higher maximum waveform is allowed for a user with a higher user volume setting, acknowledging that this particular user prefers louder levels. Conversely, a user with high sensitivity applying a lower user volume setting will be protected by a lower compression point (further below maximum digital amplitude). Instead of achieving intelligibility by uncomfortable levels via linear gain, the intelligibility is achieved by the additional features such as amplification of lower levels, spectral shaping, and dispersion.

In some sense, the adaptive nature of the compression point offers acoustic shock protection to users by limiting the maximum amplitude of waveforms that the auditory system is exposed to. The use of such a compression point also means that sometimes the maximum possible linear gain is not applied, and instead intelligibility is achieved by other means in order to honor the user's sensitivity to pure linear gain. Hence, in the interest of avoiding user discomfort, processing that introduces distortion in a traditional sense may be activated before distortion-less processing (linear gain) has been exhausted. However, from the perspective of the auditory system of the user the discomfort can be considered a distortion, and hence the above-described application of processing that increases distortion in a traditional sense should not be considered a violation of the prescribed philosophy of applying increasingly more aggressive processing as noise levels increase.

Furthermore, not only does the adaptive compression point accommodate users with different sensitivity, it also accommodates a varying acoustic seal for a single user. This frequently occurs when the user is using a cellular telephone, Bluetooth® headset, or like device that is often coupled and uncoupled from the ear, acoustically. If the seal is 3 dB worse during one use, the user would naturally increase volume by 3 dB to achieve the same loudness. Consequently, the compression point will move up by 3 dB, and everything will behave as before. As can be seen from Eq. 19 the compression point is not allowed to go beyond 0 dB, i.e. the maximum digital amplitude. This, along with the instant attack of the waveform tracking, prevents any kind of saturation.

It should be noted that in some cases it may be beneficial to allow some digital saturation since this will also provide some additional loudness. In terms of determining the permissible amount of saturation, a suitable trade-off must be made between loudness and distortion from saturation. As described in commonly-owned, co-pending U.S. patent application Ser. No. 12/109,017 (entitled "Audio Signal Shaping for Playback by Audio Devices" and filed Apr. 24, 2008), the entirety of which is incorporated by reference herein, soft-clipping may be used to minimize objectionable distortion. In such an implementation, the threshold in Eq. 19 will not be 0, but rather a negative number with an absolute value corresponding to the acceptable level of clipping.

After the compression point $C_p$ has been determined, compression logic 726 calculates the overall gain headroom, $G_{headroom}$, between the waveform and the compression point as $$G_{headroom} = 20 \cdot \log_{10}\left(\frac{MAXAMPL}{mx(k)}\right) - G_{margin} - C_p \tag{20}$$

where MAXAMPL is the maximum digital amplitude of the output in the system, e.g. 32768 for a 16-bit output. The gain headroom is calculated as the gain required to bring the waveform envelope tracking information, denoted mx(k), to the compression point, or just below if a margin, $G_{margin}$, is desired due to finite precision of fixed point arithmetic, e.g. $G_{margin}=1$ dB. In the special case where the compression point is 0 dB, and hence corresponds to the point of saturation, the gain headroom corresponds to the headroom between the waveform envelope and saturation, less the margin, $G_{margin}$.

Compression logic 726 then calculates the final gain, $G_{final}$, to be applied to the current frame as the minimum of the desired linear gain and the gain headroom (observing the compression point). The time-varying final gain creates the compression effect due to lower level frames having greater gain headroom than higher level frames.

$$G_{final} = \min[G_{desired}, G_{headroom}], \tag{21}$$

Compression logic 726 then converts the final gain $G_{final}$ from the log domain to the linear domain $$g = 10^{G_{final}/20} \tag{22}$$

and gain application module 1302 applies the converted gain g to the output signal from spectral shaping block 702/dispersion filter 704 to produce the output signal (denoted "receive-out" in FIGS. 7 and 13) for playback via a loudspeaker of the telephony terminal:

$$r_{out}(n) = g \cdot y(n). \tag{23}$$

As noted above, the degree of compression applied to the signal output from spectral shaping block 702/dispersion filter 704 by compression logic 726 is dependent upon the desired amount of gain and the amount of headroom available for applying such gain. As also noted above, in an embodiment, the amount of headroom is determined based on waveform tracking information provided by waveform envelope tracker 708, which measures a maximum absolute amplitude of the signal waveform in a manner that provides instant attack and exponential decay. The instant attack enables compression logic 726 to quickly adapt when the level of the output signal changes suddenly. For example, the instant attack allows compression logic 726 to quickly adapt when the level of the output signal increases suddenly to ensure that the level of the output signal never exceeds a maximum digital amplitude or some other maximum desired output level. Thus, compression logic 726 may itself be thought of as providing instant attack.

However, it has been observed that when the aforementioned instant attack approach to compression is applied, it occasionally introduces an audible "click like" distortion into certain onset portions of voiced speech segments. Further investigation has revealed that the combined effect of a large desired gain and the instant attack of the compression causes the evolution of the envelope of the pitch-cycle waveform to change from a smoothly increasing one to one that shoots up to digital saturation very quickly (e.g., within a pitch cycle or two) and then flattens out at digital saturation level. This dramatic change in the pitch-cycle waveform envelope is believed to create a distortion that may be masked in situations where there is significant near end noise, but that in quieter conditions may become audible and slightly annoying.

Various methods may be adopted in order to reduce or eliminate such distortion. In one embodiment, the speed at which the pitch-cycle waveform envelope shoots up toward digital saturation is constrained so that it ramps up more slowly. To achieve this, the speech signal output by compression logic 726 may be passed through an additional stage of decision logic and processing so that the ramp-up speed of the pitch-cycle waveform envelope at speech onsets is constrained to not exceed a certain threshold. In one example implementation, the following decision logic is used:

---

IF there is a local waveform peak (positive or negative) in the current frame with a peak magnitude above a threshold X THEN
    IF within Y milliseconds before the local waveform peak there
    isn't any other peak having a peak magnitude exceeding X THEN
        the local waveform peak is regarded as the first pitch cycle
        peak of a syllable and the peak magnitude of the local
        waveform peak is reduced by Z percent along with
        neighboring samples
    END
END

---

Example values that may be used to implement the foregoing logic may include X=24,000 (for 16-bit linear PCM representation of speech samples), Y=40 and Z=30. It is noted that the foregoing is only one example approach to constraining the speed at which the pitch-cycle waveform envelope shoots up toward digital saturation. Persons skilled in the relevant art(s) will appreciate that other approaches may be used.

In an alternate implementation, compression logic 726 may utilize adaptive compressor ramping to adaptively adjust the compression attack (and potentially decay) speeds to reduce or eliminate the distortion. In high noise conditions, rapid (or even instant) gain transitions are used while in lower noise conditions slower compression attack speeds are used. However, when the compression attack speed is reduced, the problem of onset clipping can occur. This can be mitigated by adaptive smoothing or adaptively soft clipping the signal depending on the compression attack speed and/or the degree of overshoot which results due to the non-instantaneous compression gain transitions. Note that depending upon the implementation, the compression attack speed can be modified by modifying the waveform tracking information that is used to determine the headroom available for compression, or by modifying the headroom measure itself.

6. Compression Tracker 710

Compression tracker 710 is configured to monitor the shortage in headroom, or instantaneous volume loss $$V_{instloss} = G_{desired} - G_{final}, \quad (24)$$

and to calculate an average version according to the following equations. First a peak tracker is updated according to $$V_{peakloss}(k) = \begin{cases} V_{instloss} & V_{instloss} > V_{peakloss}(k) \\ 4095/4096 \cdot V_{peakloss}(k-1) & \text{otherwise} \end{cases} \quad (25)$$

Then, compression tracker 710 applies second order smoothing to calculate the smoothed volume loss $$V_{loss}(k) = 2\beta \cdot V_{loss}(k-1) - \beta^2 \cdot V_{loss}(k-2) + 1/\beta \cdot V_{peakloss}(k), \quad (26)$$

where $\beta$ is a smoothing factor, e.g. $\beta=1023/1024$. Compression tracker 710 feeds back the smoothed volume loss $V_{loss}(k)$ back to spectral shaping block 702 and optionally dispersion filter 704 to control the operation thereof.

C. Alternate SIE System Implementation

Figure 14:
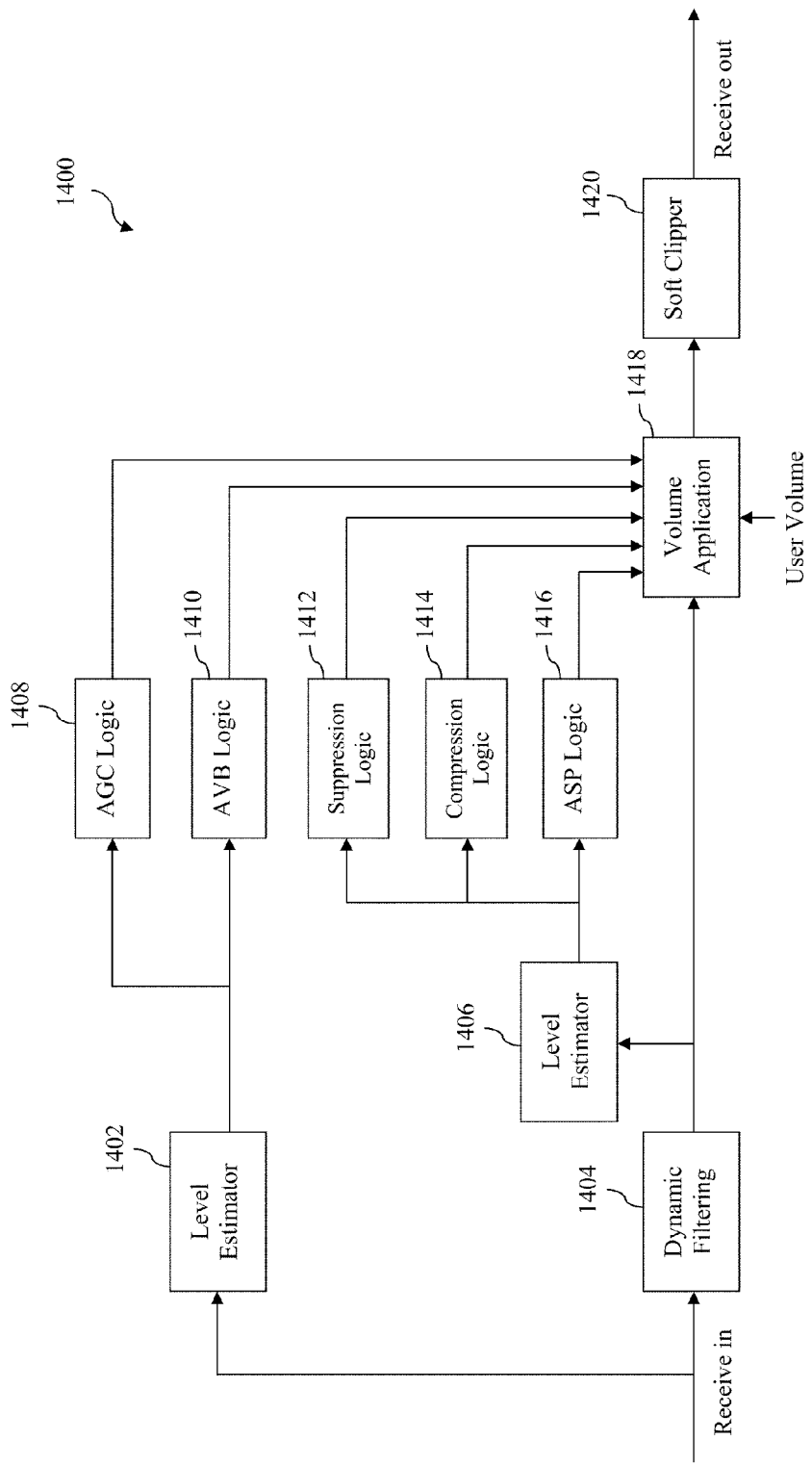
FIG. 14 is a block diagram of an alternate SIE system.

FIG. 14 is a block diagram of an alternate SIE system 1400. Like SIE system 700 described above in reference to FIG. 7, SIE system 1400 is configured to improve the intelligibility of a speech signal received over a communication network from a far-end telephony terminal (the "far-end speech signal") for playback by a near-end telephony terminal of which SIE system 1400 is a part. In FIG. 14, the far-end speech signal is denoted "Receive in." The output of SIE system 1400 is the modified far-end speech signal, denoted "Receive out."

As shown in FIG. 14, SIE system 1400 includes a first level estimator 1402, a dynamic filtering block 1404, a second level estimator 1406, AGC logic 1408, AVB logic 1410, suppression logic 1412, compression logic 1414, acoustic shock protection (ASP) logic 1416, a volume application block 1418 and a soft clipper 1420. Each of these elements will now be described.

First level estimator 1402 is configured to determine an estimated level of the far-end speech signal and to provide this information to AGC logic 1408 and AVB logic 1410 for use in performing gain calculations. By performing level estimation directly on the original far-end speech signal (as opposed to the far-end speech signal after processing by dynamic filtering block 1404), first level estimator 1402 is able to provide AGC logic 1408 and AVB logic 1410 with a more accurate estimate of the level of the far-end speech signal as received from the communication network. However, in accordance with this implementation, first level estimator 1402 cannot take into account any loss in level due to the processing of the far-end speech signal by dynamic filtering block 1404. In contrast, if level estimation for the purposes of performing AGC and AVB operations were performed after dynamic filtering, this could lead to the removal of the higher intensity components (i.e., lower-frequency components) which have less impact on intelligibility or loudness. In either case, one could include logic to compensate for the loss of loudness due to the operations of dynamic filtering block 1404 to provide a more accurate estimate of the final loudness that a user would experience.

Dynamic filtering block 1404 is configured to filter the far-end speech signal in an adaptive manner in order to increase intelligibility of the signal and to obtain more digital headroom for boosting of the signal by AVB logic 1410 while avoiding the introduction of an impermissible level of digital saturation. The operations performed by dynamic filtering block 1404 may include any of the functions attributed to spectral shaping block 702 and/or dispersion filter 704 as described above in reference to system 700 of FIG. 7. In an implementation in which dynamic filtering block 1404 performs spectral shaping and/or dispersion filtering, the degree of spectral shaping or dispersion filtering applied may be controlled by a measure of the amount of compression applied by compression logic 1414 and/or ASP logic 1416 or by a measure of the amount of digital headroom remaining before such compression will be applied.

In alternate implementations, the degree of spectral shaping or dispersion filtering applied may be a function of a long-term or average level of the far-end speech signal or as a function of the level of lower-frequency components of the far-end speech signal. The level of such lower-frequency components may be determined, for example, by passing the far-end speech signal through a low-pass filter that has a roughly inverse shape to a high-pass filter used by dynamic filtering block 1404.

Second level estimator 1406 is configured to determine an estimated level of the far-end speech signal after it has been processed by dynamic filtering block 1406. This estimate is then provided to suppression logic 1412, compression logic 1414 and ASP logic 1416 for use in calculations performed by those blocks.

AGC logic 1408 is configured to compensate for variations in the level of the far-end speech signal, as estimated by first level estimator 1402. For example, such variations may be due to variation of network connections, acoustic coupling, or the like. AGC logic 1408 calculates a gain scaling factor that, when applied to the far-end speech signal, brings the far-end speech signal to a nominal signal level. AGC logic 1408 may operate in a like manner to that described above in reference to AGC logic 722 of system 700 or in a manner to be described below in reference to FIG. 15.

AVB logic 1410 is configured to calculate an additional gain to be applied to the far-end speech signal so as to maintain a minimum SNR between the level of the far-end speech signal (after application of the gain calculated by AGC logic 1408) and the level of the near-end background noise. AVB logic 1410 may operate in a like manner to that described above in reference to AVB logic 724 of system 700.

Suppression logic 1412 is configured to apply an echo suppression algorithm to the far-end speech signal in order to attenuate the effects of acoustic echo on that signal. The output of suppression logic 1412 is a loss to be applied to the far-end speech signal.

Compression logic 1414 is configured to determine a time varying gain to be applied to the far-end speech signal to ensure that, after application of the gain calculated by AGC logic 1408, the gain calculated by AVB logic 1410, the gain calculated by suppression logic 1412, and a gain associated with a user volume setting, the audio output waveform does not exceed (or exceeds by only a permissible amount) a digital saturation or clipping point of the telephony device.

ASP logic 1416 is configured to adaptively determine a compression point (i.e., an offset from a maximum digital amplitude at which saturation occurs) below which the maximum amplitude of the far-end speech signal must be maintained in order to protect users of the telephony device from acoustic shock or discomfort. ASP logic 1416 may thus be thought of as calculating an additional loss that must be applied to the far-end speech signal in addition to that determined by compression logic 1414.

Volume application block 1418 is configured to receive the far-end speech signal after processing by dynamic filtering block 1404 and to apply the gains calculated by AGC logic 1408, AVB logic 1410, suppression logic 1412, compression logic 1414 and ASP logic 1416, as well as a gain associated with a user volume, thereto.

Soft clipper 1420 is configured to receive the audio signal output by volume application block 1418 and apply soft clipping thereto. Soft clipper 1420 operates by manipulating the dynamic range of the audio signal output by volume application block 1418 such that the level of the signal does not exceed a soft clipping limit. The soft clipping limit may be less than a limit imposed by the compression logic 1414/ASP logic 1416. In accordance with such an embodiment, at higher volumes, the dynamic range of the audio signal output by volume application block 1418 will exceed the soft clipping limit of soft clipper 1420. This overdriving of soft clipper 1420 will lead to some level of clipping distortion. However, through careful selection of the limit imposed by compression logic 1414/ASP logic 1416 and the soft clipping limit, the amount of clipping distortion can advantageously be held to an acceptable level while maintaining loudness. An example of the use of soft clipping subsequent to amplitude compression is described in previously-referenced U.S. patent application Ser. No. 12/109,017, the entirety of which is incorporated by reference herein.

D. Alternate AGC Logic Implementation

Figure 15:
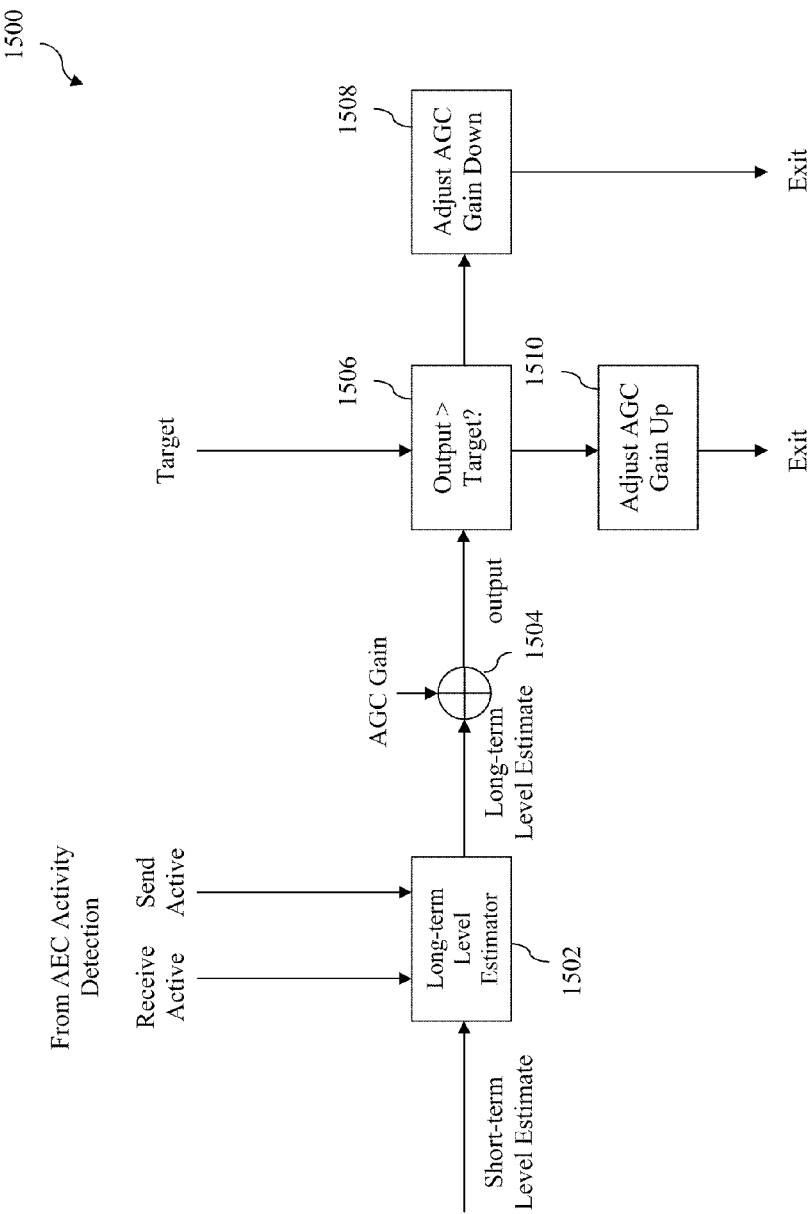
FIG. 15 is a block diagram of AGC logic that may be used to implement an SIE system.

FIG. 15 is a block diagram of AGC logic 1500 that may be used to implement AGC logic 722 of SIE system 700 (described above in reference to FIG. 7) or AGC logic 1408 of SIE system 1400 (described above in reference to FIG. 14).

As shown in FIG. 15, AGC logic 1500 includes a long-term level estimator 1502. Long-term level estimator 1502 is configured to periodically receive a short-term estimate of the level of the far-end speech signal and to update a long-term estimate of the level of the far-end speech signal based on the short-term level estimate. With reference to system 1400 of FIG. 14, the short-term level estimate may be received from level estimator 1402.

A combiner 1504 is configured to receive the long-term level estimate generated by long-term level estimator 1502 and to add a current AGC gain thereto. The output of this operation is provided to decision logic 1506.

Decision logic 1506 determines whether or not the output of combiner 1504 exceeds a target level. If the output exceeds the target level, then a logic block 1508 operates to adjust the current AGC gain downward so that the target level can be maintained. Conversely, if the output does not exceed the target level, then a logic block 1510 operates to adjust the current AGC gain upward so that the target level can be maintained. Note that in certain implementations, the target level may be a configurable parameter.

In one implementation, long-term level estimator 1502 is also configured to receive a "receive active" signal from a sub-band acoustic echo canceller (SBAEC) that indicates whether or not the far-end speech signal constitutes active speech as well as a "send active" signal from the SBAEC that indicates whether or not a near-end speech signal to be transmitted to a far-end telephony device constitutes active speech. In a circumstance in which both the "receive active" and "send active" signals are asserted, long-term level estimator 1502 will not reduce the long-term level estimate it produces regardless of the short-term level estimates received (i.e., the long-term level estimate will not be allowed to adapt downward). The net result of this will be that the magnitude of the AGC gain will not be adapted upward even if the short-term level estimates are decreasing. This feature is intended to ensure that AGC logic 1500 does not operate to undo a loss that may be applied to the far-end speech signal by an echo suppressor when both the "receive active" and "send active" signals are asserted.

However, when both the "receive active" and "send active" signals are asserted, long-term level estimator 1502 will remain capable of increasing the long-term level estimate that it produces based on the short-term level estimates received (i.e., the long-term level estimate is allowed to adapt upward). This ensures that the AGC gain can still be adapted downward to maintain the target signal level if the far-end speech signal is too loud.

In one implementation, AVB logic that operates in conjunction with AGC logic 1500 (e.g., AVB logic 724 of system 700 or AVB logic 1410 of system 1400) is configured to determine the amount of AVB gain to be applied to the far-end speech signal based also on a long-term level estimate that is not allowed to adapt downward when both the near-end speech signal and the far-end speech signal are determined to constitute active speech. This ensures that the AVB logic also does not operate to undo echo suppression that may have been applied to the far-end speech signal. However, the long-term level estimate used by the AVB logic is allowed to adapt upward when both the near-end speech signal and the far-end speech signal are determined to constitute active speech.

In a further implementation, long-term level estimator 1502 is capable of determining whether the far-end speech signal constitutes tones or stationary (i.e., non-speech) signals based on an analysis of the short-term level estimate. In further accordance with such an implementation, if it is determined that the far-end speech signal constitutes tones or stationary signals, long-term level estimator 1502 will prevent the long-term level estimate from adapting downward but allow the long-term level estimate to adapt upwards in a like-manner to that described above when both the when both the "receive active" and "send active" signals are asserted.

Note that in one implementation, the compression point used for applying amplitude compression (as previously described) can be made adaptive such that a different compression point is used when the "send active" signal is asserted (which may be indicative of doubletalk) or when the far-end speech signal is determined to constitute tones or stationary signals.

E. Example Integration with Sub-Band Acoustic Echo Canceller

Figure 16:
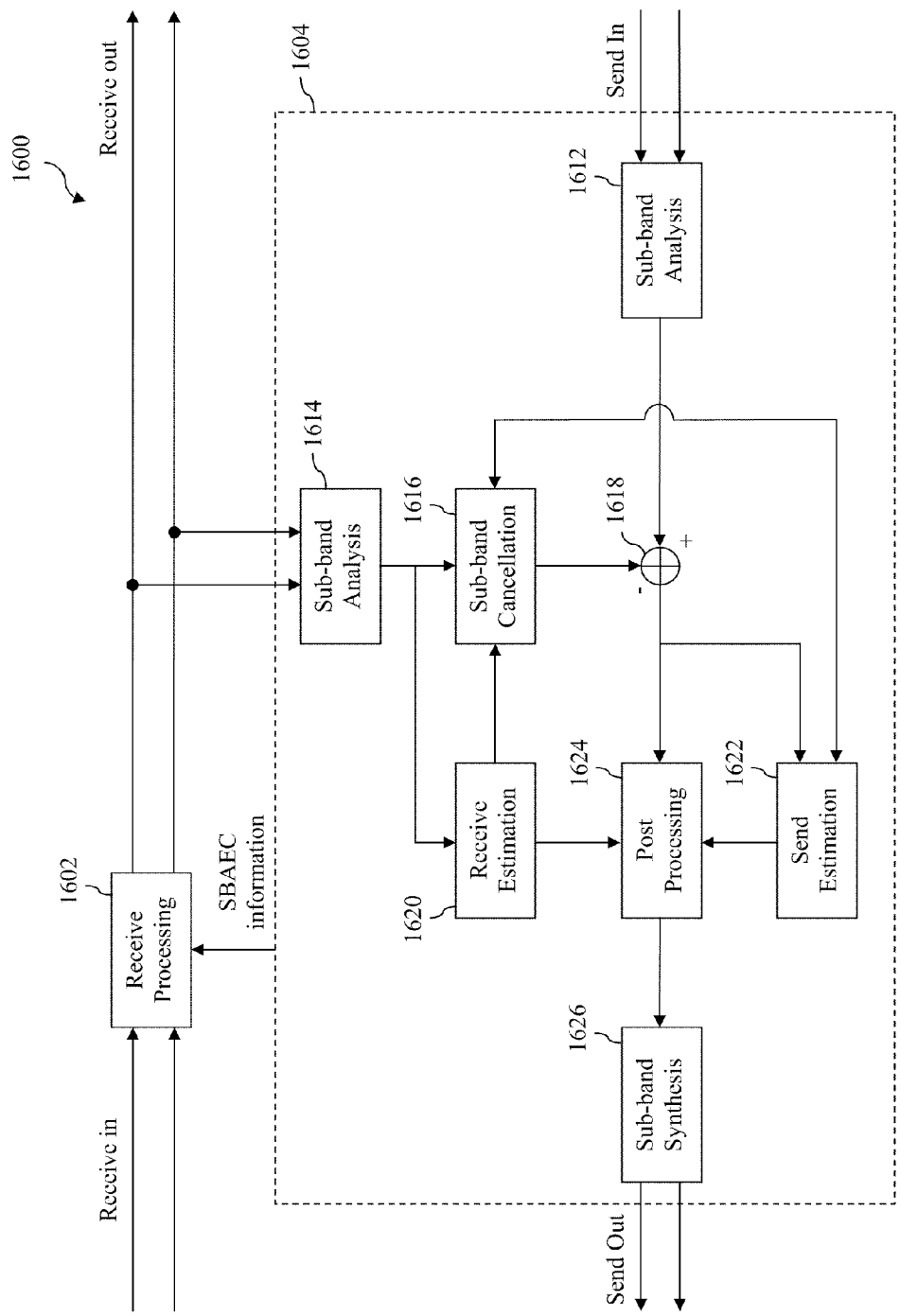
FIG. 16 is a block diagram that shows a telephony terminal in which an SIE system is integrated with a sub-band acoustic canceller.

FIG. 16 is a block diagram that shows a telephony terminal 1600 in which an SIE system is integrated with a sub-band acoustic canceller. As shown in FIG. 16, telephony terminal 1600 includes a receive processing block 1602 that is configured to improve the intelligibility of a speech signal received over a communication network from a far-end telephony terminal (the "far-end speech signal") for playback by telephony terminal 1600. In FIG. 16, the far-end speech signal is denoted "Receive in." The output of receive processing block 1602 is the modified far-end speech signal, denoted "Receive out." Receive processing block 1602 includes an SIE system, such as SIE system 700 described above in reference to FIG. 7 or SIE system 1400 described above in reference to FIG. 14.

As further shown in FIG. 16, telephony terminal 1600 includes a sub-band acoustic canceller 1604 that operates to cancel acoustic echo present in a speech signal captured by telephony terminal 1600 for transmission to the far-end telephony terminal over the communication network (the "near-end speech signal"). In FIG. 16, the near-end speech signal is denoted "Send in." The output of sub-band acoustic echo canceller 1604 is the modified near-end speech signal, denoted "Send out."

Sub-band acoustic canceller 1604 includes a number of components including a first sub-band analysis block 1612, a second sub-band analysis block 1614, a sub-band cancellation block 1616, a combiner 1618, a receive estimation block 1620, a send estimation block 1622, a post processing block 1624 and a sub-band synthesis block 1626. The operation of each of these components will now be described.

First sub-band analysis block 1612 is configured to receive a time-domain version of the near-end speech signal and to convert the signal into a plurality of frequency sub-band components. First sub-band analysis block 1612 may also down-sample the near-end speech signal as part of this process. Second sub-band analysis block 1614 is configured to receive a time-domain version of the modified far-end speech signal output by receive processing block 1602 and to convert the signal into a plurality of frequency sub-band components. First sub-band analysis block 1612 may also down-sample the near-end speech signal as part of this process.

Sub-band cancellation block 1616 receives the sub-band representation of the near-end speech signal and the modified far-end speech signal and operates to determine, on a sub-band by sub-band basis, components of the near-end speech signal that represent acoustic echo and thus should be cancelled from the signal. To perform this function, sub-band cancellation block 1616 analyzes the level of correlation between the near-end speech signal and the modified far-end speech signal. The sub-band echo components are provided to a combiner 1618 which operates to subtract the echo components from the near-end speech signal on a sub-band by sub-band basis.

Post processing block 1624 is configured to receive the signal output by combiner 1618 and to perform non-linear processing thereon to remove residual echo as well as to perform processing thereon to suppress noise present in the signal.

Sub-band synthesis block 1626 is configured to receive the output from post processing block 1624, which is represented as a plurality of frequency sub-band components, and to convert the plurality of sub-band components into a time domain representation of a modified version of the near-end speech signal. Sub-band synthesis block 1626 may also up-sample the modified version of the near-end speech signal as part of this process. The modified version of the near-end speech signal produced by sub-band synthesis block 1626 is then output for encoding and subsequent transmission to the far-end telephony terminal over the communication network.

Receive estimation block 1620 is configured to receive the sub-band components of the modified far-end speech signal and to estimate levels associated with each of the sub-bands that are used by sub-band cancellation block 1616 for performing acoustic echo cancellation functions and by post processing block 1624 for performing non-linear processing and noise suppression. The estimated levels may include, for example, an estimated level of a speech signal component present within each sub-band, an estimated level of a noise component present within each sub-band, or the like.

Send estimation block 1622 is configured to receive the sub-band components of the near-end speech signal after echo cancellation and to estimate levels associated with each of the sub-bands that are used by sub-band cancellation block 1616 for performing acoustic echo cancellation functions and by post processing block 1624 for performing non-linear processing and noise suppression. The estimated levels may include, for example, an estimated level of a speech signal component present within each sub-band, an estimated level of a noise component present within each sub-band, or the like.

In accordance with one implementation, sub-band acoustic canceller 1604 provides certain information generated during the performance of echo cancellation and noise suppression operations to receive processing block 1602. Receive processing block 1602 then uses such information to perform SIE operations. Such information will now be described.

In one implementation, sub-band acoustic canceller 1604 provides a measure of voice activity in the far-end speech signal to one or more level estimator(s) in receive processing block 1602. The measure of voice activity may be used to control the level estimation function. The measure of voice activity may be determined, for example, by counting the number of sub-bands in which the energy significantly exceeds a noise floor. Because sub-band acoustic canceller 1604 analyzes the far-end speech signal in sub-bands, it is capable of providing a more accurate measure of voice activity than an analysis of a time-domain signal would provide.

In a further embodiment, sub-band acoustic canceller 1604 also provides a measure of voice activity in the near-end speech signal to one or more level estimator(s) in receive processing block. This measure of voice activity may also be used to control the level estimation function. For example, as described above in Section II.D, AGC logic within receive processing block 1602 may use a measure of the voice activity in the far-end speech signal and in the near-end speech signal to prevent upward adaption of a long-term level estimate when both the far-end speech signal and the near-end speech signal are deemed to constitute speech.

In another embodiment, sub-band acoustic canceller 1604 provides an estimate of the noise level present in the near-end speech signal to receive processing block 1602. For example, AVB logic within receive processing block 1602 may receive an estimate of the noise level present in the near-end speech signal from sub-band acoustic canceller 1604 and use this estimate to determine a far-end speech signal to near-end noise ratio as previously described.

Since sub-band acoustic canceller 1604 estimates noise levels on a frequency sub-band basis, the estimate of the noise level present in the near-end speech signal may be determined by assigning greater weight to certain sub-bands as opposed to others in order to ensure that the estimated noise level represents noise that would be perceptible to a human (in other words to ensure that the estimated noise level is a measure of the loudness of the noise as opposed to the intensity).

Furthermore, since sub-band acoustic canceller 1604 estimates noise levels on a frequency sub-band basis, sub-band acoustic canceller 1604 can provide the sub-band noise level estimates to a spectral shaping block within receive processing block 1602, such that spectral shaping may be performed as a function of the spectral shape of the noise. For example, different spectral shaping may be applied when the noise is white as opposed to flat.

It is noted that in FIG. 16, the speech signals denoted "Receive in," "Receive out," "Send in" and "Send out" are represented using two lines. This is intended to indicate that telephony terminal 1600 is capable of processing wideband speech signals (e.g., signals generated using 16 kHz sampling). In one implementation of telephony terminal 1600, the far-end and near-end speech signals are wideband speech signals and are split into a narrowband component (e.g., 0-3.4 kHz, sampled at 8 kHz) and a wideband component (e.g., 3.4-7 kHz, sampled at 16 kHz). This approach makes the signal processing aspects of the terminal simpler from a wideband/narrowband perspective and enables functionality that is applicable only to narrowband speech signals to be implemented by processing only the narrowband component. Examples of systems that perform such split-band processing are described in commonly-owned U.S. Pat. Nos. 6,848,012, 6,928,495, 7,165,130, 7,283,585, 7,333,475 and 7,409,056 and commonly-owned U.S. patent application Ser. No. 11/672,120, the entireties of which are incorporated by reference herein.

In one implementation, the SIE processing described above is applied only to a narrowband component of a wideband speech signal. In an alternate implementation, the previously-described SIE processing is made applicable to wideband speech by also modifying the wideband component of a wideband speech signal. For example, in one implementation, the gain of filters used to modify the far-end speech signal by receive processing block 1102 at 3.4 kHz (or 4 kHz) are extended across the wideband component. In slowly evolving spectral shaping, a table of the gain for the wideband component may be utilized, wherein the gain is a function of the narrowband filter. In one implementation, for rapidly evolving spectral shaping, the gain of the filter at 4 kHz is unity, so that there is no need to modify the wideband component.

The foregoing concept may also be extended to other sets of signal components sampled at various sampling rates, such as 8 kHz/16 kHz/48 kHz or 8 kHz/48 kHz.

Figure 17:
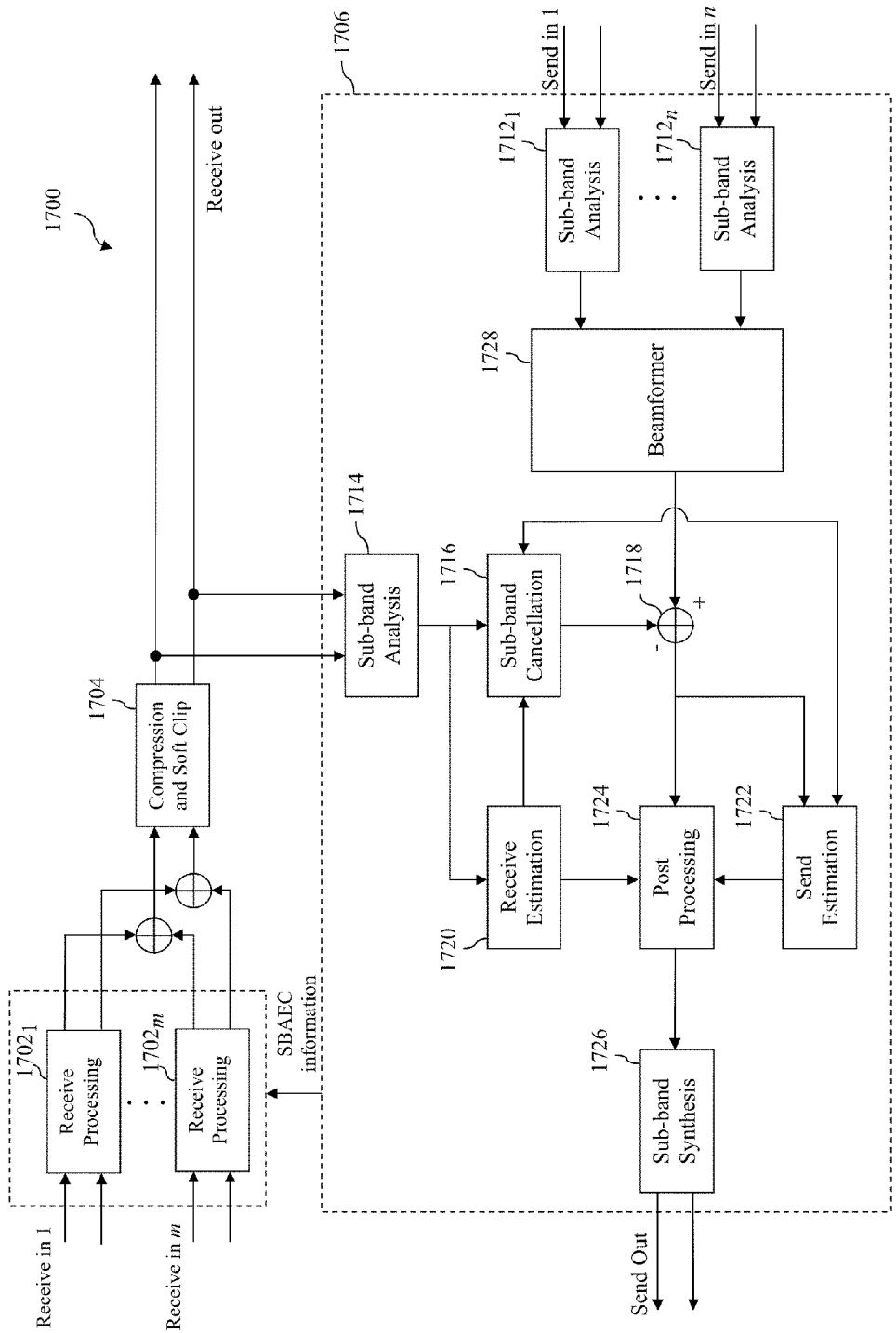
FIG. 17 is a block diagram that shows an alternate telephony terminal in which an SIE system is integrated with a sub-band acoustic canceller.

FIG. 17 is a block diagram that shows an alternate telephony terminal 1700 in which an SIE system is integrated with a sub-band acoustic canceller. Telephony terminal 1700 differs from telephony terminal 1600 in a variety of ways.

For example, telephony terminal 1700 is configured to receive a plurality of speech signals, denoted "Receive in" 1 through "Receive in" m, and to combine those signals to produce a single output speech signal denoted "Receive out." Each of the signals "Receive in" 1-$m$ may comprise, for example and without limitation, a different far-end speech signal in a multi-party conference call or a different audio channel in a multi-channel audio signal.

As shown in FIG. 17, each "Receive in" signal 1-$m$ is processed by a corresponding receive processing block $1702_1$-$1702_m$. Each receive processing block $1702_1$-$1702_m$ includes an SIE system, such as SIE system 700 described above in reference to FIG. 7 or SIE system 1400 described above in reference to FIG. 14, and operates to improve the intelligibility of a corresponding "Receive in" signal.

As further shown in FIG. 17, the output signals of receive processing blocks $1702_1$-$1702_m$ are combined prior to being received by a compression and soft clipping block 1704. By separately applying SIE to each "Receive in" signal prior to mixing, telephony terminal 1700 ensures that each "Receive in" signal is modified only to the extent necessary to achieve a desired intelligibility for that signal. In other words, by separately applying SIE to each "Receive in" signal, one "Receive in" signal need not be distorted to improve the intelligibility of another "Receive in" signal.

Compression and soft clipping logic 1704 is configured to apply amplitude compression and/or soft clipping to the signal produced by the combination of the outputs of receive processing blocks $1702_1$-$1702_m$. Such amplitude compression and/or soft clipping may be applied to ensure that the signal produced by the combination of the outputs of receive processing blocks $1702_1$-$1702_m$ does not exceed a digital saturation point or only exceeds the digital saturation point by a permissible amount. Note that in an alternate implementation, compression and soft clipping may be separately applied to each signal output from each of receive processing blocks $1702_1$-$1702_m$ and then further applied to the signal produced by the combination of those outputs.

As also shown in FIG. 17, telephony terminal 1700 includes a sub-band acoustic canceller 1706 that operates to cancel acoustic echo present in a near-end speech signal captured by telephony terminal 1700 for transmission to a far-end telephony terminal over a communication network. To capture the near-end speech signal, telephony terminal includes a plurality of microphones, each of which produces a different input speech signal. These input speech signals are denoted "Send in" 1 through "Send in" n. Each input speech signal "Send in" 1-$n$ is converted from a time domain signal into a plurality of frequency sub-band components by a corresponding sub-band analysis block $1712_1$-$1712_n$. The output from sub-band analysis blocks $1712_1$-$1712_n$ are provided to a beamformer 1728 which performs spatial filtering operations on the output to attenuate unwanted undesired audio content. The output of beamformer 1728 is then treated as the near-end speech signal.

The remaining components of sub-band acoustic echo canceller 1706 operate in essentially the same manner as like-named components described above in reference to telephony terminal 1600 of FIG. 16. However, to perform an estimation of the level of the noise in the near-end speech signal, send estimation block 1722 may be configured to account for the noise-reducing effect of beamformer 1728. In other words, the noise level estimate provided by send estimation block 1722 may be an estimate of the noise level at one of the multiple microphones.

Sub-band acoustic canceller 1706 provides certain information generated during the performance of echo cancellation and noise suppression operations to receive processing blocks $1702_1$-$1702_m$. Each of receive processing blocks $1702_1$-$1702_m$ then uses such information to perform SIE operations. The information provided may include, for example and without limitation, a measure of voice activity in the far-end speech signal, a measure of voice activity in the near-end speech signal, or an estimate of the noise level present in the far-end speech signal.

In the implementation described above in reference to FIG. 17, a plurality of received speech signals "Receive in" 1-$m$ are combined to produce a single "Receive out" speech signal. However, persons skilled in the relevant art(s) will readily appreciate that other systems may be implemented in which one or more received speech signals are processed to produce a plurality of "Receive out" speech signals 1-$n$. For example, in a stereo headset or a stereo Voice over IP Protocol (VoIP) telephone, one or more received speech signals may be processed to produce two channels of output audio. Depending upon the specific implementation, receive processing and/or compression/soft-clipping may be performed on each received speech signal as well as upon combinations of such received speech signals to produce the desired output signals.

F. Example SIE Methods

Example methods for processing a speech signal for playback by an audio device in a manner that enhances the intelligibility thereof will now be described in reference to flowcharts depicted in FIGS. 18-23.

Figure 18:
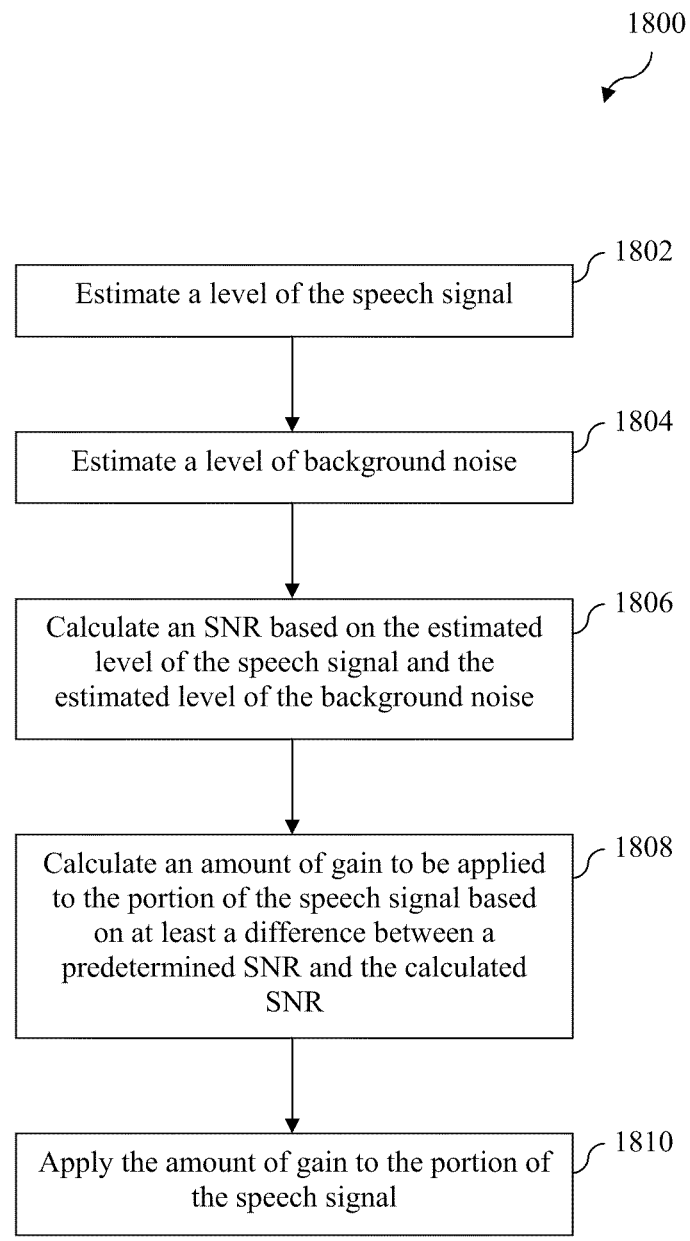
FIGS. 18-23 depict flowcharts of various methods for processing a portion of a speech signal to be played back by an audio device in a manner that enhances the intelligibility thereof.

In particular, FIG. 18 depicts a flowchart 1800 of a method for processing a portion of a speech signal to be played back by an audio device in a manner that enhances the intelligibility thereof. As shown in FIG. 18, the method of flowchart 1800 begins at step 1802 in which a level of the speech signal is estimated. At step 1804, a level of background noise is estimated. At step 1806, a signal-to-noise ratio (SNR) is calculated based on the estimated level of the speech signal and the estimated level of the background noise. At step 1808, an amount of gain to be applied to the portion of the speech signal is calculated based on at least a difference between a predetermined SNR and the calculated SNR. At step 1810, the amount of gain is applied to the portion of the speech signal.

In one implementation, performing step 1806 comprises calculating an automatic gain control (AGC) gain required to bring the estimated level of the speech signal to a predefined nominal level and then calculating the SNR based on the estimated level of the speech signal after application of the AGC gain thereto and the estimated level of the background noise. For example, as described elsewhere herein, this step may comprise calculating:

$$R2Snoise = \text{default\_volume} + G_{AGC} + L_R + C - L_{Snoise},$$

wherein R2Snoise is the calculated SNR, default_volume is a constant representing a default volume, $G_{AGC}$ is the AGC gain, $L_R$ is the estimated level of the speech signal, $L_{Snoise}$ is the estimated level of the background noise and C is a calibration term.

In one implementation, performing step 1808 comprises performing a number of steps. These steps include calculating a target gain as the difference between the predetermined SNR and the calculated SNR. Then, an actual gain is compared to the target gain, wherein the actual gain represents an amount of gain that was applied to a previously-received portion of the speech signal. If the target gain exceeds the actual gain by at least a fixed amount, then the amount of gain to be applied to the portion of the speech signal is calculated by adding the fixed amount of gain to the actual gain. However, if the target gain is less than the actual gain by at least the fixed amount, then the amount of gain to be applied to the portion of the speech signal is calculated by subtracting the fixed amount of gain from the actual gain.

In another implementation, performing step 1808 comprises summing at least a user volume of the audio device, an amount of gain determined based on the difference between the predetermined SNR and the calculated SNR, and an amount of gain required to bring the estimated level of the speech signal to a predefined nominal level.

In a further implementation, performing step 1808 comprises first calculating a desired gain to be applied to the portion of the speech signal based on at least the difference between the predetermined SNR and the calculated SNR. Then, a determination is made as to whether the application of the desired gain to the portion of the speech signal would cause a reference amplitude associated with the portion of the speech signal to exceed a predetermined amplitude limit. If it is determined that the application of the desired gain to the portion of the speech signal would cause the reference amplitude to exceed the predetermined amplitude limit, then an amount of gain to be applied to the portion of the speech signal is calculated that is less than the desired gain. For example, as described elsewhere herein, calculating an amount of gain to be applied to the portion of the speech signal that is less than the desired gain may comprise calculating $$G_{final} = \min[G_{desired}, G_{headroom}],$$

wherein $G_{final}$ is the amount of gain to be applied to the portion of the speech signal, $G_{desired}$ is the desired gain and $G_{headroom}$ is an estimate of the difference between the reference amplitude associated with the portion of the speech signal and the predetermined amplitude limit.

In further accordance with this implementation, a difference may be calculated between the desired gain and the amount of gain to be applied to the portion of the speech signal. Spectral shaping may then be applied to at least one subsequently-received portion of the speech signal, wherein the degree of spectral shaping applied is based at least in part on the difference. Alternatively or additionally, dispersion filtering may be performed on at least one subsequently-received portion of the speech signal, wherein the degree of dispersion applied by the dispersion filtering is based at least in part on the difference.

Figure 19:
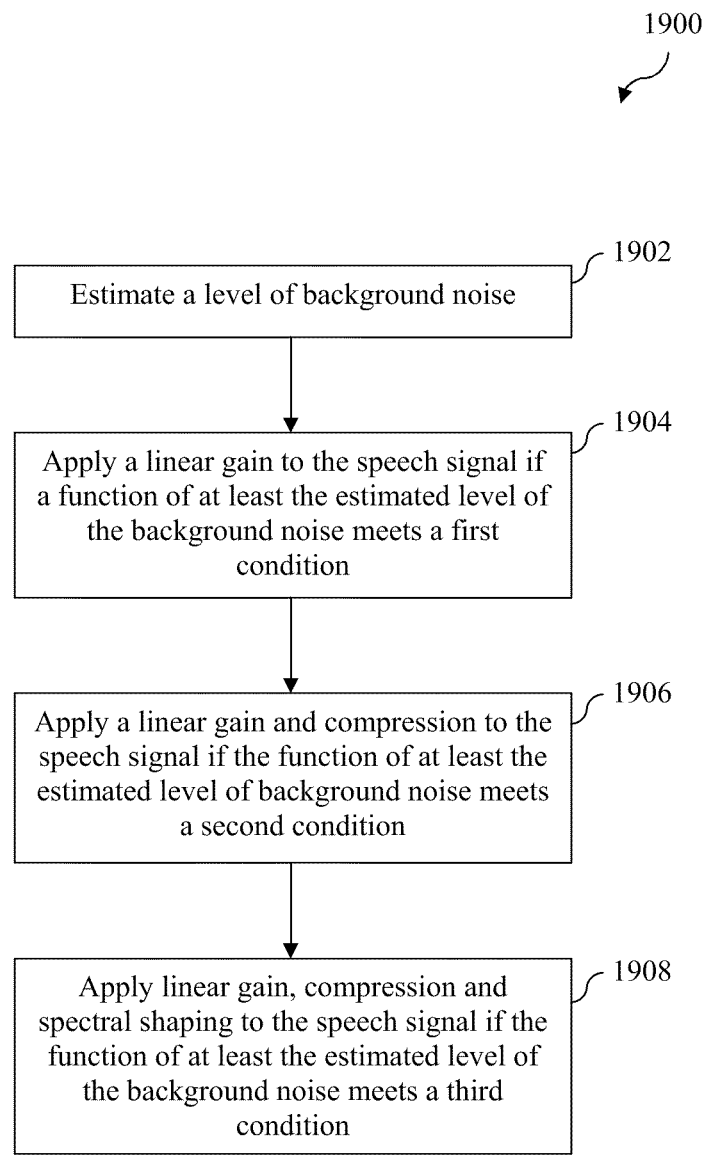

FIG. 19 depicts a flowchart 1900 of a method for processing a speech signal to be played back by an audio device in a manner that enhances the intelligibility thereof. As shown in FIG. 19, the method of flowchart 1900 begins at step 1902, in which a level of background noise is estimated. At step 1904, a linear gain is applied to the speech signal if a function of at least the estimated level of background noise meets a first condition. At step 1906, a linear gain and compression are applied to the speech signal if the function of at least the estimated level of the background noise meets a second condition. At step 1908, a linear gain, compression and spectral shaping are applied to the speech signal if the function of at least the estimated level of background noise meets a third condition.

In one implementation, each of the first, second and third conditions is indicative of a need for a corresponding first, second and third degree of speech intelligibility enhancement, wherein the second degree is greater than the first degree and the third degree is greater than the second degree. The function based on at least the estimated level of background noise may comprise, for example, a signal-to-noise ratio (SNR) that is calculated based on an estimated level of the speech signal and the estimated level of the background noise.

Although it is not shown in FIG. 19, the method of flowchart 1900 may also include applying a linear, gain, compression and dispersion filtering to the speech signal if at least the estimated level of background noise meets a fourth condition.

Figure 20:
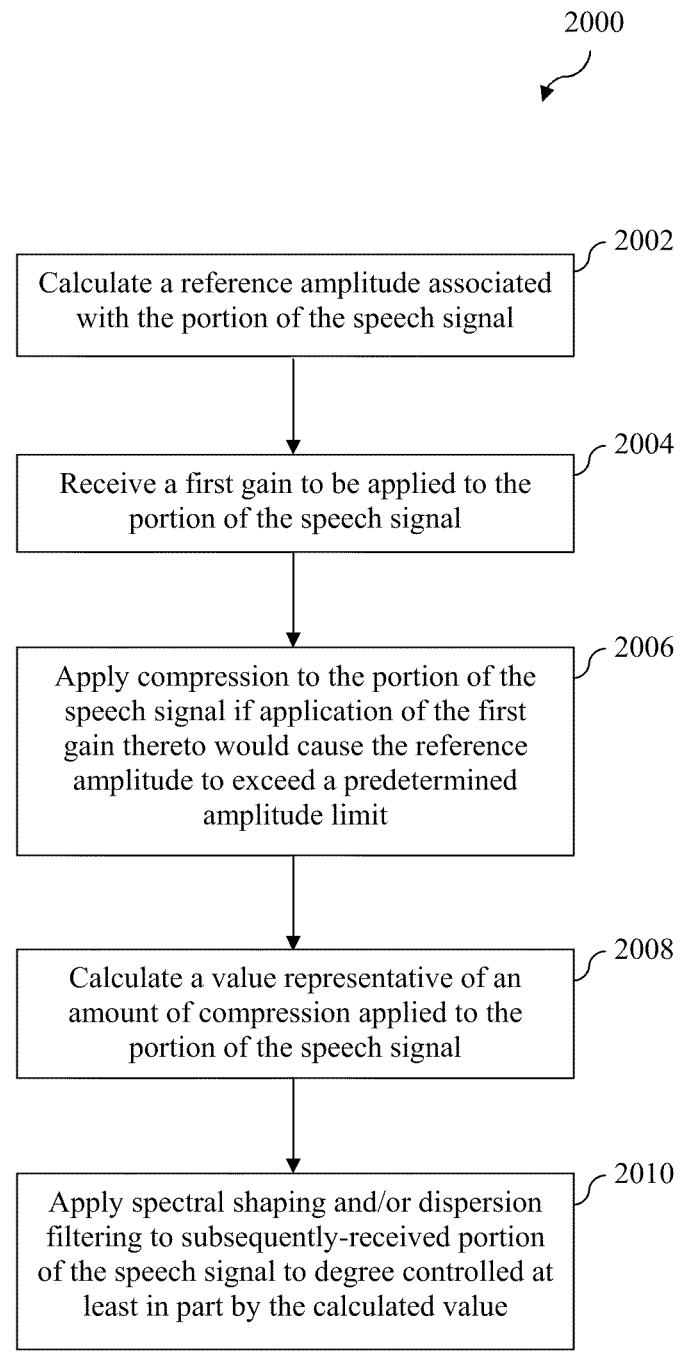

FIG. 20 depicts a flowchart 2000 of another method for processing a portion of a speech signal to be played back by an audio device in a manner that enhances the intelligibility thereof. As shown in FIG. 20, the method of flowchart 2000 begins at step 2002, in which a reference amplitude associated with the portion of the speech signal is calculated. In one implementation, calculating the reference amplitude comprises determining a maximum absolute amplitude of the portion of the speech signal. In another implementation, calculating the reference amplitude comprises determining a maximum absolute amplitude of a segment of the speech signal that includes the portion of the speech signal and one or more previously-processed portions of the speech signal. In a further implementation, calculating the reference amplitude comprises setting the reference amplitude equal to the greater of a maximum absolute amplitude associated with the portion of the speech signal and a product of a reference amplitude associated with a previously-processed portion of the speech signal and a decay factor.

At step 2004, a first gain to be applied to the portion of the speech signal is received.

At step 2006, compression is applied to the portion of the speech signal if the application of the first gain to the portion of the speech signal would cause the reference amplitude associated with the portion of the speech signal to exceed a predetermined amplitude limit. In one implementation, the predetermined amplitude limit comprises a maximum digital amplitude that can be used to represent the speech signal. In an alternate implementation, the predetermined amplitude limit comprises an amplitude that is a predetermined number of decibels above or below a maximum digital amplitude that can be used to represent the speech signal.

The method of flowchart 2000 may further include adaptively calculating the predetermined amplitude limit. In one implementation, adaptively calculating the predetermined amplitude limit comprises adaptively calculating the predetermined amplitude limit based at least on a user-selected volume.

Depending upon the implementation, the application of compression in step 2006 may include applying a second gain to the portion of the speech signal that is less than the first gain, wherein the second gain is calculated as an amount of gain required to bring the reference amplitude associated with the portion of the speech signal to the predetermined amplitude limit. As described previously herein, calculating the second gain may comprise calculating:

$$G_{headroom} = 20 \cdot \log_{10}\left(\frac{MAXAMPL}{mx(k)}\right) - G_{margin} - C_p$$

wherein $G_{headroom}$ is the second gain, MAXAMPL is a maximum digital amplitude that can be used to represent the speech signal, $mx(k)$ is the reference amplitude associated with the portion of the speech signal, $G_{margin}$ is a predefined margin and $C_p$ is a predetermined number of decibels.

At step 2008, a value representative of an amount of compression applied to the portion of the speech signal during step 2006 is calculated. In one implementation, calculating this value comprises calculating an instantaneous volume loss by determining a difference between the first gain and the second gain described in the previous paragraph and then calculating an average version of the instantaneous volume loss.

At step 2010, spectral shaping and/or dispersion filtering is applied to at least one subsequently-received portion of the speech signal wherein the degree of spectral shaping and/or dispersion filtering applied is controlled at least in part by the value calculated during step 2008.

Figure 21:
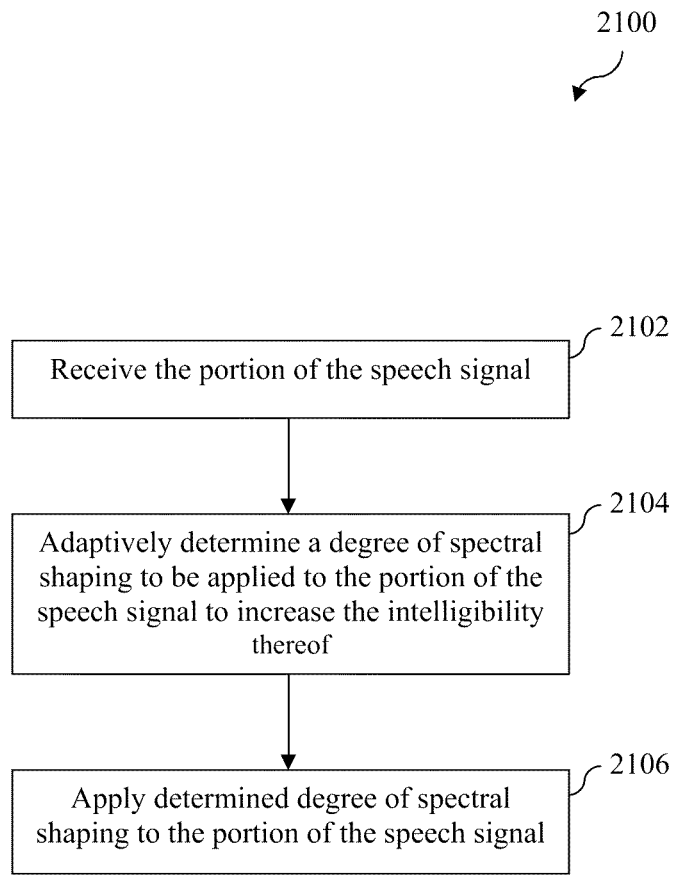

FIG. 21 depicts a flowchart 2100 of another method for processing a portion of a speech signal to be played back by an audio device in a manner that enhances the intelligibility thereof. As shown in FIG. 21, the method of flowchart 2100 begins at step 2102, at which a portion of the speech signal is received.

At step 2104, a degree of spectral shaping to be applied to the portion of the speech signal to increase the intelligibility thereof is adaptively determined. Various methods may be used to adaptively determine the degree of spectral shaping to be applied. For example, a degree of compression that was or is estimated to be applied to the speech signal may be determined and the degree of spectral shaping to be applied may be determined as a function of at least the degree of compression.

As another example, a level of the speech signal may be calculated and the degree of spectral shaping to be applied may be determined as a function of at least the level of the speech signal.

As still another example, a level of one or more sub-band components of the speech signal may be calculated and the degree of spectral shaping to be applied may be determined as a function of at least the level(s) of the sub-band component(s).

As a further example, a level of background noise may be estimated and the degree of spectral shaping to be applied may be determined as a function of at least the level of the background noise. Estimating the level of the background noise may comprise estimating a level of one or more sub-band components of the background noise and determining the degree of spectral shaping to be applied as a function of at least the estimated level of the background noise may comprise determining the degree of spectral shaping as a function of at least the level(s) of the sub-band component(s).

As a still further example, a spectral shape of the background noise may be determined and the degree of spectral shaping to be applied may be determined as a function of at least the spectral shape of the background noise.

At step 2106, the determined degree of spectral shaping is applied to the portion of the speech signal. Applying the determined degree of spectral shaping to the portion of the speech signal may comprise amplifying at least one selected formant associated with the portion of the speech signal relative to at least one other formant associated with the portion of the speech signal. For example, applying the determined degree of spectral shaping to the portion of the speech signal may comprise amplifying a second and third formant associated with the portion of the speech signal relative to a first formant associated with the portion of the speech signal.

In one implementation, applying the determined degree of spectral shaping to the portion of the speech signal comprises performing time-domain filtering on the portion of the speech signal using an adaptive high-pass filter.

Performing time-domain filtering on the portion of the speech signal using an adaptive high-pass filter may comprise performing time-domain filtering on the portion of the speech signal using a first adaptive spectral shaping filter and a second adaptive spectral shaping filter, wherein the second adaptive spectral shaping filter is configured to adapt more rapidly than the first adaptive spectral shaping filter. For example, the first adaptive spectral shaping filter may have the form $$x(n)=r_{in}(n)-b \cdot r_{in}(n-1)$$

wherein $x(n)$ is the output of the first adaptive spectral shaping filter, $r_{in}(n)$ is the input to the first adaptive spectral shaping filter, and b is a filter coefficient that increases as a degree of compression that was or is estimated to be applied to the speech signal increases. In further accordance with this example, the second adaptive spectral shaping filter may have the form:

$$y(n)=x(n)-c \cdot x(n-2)-c \cdot y(n-1)$$

wherein $y(n)$ is the output of the second adaptive spectral shaping filter, $x(n)$ is the input to the second adaptive spectral shaping filter and c is a control parameter. The control parameter c may be calculated based upon a degree of compression that was or is estimated to be applied to the speech signal. The control parameter c may also be calculated based upon a measure of a slope of a spectral envelope of the speech signal.

Alternatively, performing time-domain filtering on the portion of the speech signal using an adaptive high-pass filter may comprise using only the first adaptive spectral shaping filter described above or using only the second adaptive spectral shaping filter described above.

Figure 22:
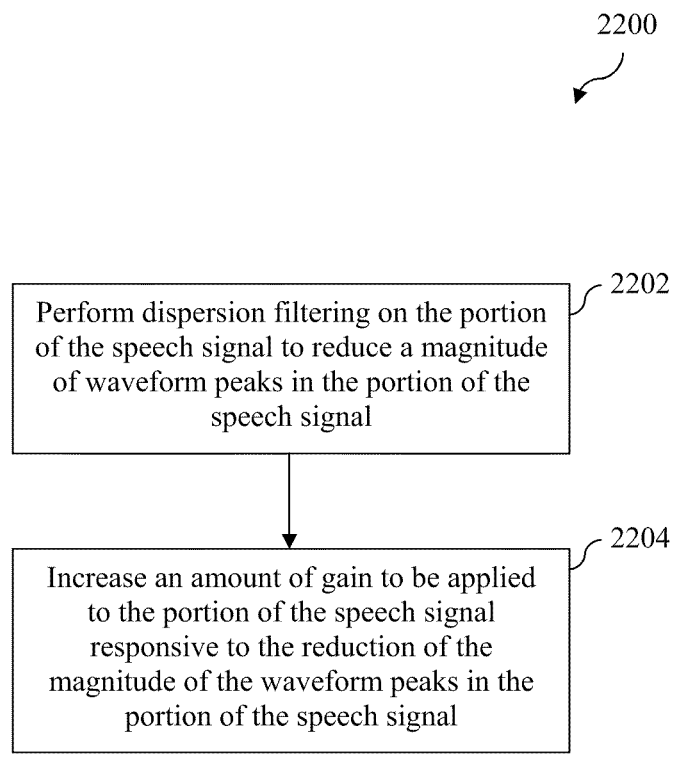

FIG. 22 depicts a flowchart 2200 of another method for processing a portion of a speech signal to be played back by an audio device in a manner that enhances the intelligibility thereof. As shown in FIG. 22, the method of flowchart 2200 begins at step 2202 in which dispersion filtering is performed on the portion of the speech signal to reduce a magnitude of waveform peaks in the portion of the speech signal. At step 2204, an amount of gain to be applied to the portion of the speech signal is increased responsive to the reduction of the magnitude of the waveform peaks in the portion of the speech signal.

In one implementation, performing dispersion filtering on the portion of the speech signal as described in reference to step 2202 comprises reducing a peak-to-average ratio associated with the portion of the speech signal. Reducing a peak-to-average ratio associated with the portion of the speech signal may comprise, for example, reducing a peak-to-RMS ratio associated with the portion of the speech signal.

Performing dispersion filtering on the portion of the speech signal as described in reference to step 2202 may also comprise passing the portion of the speech signal through a fixed all-pass filter. The fixed all-pass filter may comprise, for example, a fixed sixth-order all-pass filter.

Alternatively, performing dispersion filtering on the portion of the speech signal as described in reference to step 2202 may comprise passing the portion of the speech signal through an adaptive all-pass filter. In accordance with such an implementation, poles and zeros of the adaptive all-pass filter may be adapted based on local characteristics of the speech signal. For example, radii of the poles of the adaptive all-pass filter may be decreased during silence regions of the speech signal and increased during vowel regions of the speech signal. As another example, pole frequencies of the adaptive all-pass filter may be set to pole frequencies of a fixed all-pass filter during an initial portion of a voiced region of the speech signal and then the pole frequencies may be adapted during subsequent portions of the speech signal by tracking changes in the speech signal. Tracking changes in the speech signal may include estimating formant frequencies of the speech signal and guiding the adaptation of the pole frequencies of the all-pass filter based on the estimated formant frequencies. Tracking changes in the speech signal may also include performing a closed-loop pole frequency search to determine optimal pole frequencies and then guiding the adaptation of the pole frequencies of the all-pass filter based on the optimal pole frequencies. Performing the closed-loop pole frequency search to determine the optimal pole frequencies may comprise limiting the closed-loop pole frequency search to predefined search ranges around optimal pole frequencies associated with a previously-processed portion of the speech signal.

In another implementation in which performing dispersion filtering on the portion of the speech signal comprises passing the portion of the speech signal through an adaptive all-pass filter, the adaptive all-pass filter may be adapted based on a value representative of an amount of compression applied to one or more previously-processed portions of the speech signal. Adapting the filter in this manner may include calculating a scaling factor based on the value representative of the amount of compression, wherein the scaling factor increases as the value increases, and then applying the scaling factor to radii of poles of the adaptive all-pass filter.

In a further implementation, performing dispersion filtering on the portion of the speech signal as described in reference to step 2202 comprises passing the portion of the speech signal through an all-pass filter comprises selecting one of a collection of N all-pass filter candidates.

Figure 23:
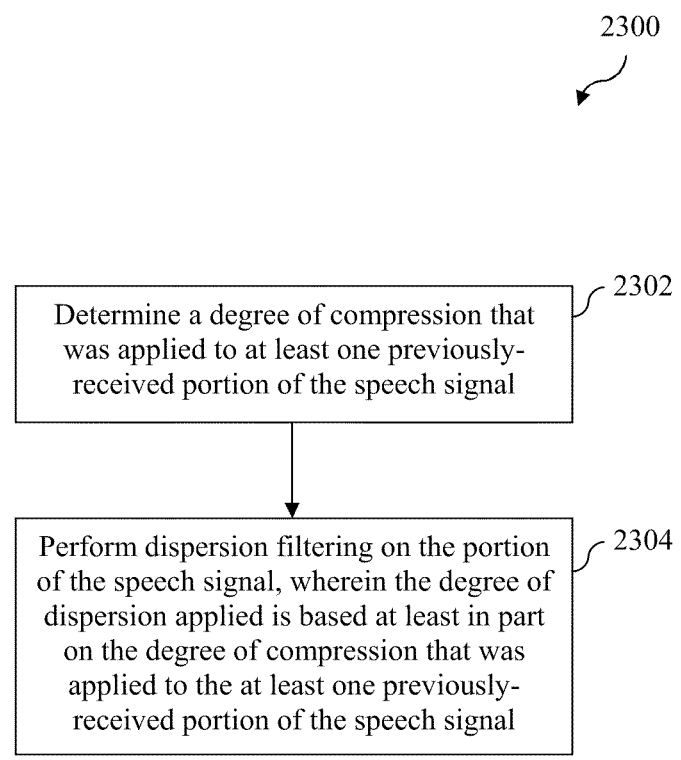

FIG. 23 depicts a flowchart 2300 of another method for processing a portion of a speech signal to be played back by an audio device in a manner that enhances the intelligibility thereof. As shown in FIG. 23, the method of flowchart 2300 starts at step 2302 in which a degree of compression that was applied to at least one previously-received portion of the speech signal is determined. At step 2304, dispersion filtering is performed on the portion of the speech signal, wherein the degree of dispersion applied by the dispersion filtering is based at least in part on the degree of compression that was applied to the at least one previously-received portion of the speech signal. Performing dispersion filtering in step 2304 may comprise, for example, passing the portion of the speech signal through an adaptive all-pass filter. The adaptive all-pass filter may be adapted based on a value representative of the degree of compression that was applied to the at least one previously-received portion of the speech signal. Adapting the filter in this manner may include calculating a scaling factor based on the value representative of the amount of compression, wherein the scaling factor increases as the value increases, and then applying the scaling factor to radii of poles of the adaptive all-pass filter.

Figure 24:
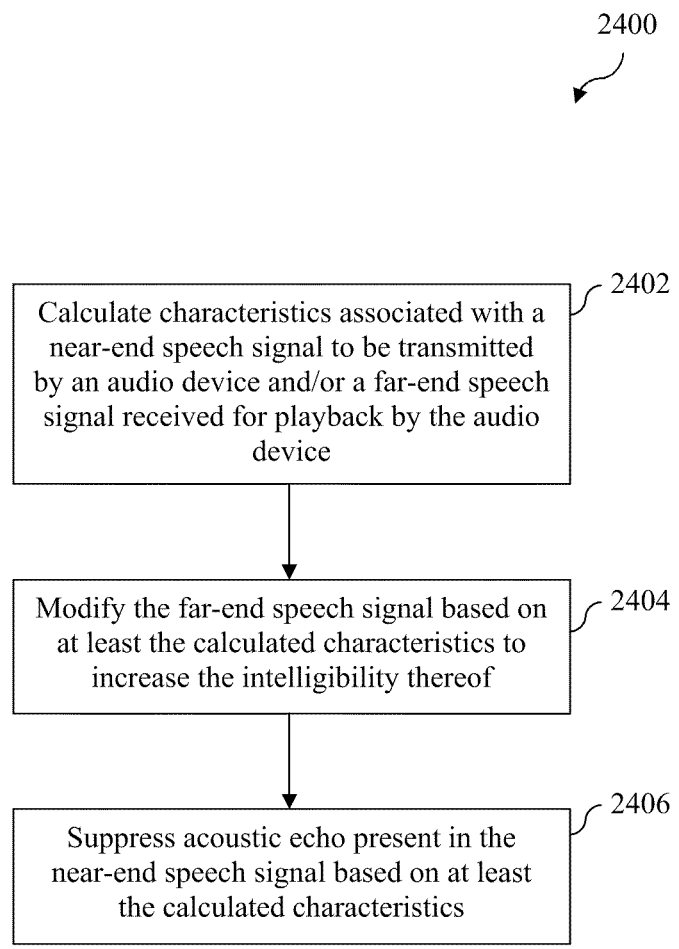
FIG. 24 depicts a flowchart of a method for operating an integrated speech intelligibility enhancement system and acoustic echo canceller.

FIG. 24 depicts a flowchart 2400 of a method for operating an integrated speech intelligibility enhancement system and acoustic echo canceller. As shown in FIG. 24, the method of flowchart 2400 begins at step 2402 in which characteristics associated with a near-end speech signal to be transmitted by an audio device and/or a far-end speech signal received for playback by the audio device are calculated. Calculating the characteristics may include, for example, calculating an estimated level of background noise associated with the near-end speech signal. Calculating the estimated level of background noise associated with the near-end speech signal may include calculating an estimated level of background noise corresponding to each of a plurality of sub-band components of the near-end speech signal. Alternatively, calculating the estimated level of background noise associated with the near-end speech signal may comprise calculating a measure of loudness by applying a weight to one or more estimated levels of background noise corresponding to one or more sub-band components of the near-end speech signal.

At step 2404, the far-end speech signal is modified based on at least the calculated characteristics to increase the intelligibility thereof. In an implementation in which the calculated characteristics comprise one or more estimated levels of background noise corresponding to one or more sub-band components of the near-end speech signal, this step may comprise performing spectral shaping on the far-end speech signal based on one or more of the estimated levels of background noise corresponding to one or more of the sub-band components.

At step 2406, acoustic echo present in the near-end speech signal is suppressed based on at least the calculated characteristics.

In one implementation of the method of flowchart 2400, calculating characteristics in step 2402 comprises determining whether voice activity is present in the far-end speech signal and modifying the far-end speech signal in step 2404 comprises controlling the operation of a level estimator based on the determination, wherein the level estimator calculates an estimated signal level associated with the far-end speech signal, and applying a gain to the far-end speech signal wherein the amount of gain applied is based on the estimated signal level. Determining whether voice activity is present in the far-end speech signal may comprise analyzing one or more sub-band components of the far-end speech signal.

In another implementation of the method of flowchart 2400, calculating characteristics in step 2402 comprises determining whether voice activity is present in the near-end speech signal and modifying the far-end speech signal in step 2404 comprises controlling the operation of a level estimator based on the determination, wherein the level estimator calculates an estimated signal level associated with the far-end speech signal, and applying a gain to the far-end speech signal wherein the amount of gain applied is based on the estimated signal level. Determining whether voice activity is present in the near-end speech signal may comprise analyzing one or more sub-band components of the near-end speech signal.

In a further implementation of the method of flowchart 2400, calculating characteristics in step 2402 comprises calculating the estimated level of background noise at one or more microphones in a plurality of microphones associated with the audio device. Calculating the estimated level of background noise at one or more microphones in the plurality of microphones associated with the audio device may comprise modifying an estimated level of background noise associated with the near-end speech signal to account for a noise changing effect produced by a beamformer coupled to the plurality of microphones.

Figure 25:
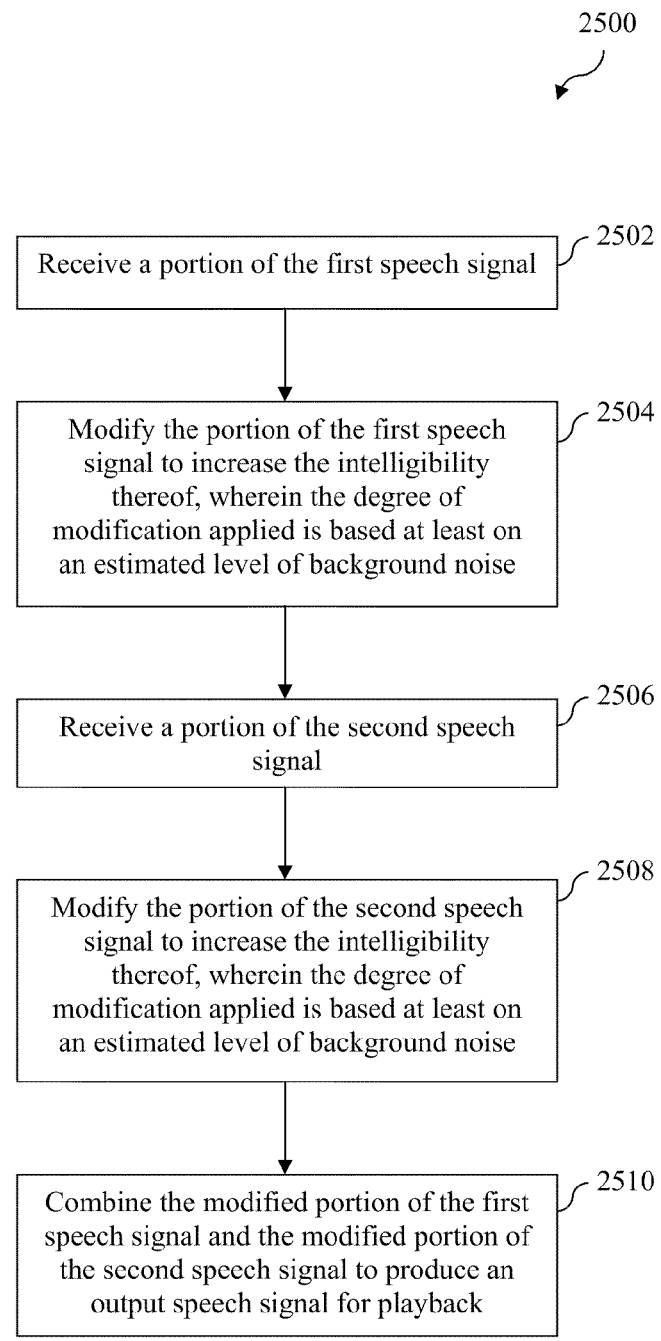
FIG. 25 depicts a flowchart of a method for processing first and second speech signals to produce an output speech signal for playback in a manner that enhances the intelligibility of the output speech signal.

FIG. 25 depicts a flowchart 2500 of a method for processing first and second speech signals to produce an output speech signal for playback in a manner that enhances the intelligibility of the output speech signal. As shown in FIG. 25, the method of flowchart 2500 begins at step 2502 in which a portion of the first speech signal is received.

At step 2504, the portion of the first speech signal is modified to increase the intelligibility thereof, wherein the degree of modification applied to the portion of the first speech signal is based at least on an estimated level of background noise.

At step 2506, a portion of the second speech signal is received.

At step 2508, the portion of the second speech signal is modified to increase the intelligibility thereof, wherein the degree of modification applied to the portion of the second speech signal is based at least on an estimated level of background noise.

At step 2510, the modified portion of the first speech signal and the modified portion of the second speech signal to produce an output speech signal for playback.

The foregoing method of flowchart 2500 may further include applying amplitude compression to the output speech signal and/or applying soft clipping to the output speech signal. In the foregoing method of flowchart 2500, step 2504 may include applying compression to the portion of the first speech signal to produce the modified portion of the first speech signal and/or applying soft clipping to the portion of the first speech signal to produce the modified portion of the first speech signal. Likewise, step 2508 may include applying compression to the portion of the second speech signal to produce the modified portion of the second speech signal and/or applying soft clipping to the portion of the second speech signal to produce the modified portion of the second speech signal.

Figure 26:
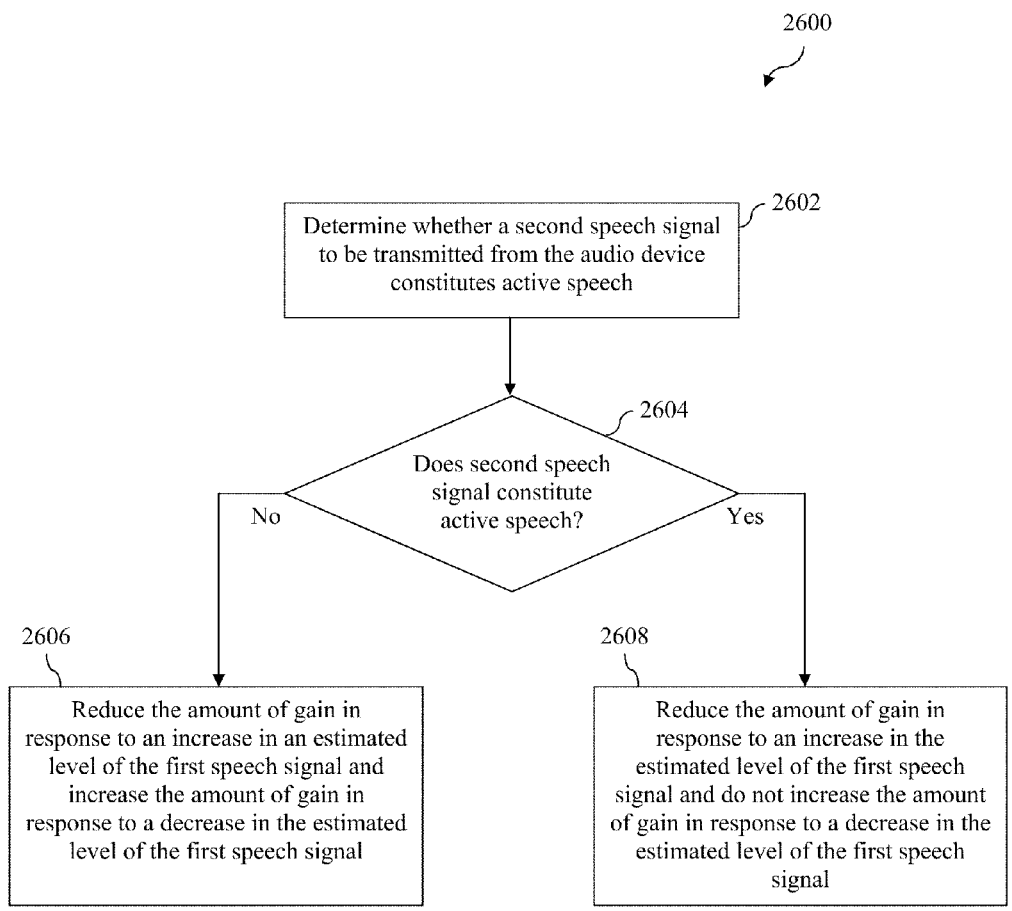
FIG. 26 depicts a flowchart of a method for updating an amount of gain to be applied to a first speech signal received for playback by an audio device.

FIG. 26 depicts a flowchart 2600 of a method for updating an amount of gain to be applied to a first speech signal received for playback by an audio device. As shown in FIG. 26, the method of flowchart 2600 begins at step 2602 in which it is determined whether a second speech signal to be transmitted from the audio device constitutes active speech. The results of the determination are analyzed during decision step 2604.

If it is determined during decision step 2604 that the second speech signal does not constitute active speech, then the amount of gain is reduced in response to an increase in an estimated level of the first speech signal and the amount of gain is increased in response to a decrease in the estimated level of the first speech signal as shown at step 2606. However, if it is determined during decision step 2604 that the second speech signal does constitute active speech, then the amount of gain is reduced in response to an increase in the estimated level of the first speech signal and the amount of gain is not increased in response to a decrease in the estimated level of the first speech signal as shown at step 2608.

The method of flowchart 2600 may further include updating the estimated level of the first speech signal. Updating the estimated level of the first speech signal may include calculating a short-term estimate of the level of the first speech signal based on a received portion of the first speech signal and then updating a long-term estimate of the level of the first speech signal based on the short-term estimate. In accordance with such an implementation, performing step 2608 of flowchart 2600 may comprise not decreasing the long-term estimate of the level of the first speech signal responsive to a decrease in the short-term estimate of the level of the first speech signal.

The method of flowchart 2600 may further include determining whether the first speech signal constitutes a tone and performing step 2608 responsive also to determining that the first speech signal constitutes a tone. The method of flowchart 2600 may still further include determining whether the first speech signal constitutes a stationary signal and performing step 2608 responsive also to determining that the first speech signal constitutes a stationary signal.

G. Example Waveforms Generated by SIE System and Method

Figure 27:
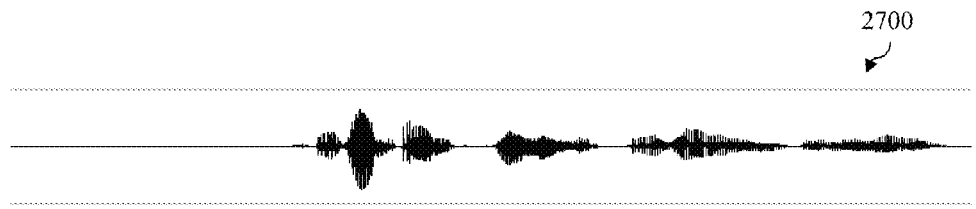
FIG. 27 depicts a waveform plot of an exemplary far-end speech signal that may be processed by an SIE system.

FIG. 27 depicts a waveform plot 2700 of an exemplary far-end speech signal that may be processed by SIE system 700 as described above in reference to FIG. 7. For example, the far-end speech signal shown in plot 2700 may be the "Receive-in" signal that is received by spectral shaping block 702 in SIE system 700. In further accordance with this example, FIGS. 28, 29 and 30 depict waveform plots of corresponding output speech signals that may be produced by SIE system 700 responsive to processing the far-end speech signal shown in plot 2700 at different levels of ambient background noise.

Figure 28:
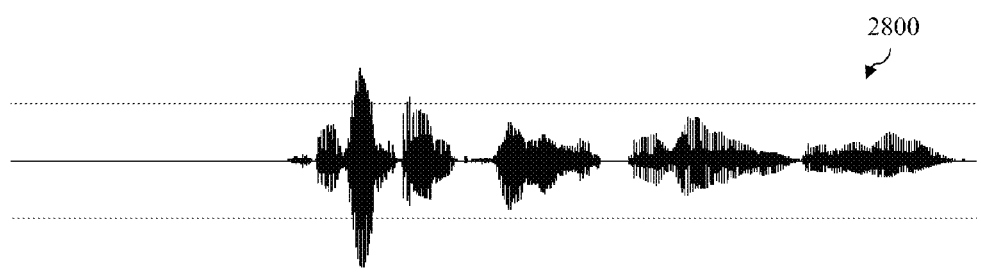
FIG. 28 depicts a waveform plot of a first output speech signal produced by an SIE system.

In particular, FIG. 28 depicts a waveform plot 2800 of a corresponding output speech signal produced by SIE system 700 when the level of ambient background noise is sufficient to trigger the application of AVB (i.e., when the level of ambient background noise is such that the far-end speech signal to near-end background noise ratio is less than the target minimum SNR even after the application of AGC) but is not sufficient to trigger amplitude compression. As shown in waveform plot 2800, a pure linear gain has been applied to the far-end speech signal, thus resulting in a waveform having increased amplitude and loudness.

Figure 29:
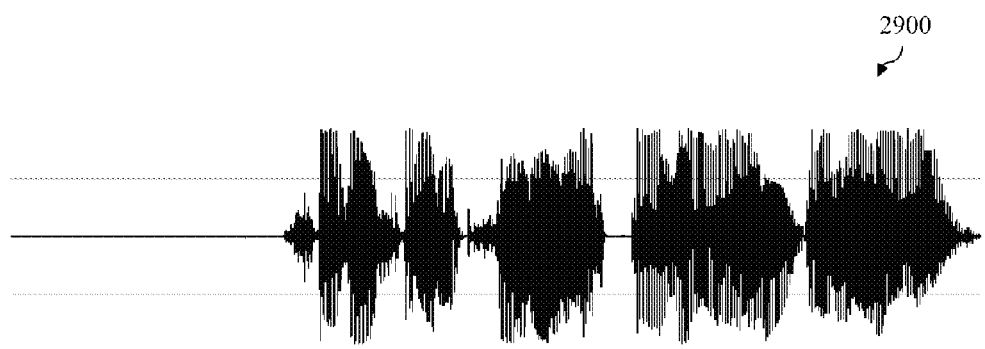
FIG. 29 depicts a waveform plot of a second output speech signal produced by an SIE system.

FIG. 29 depicts a waveform plot 2900 of a corresponding output speech signal produced by SIE system 700 when the ambient background noise has increased to a level such that amplitude compression is applied to the far-end speech signal. Amplitude compression is used to allow for application of the full AVB gain necessary to reach the target SNR without digital saturation or clipping. As shown in plot 2900, to accommodate the application of an increased AVB gain, the high-amplitude regions of the far-end speech signal have been compressed relative to the low-amplitude regions.

Figure 30:
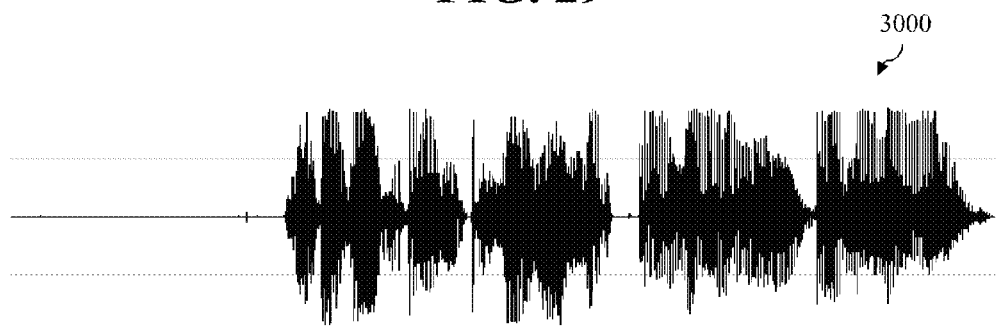
FIG. 30 depicts a waveform plot of a third output speech signal produced by an SIE system.

FIG. 30 depicts a waveform plot 3000 of a corresponding output speech signal produced by SIE system 700 when the amount of amplitude compression applied due to background noise has increased to such a level that spectral shaping is applied to the far-end speech signal to preserve intelligibility. Spectral shaping operates to boost certain formants of the spectral envelope of the far-end speech signal above the near-end noise floor to make the far-end speech signal more intelligible. In one implementation, the second and third formants of the far-end speech signal are boosted relative to the first formant since the second and third formants are more important from the perspective of speech intelligibility than the first formant.

Figure 31:
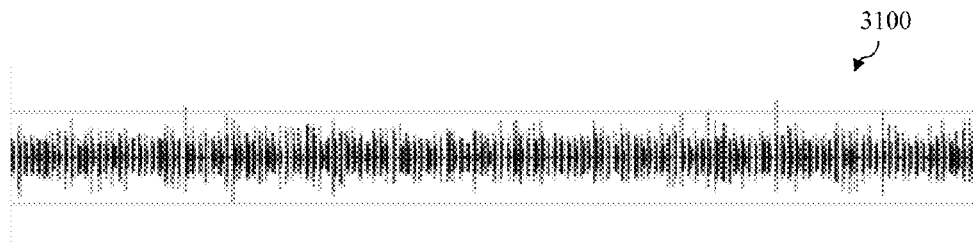
FIG. 31 is a waveform plot of an exemplary far-end speech signal that may be processed by an SIE system.
Figure 32:
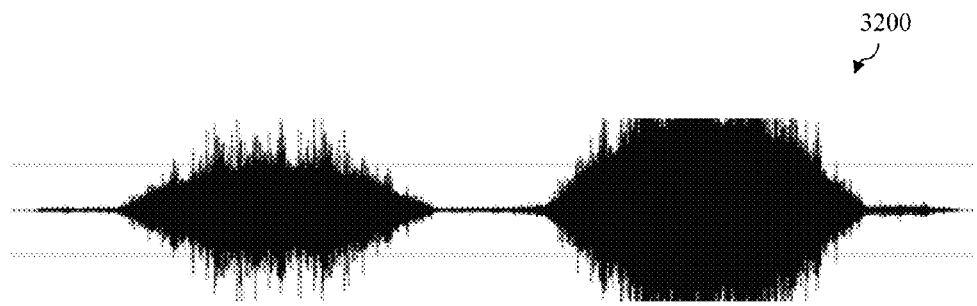
FIG. 32 is a waveform plot of exemplary ambient background noise present in an environment in which a telephony device that includes an SIE system.
Figure 33:
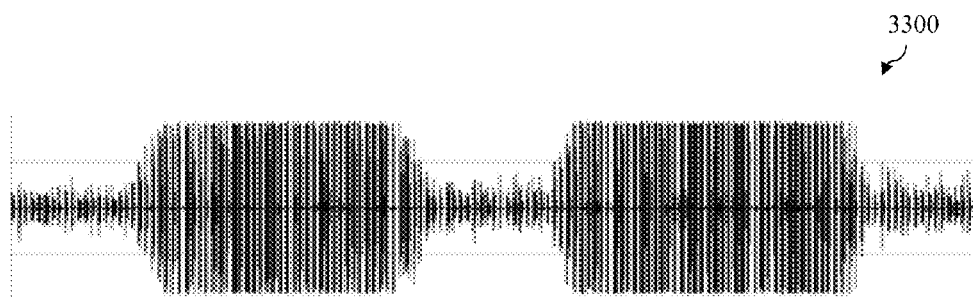
FIG. 33 is a waveform plot of an output speech signal produced by an SIE system responsive to processing the far-end speech signal depicted in the waveform plot of FIG. 31 and the near-end background noise depicted in the waveform plot of FIG. 32.

A further example of the operation of SIE system 700 will now be described in reference to waveform plots shown in FIGS. 31-35. In particular, FIG. 31 is a waveform plot 3100 of an exemplary far-end speech signal that may be received over a communication network and processed by SIE system 700. FIG. 32 is a waveform plot 3200 of exemplary ambient background noise present in the environment in which the telephony terminal that includes SIE system 700 is being used. FIG. 33 is a waveform plot 3300 of an output speech signal produced by SIE system 700 responsive to processing the far-end speech signal depicted in plot 3100 of FIG. 31 and the near-end background noise depicted in plot 3200 of FIG. 32. As shown in plot 3300, SIE system 700 has boosted the portions of the far-end speech signal that coincide in time with the near-end background noise with the intent to achieve a minimum target far-end speech signal to near-end background noise ratio.

Figure 34:
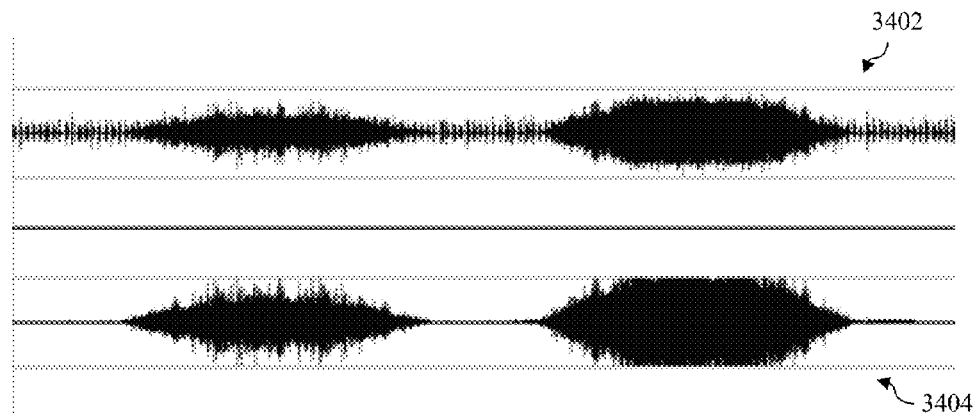
FIG. 34 depicts waveform plots of audio content presented to the right and left ear of a user to simulate and illustrate the effect of a telephony device that does not include an SIE system.

Assume that a user is using a telephony device that does not include SIE system 700 to play back the far-end speech signal plotted in FIG. 31 in the context of the ambient background noise plotted in FIG. 32. Further assume that the telephony device includes a single loudspeaker that is housed in an ear bud which is inserted in the left ear of the user. In accordance with this example, FIG. 34 depicts a first waveform plot 3402 that represents the audio content presented to the left ear of the user and a second waveform plot 3404 that represents the audio content presented to the right ear of the user. As shown in FIG. 34, the right ear of the user is presented with only the ambient background noise while the left ear of the user is presented with the far-end speech signal plus the ambient background noise in order to simulate and illustrate the experience of a user in a noisy environment with a telephony device on the left ear. In this example, much of the far-end speech will be unintelligible to the user due to the relative magnitude of the ambient background noise. It is noted that due to a seal between the ear bud and the left ear of the user, the magnitude of the ambient background noise presented to the left ear is less than that presented to the right.

Figure 35:
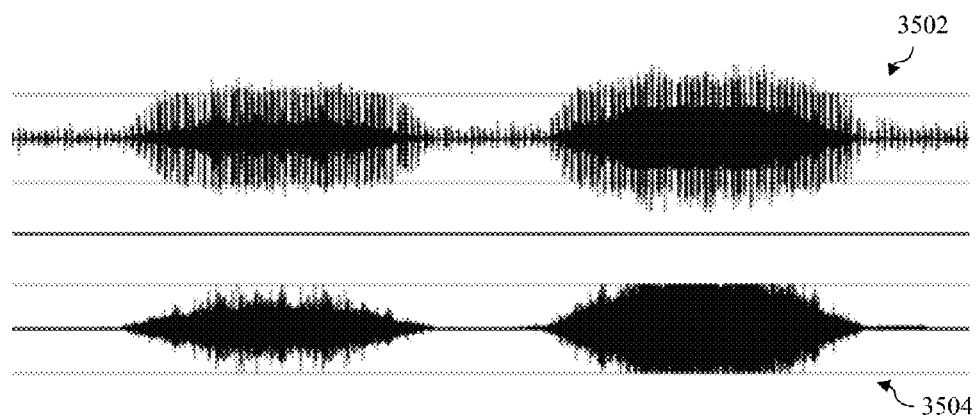
FIG. 35 depicts waveform plots of audio content presented to the right and left ear of a user to simulate and illustrate the effect of a telephony device that includes an SIE system.

In contrast, now assume that the user is using a telephony device that does include SIE system 700 to play back the far-end speech signal plotted in FIG. 31 in the context of the ambient background noise plotted in FIG. 32. Further assume that the telephony device includes a single loudspeaker that is housed in an ear bud which is inserted in the left ear of the user. In accordance with this example, FIG. 35 depicts a first waveform plot 3502 that represents the audio content presented to the left ear of the user and a second waveform plot 3504 that represents the audio content presented to the right ear of the user. As shown in FIG. 35, the right ear of the user is presented only the ambient background noise while the left ear of the user is presented with the SIE processed version of the far-end speech signal (shown in FIG. 33) plus the ambient background noise in order to simulate and illustrate the experience of a user in a noisy environment with an SIE enabled telephony device on the left ear. In this example, it can be seen from FIG. 35 how the SIE is able to successfully process the speech signal so that it stands out from the background noise. Here again, it is noted that due to a seal between the ear bud and the left ear of the user, the magnitude of the ambient background noise presented to the left ear is less than that presented to the right. It should be noted that duration of the waveforms in FIG. 31 through FIG. 35 is approximately 9 minutes and 30 seconds, and the two highly noisy segments are each of approximately 3 minutes duration.

III. Loudness Enhancement System and Method

A. Introduction to Loudness Enhancement

A loudness enhancement system and method will now be described that can be used to increase the loudness of an audio signal being played back by an audio device that places limits on the dynamic range of the audio signal. As will be described in more detail herein, the loudness enhancement system and method can advantageously be used to increase the loudness of the audio signal in a manner that introduces less distortion than simply over-driving the signal such that hard-clipping occurs. The loudness enhancement system and method may be integrated with an SIE system and method, such as any of those described above in Section II.

As discussed in the Background Section above, one approach to increasing the loudness of an audio signal played back by an audio device includes applying a gain to the audio signal such that certain peaks of the audio waveform will exceed a maximum digital amplitude supported by the audio device. This results in hard clipping, which introduces distortion into the played back audio signal. This approach will generally be referred to in this section as the "hard-clipping approach."

An alternative approach to increasing the loudness of the audio signal comprises applying compression such that smaller gains are applied to high-amplitude regions of the audio signal and larger gains are applied to low-amplitude regions of the audio signal to enhance loudness while still ensuring that the maximum digital amplitude supported by the audio device is not exceeded. This approach was fully described in Section II above in reference to the operation of compression logic 726 of SIE system 700. This approach may also be combined with the performance of spectral shaping to boost certain formants of the audio signal that are important to intelligibility. Such spectral shaping was fully described in Section II above in reference to the operation of spectral shaping block 702 of SIE system 700. Taken together, the combination of these methods will generally be referred to in this Section as "the SIE approach." However it is noted that this approach is only one manner of performing SIE and that various other methods of performing SIE were described above in Section II.

Figure 36:
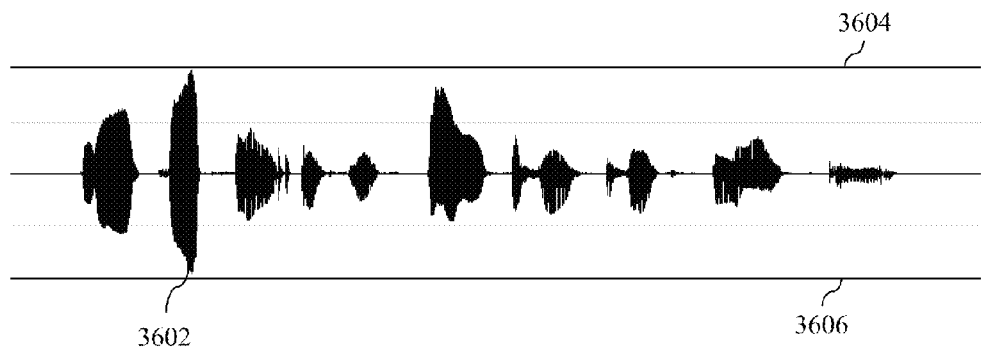
FIG. 36 is a time-domain representation of an example audio signal to be played back by an audio device.

The effect of each of these different approaches will now be described with reference to an example audio signal 3602 depicted in FIG. 36. In particular, FIG. 36 is a time-domain representation of an example audio signal 3602 to be played back by an audio device. Due to limits imposed by one or more processing stages of the audio device, portions of the audio signal that exceed a maximum digital amplitude cannot be played back. These limits are shown in FIG. 36 as a positive amplitude limit 3604 and a negative amplitude limit 3606. As also shown in FIG. 36, audio signal 3602 is scaled such that the largest positive waveform peaks of audio signal 3602 come close to, but do not exceed, positive amplitude limit 3604 and the largest negative waveform peaks of audio signal 3602 come close to, but do not drop below, negative amplitude limit 3606. Thus, audio signal 3602 should be able to be played back with little or no distortion.

Figure 37:
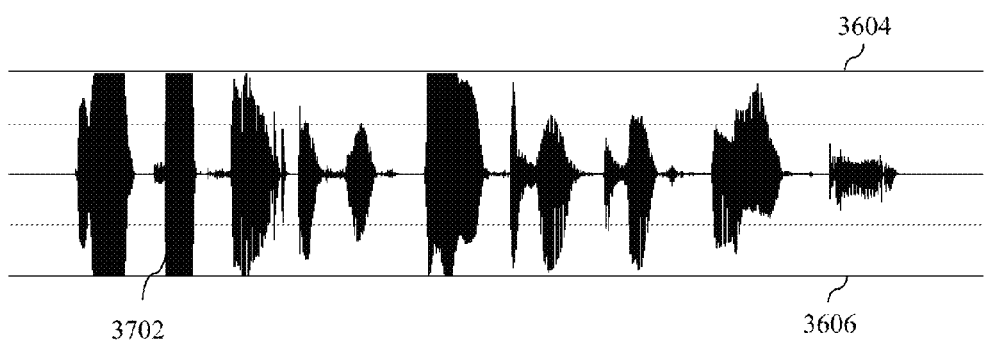
FIG. 37 is a time-domain representation of an example audio signal played back by an audio device that implements a hard clipping approach to loudness enhancement.

FIG. 37 is a time-domain representation of another example audio signal 3702. Example audio signal 3702 represents example audio signal 3602 after a user has increased the volume of the audio device in an implementation in which the audio device implements the hard clipping approach to loudness enhancement. As can be seen in FIG. 37, the application of the increased volume has caused many of the positive waveform peaks of audio signal 3702 to exceed positive amplitude limit 3604 and many of the negative waveform peaks of audio signal 3702 to drop below negative amplitude limit 3606. Since in this example the audio device implements the hard clipping approach to loudness enhancement, the portions of the waveform peaks that exceed limit 3604 or drop below limit 3606 will be hard clipped, thus causing audio signal 3702 to be distorted during playback.

Figure 38:
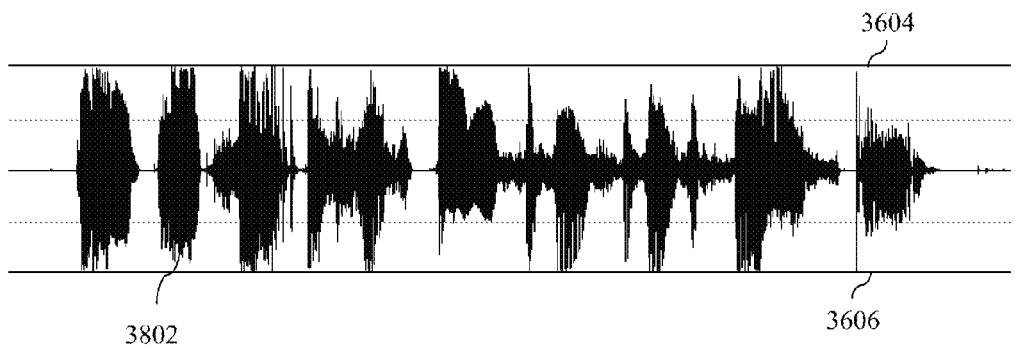
FIG. 38 is a time-domain representation of an example audio signal played back by an audio device that implements an SIE approach to loudness enhancement.

FIG. 38 is a time-domain representation of another example audio signal 3802. Example audio signal 3802 represents example audio signal 3602 after a user has increased the volume of the audio device in an implementation in which the audio device implements the SIE approach to loudness enhancement. As can be seen in FIG. 38, the application of the increased volume has caused smaller gains to be applied to certain high-amplitude regions of audio signal 3802 and larger gains to be applied to certain low-amplitude regions of audio signal 3802. However, the waveform peaks of audio signal 3802 are never permitted to exceed the maximum digital amplitude supported by the audio device. The result is that the loudness of audio signal 3802 when played back by the audio device is increased while less distortion is introduced as compared to the hard clipping approach.

However, there are limits to the SIE approach. These will now be discussed in reference to the graph shown in FIG. 39, which demonstrates the relationship between the quality and loudness of a played-back audio signal for an audio device that implements the hard clipping approach to loudness enhancement, represented by curve 3902, and an audio device that implements the SIE approach to loudness enhancement, represented by curve 3904. The audio signal used for this example was scaled to a maximum digital amplitude prior to the application of any gain. The quality and loudness are each shown at integer levels of gain ranging from 0 up to 36 dB. Loudness is approximated using an A-weighting scale and is represented in dBov (dB overload) while quality is measured using the Perceptual Evaluation of Speech Quality (PESQ) testing methodology.

Figure 39:
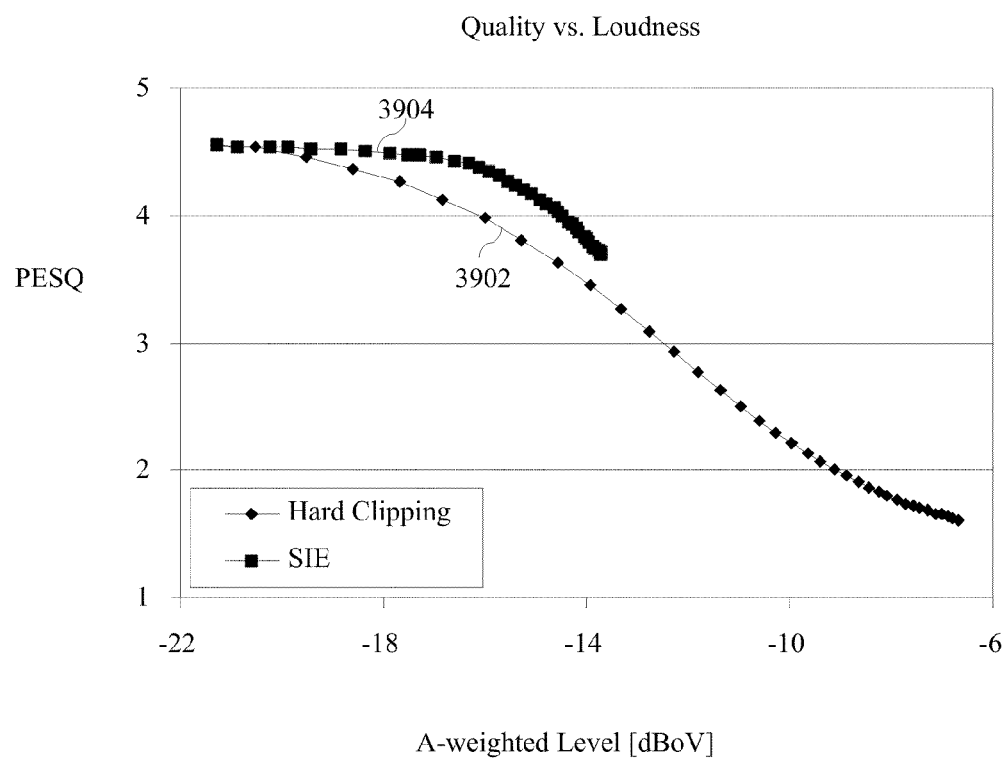
FIG. 39 depicts a graph that demonstrates a relationship between a perceived quality and loudness of an audio signal played back by an audio device that implements a hard clipping approach to loudness enhancement and an audio device that implements an SIE approach to loudness enhancement.

As shown in FIG. 39, although the quality of the played-back audio signal decreases as the loudness increases for both the hard clipping and SIE approaches, the SIE approach provides a significant quality improvement as compared to the hard clipping approach at similar loudness levels. However, the SIE approach is limited in terms of the maximum loudness that can be achieved. This makes sense, since the SIE approach (as that term has been defined for this section only) limits the magnitude of the waveform peaks to ensure that the maximum digital amplitude is not exceeded. As further shown in FIG. 39, the difference in quality between the SIE approach and the hard clipping approach drops off as the amount of gain applied to the audio signal increases. This is due, at least in part, to the additional distortion introduced by the increased amount of compression applied by the SIE approach at those levels.

Figure 40:
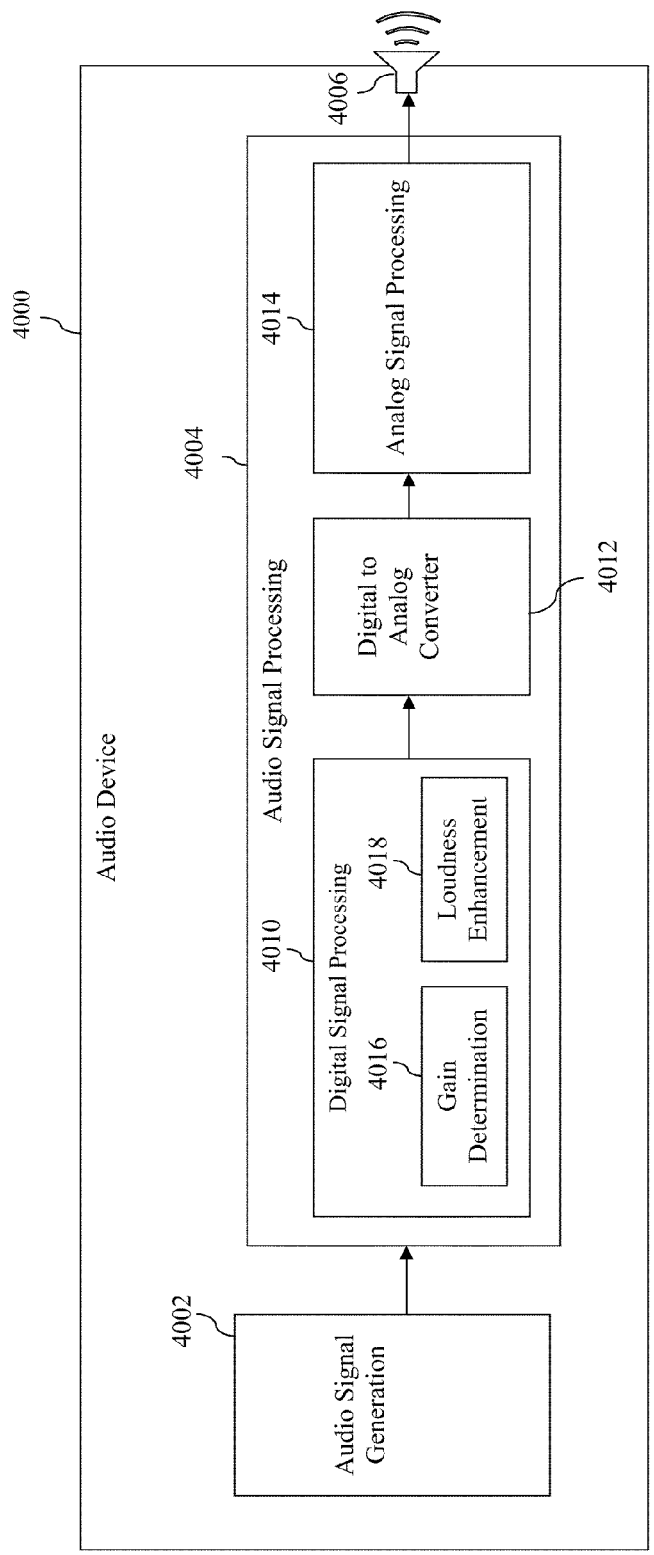
FIG. 40 is a block diagram of an audio device that includes a loudness enhancement system in accordance with an embodiment of the present invention.

FIG. 40 is a block diagram of an audio device 4000 that includes a loudness enhancement system in accordance with an embodiment of the present invention that is capable of providing improved quality as compared to both the hard clipping approach and the SIE approach as discussed above. The loudness enhancement system is also capable of providing improved loudness as compared to the SIE approach as discussed above.

Audio device 4000 is intended to represent any one of a wide variety of devices that are capable of processing an audio signal for playback to a user. For example, audio device 4000 may comprise a telephony-related device such as a cellular telephone, cordless handset, wired or wireless headset, or a hands-free speakerphone. Audio device 4000 may also comprise a device that is configured to play audio content such as a personal media player, handheld computing device, laptop computer or desktop computer. However, these examples are not intended to be limiting, and audio device 4000 may represent other types of devices that are configured to process an audio signal for playback to a user other than those listed above.

As shown in FIG. 40, audio device 4000 includes a number of interconnected elements including audio signal generation logic 4002, audio signal processing logic 4004, and a speaker 4006. Audio signal generation logic 4002 is configured to generate a digital representation of an audio signal for subsequent playback to a user. Depending upon the application, audio signal generation logic 4002 may produce the digital representation of the audio signal locally (e.g., by accessing a digital audio file stored in a memory that is internal to audio device 4000) and/or receive the digital representation of the audio signal from a remote entity or device, such as a telephone or remote computer, via a wired or wireless connection. In either case, audio signal generation logic 4002 may include logic for decrypting and/or decompressing the digital representation of the audio signal.

Audio signal processing logic 4004 is configured to process the digital representation of the audio signal received from audio signal generation logic 4002 to produce an analog representation of the audio signal suitable for playback to a user via speaker 4006. To perform this function, audio signal processing logic 4004 includes a number of interconnected components including digital signal processing logic 4010, a digital-to-analog converter 4012 and analog signal processing logic 4014. Digital signal processing logic 4010 is configured to perform operations on the digital representation of the audio signal received from audio signal generation logic 4002 to place it in condition for playback. Digital-to-analog converter 4012 is configured to receive the processed digital representation of the audio signal from digital signal processing logic 4010 and to convert it into an analog representation of the audio signal. Analog signal processing logic 4014 is configured to receive the analog representation of the audio signal from digital-to-analog converter 4012, to perform operations on the analog representation of the audio signal to further place it in condition for playback, and to provide the processed analog representation of the audio signal to speaker 4006. Speaker 4006 comprises an electro-mechanical transducer that operates in a well-known manner to convert the processed analog representation of the audio signal into sound waves for perception by a user.

As further shown in FIG. 40, digital signal processing logic 4010 includes gain determination logic 4016 and loudness enhancement logic 4018. Gain determination logic 4016 is configured to perform operations to determine a gain to be applied to the digital representation of the audio signal being processed by digital signal processing logic 4010. Gain determination logic 4016 may perform this function responsive to input provided by a user of audio device 4000 via a user interface (not shown in FIG. 40). Alternatively or additionally, gain determination logic 4016 may be configured to determine the gain to be applied to the digital representation of the audio signal based on the content of the audio signal itself and/or other factors or parameters.

In one implementation, gain determination logic 4016 implements one or more features of an SIE system described above in Section II and thus may operate to determine the gain to be applied to the digital representation of the audio signal based on one or more of user input (e.g., user volume control), automatic gain control (AGC) functionality, automatic volume boosting (AVB) functionality, and echo suppression functionality. Thus the gain determined by gain determination logic 4016 may comprise a combination of, for example, a user volume gain, an AGC gain, an AVB gain, and/or an echo suppression gain. Example techniques by which such gains may be determined are described in detail in Section II above.

Loudness enhancement logic 4018 is configured to receive the digital representation of the audio signal and the gain determined by gain determination logic 4016. Loudness enhancement logic 4018 is further configured to selectively modify the digital representation of the audio signal based on the gain to be applied thereto in a manner that produces greater signal loudness than that produced by the SIE approach to loudness enhancement discussed above in reference to FIGS. 36, 38 and 39. Loudness enhancement logic 4018 is also configured to produce the increased loudness in a manner that will introduce less distortion into the audio signal than the hard clipping and SIE approaches discussed above in reference to FIGS. 36-39. The manner in which loudness enhancement logic 4018 operates to perform this function will be described in detail below.

Although loudness enhancement logic 4018 is shown as part of digital signal processing logic 4010 and is described as operating on a digital representation of an audio signal, based on the teachings provided herein, persons skilled in the relevant art(s) will readily appreciate that the elements of loudness enhancement logic 4018 may also be implemented as part of analog signal processing logic 4014 and operate on an analog representation of the audio signal. Furthermore, audio device 4000 has been presented herein by way of example only. The present invention may be implemented in audio devices other than those configured in the manner described above with respect to audio device 4000.

B. Example Loudness Enhancement System

Figure 41:
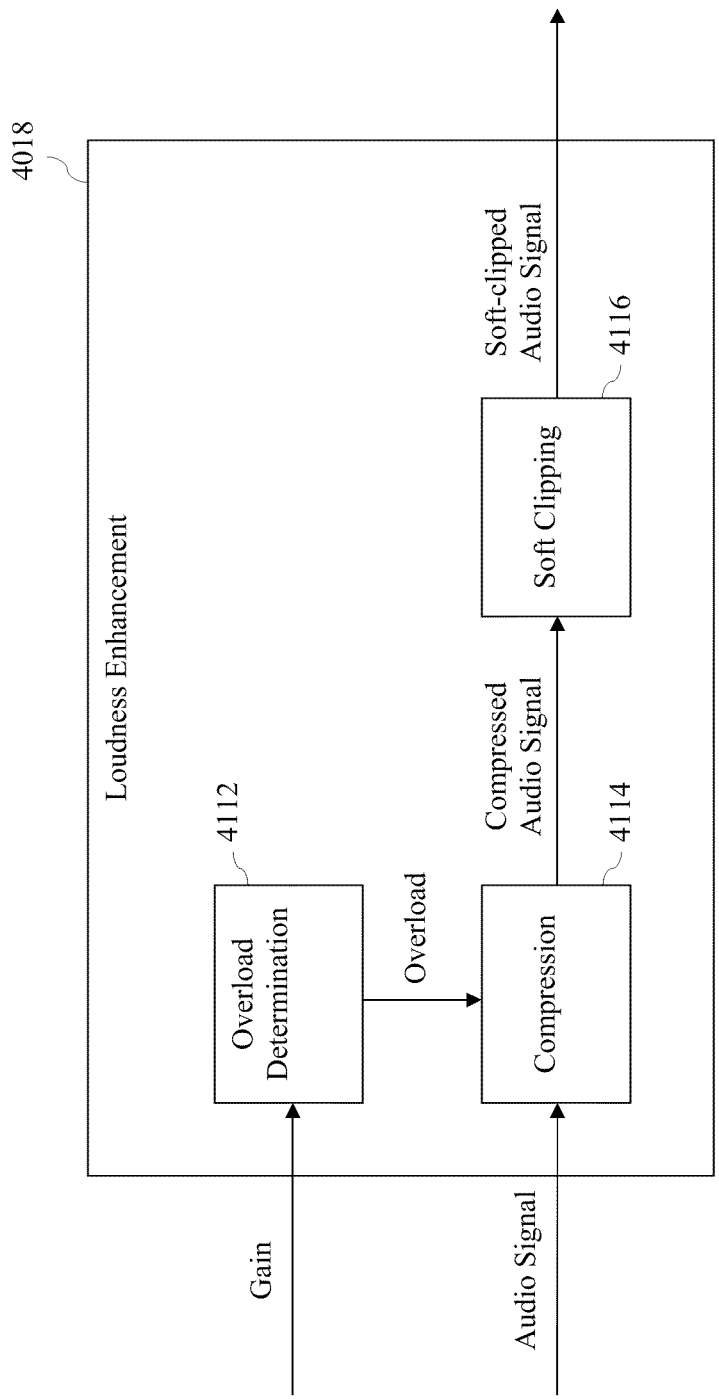
FIG. 41 is a block diagram of loudness enhancement logic in accordance with one embodiment of the present invention.

FIG. 41 is a block diagram of loudness enhancement logic 4018 in accordance with one embodiment of the present invention. As shown in FIG. 41, loudness enhancement logic 4018 includes several interconnected components—namely, overload determination logic 4112, compression logic 4114 and soft clipping logic 4116. Each of these components will be described in detail below.

Because loudness enhancement logic 4018 is part of digital signal processing logic 4010, it is to be understood that compression logic 4114 and soft clipping logic 4116 are each configured to operate on a digital representation of an audio signal. However, for the sake of brevity, the following sections will simply refer an "audio signal" rather than a "digital representation of an audio signal." Persons skilled in the relevant art(s) should understand that these terms may be used interchangeably.

1. Overload Determination Logic 4112

Overload determination logic 4112 is configured to receive a gain from gain determination logic 4016 that is to be applied to a portion of an audio signal received by compression logic 4114. Overload determination logic 4112 is further configured to determine an overload associated with the portion of the audio signal based on the gain. In an embodiment, overload determination logic 4112 determines the overload by determining what the longer-term level of the audio signal received by compression logic 4114 would be if the gain were applied and then subtracting a maximum desired output level from the determined level. In one embodiment, the overload is determined according to $$overLoad = SV56LevSpeech + gain - desiredMaxLevel$$

wherein SV56LevSpeech is the longer-term level of the signal, for example, approximating the SV56 level (as defined in ITU-T Recommendation P.56), gain is the gain received from gain determination logic 4016, and desiredMaxLevel is the maximum desired output level. In one embodiment, the gain is the sum of a user volume gain, an AGC gain and an AVB gain. The maximum desired output level may be, for example, the level at which digital saturation or hard clipping of the portion of the audio signal would occur. The maximum desired output level may also be some other level below or above the level at which digital saturation or hard clipping of the portion of the audio signal would occur depending upon the implementation. As shown in FIG. 41, the overload determined by overload determination logic 4112 is provided to compression logic 4114.

2. Compression Logic 4114

Compression logic 4114 is configured to receive a portion of an audio signal from audio signal generation logic 4002 or from another element within digital signal processing logic 4010 and an overload associated therewith from overload determination logic 4112. Compression logic 4114 is further configured to adaptively determine a compression limit associated with the portion of the audio signal based on the overload. The adaptively-determined compression limit is preferably greater than or equal to the maximum desired output level used to determine the overload. As noted above, depending upon the implementation, the maximum desired output level may be the level at which digital saturation or hard clipping of the portion of the audio signal would occur, or some other level.

In an embodiment, compression logic 4114 determines the compression limit associated with the portion of the audio signal by determining a compression boost as a function of the overload. Compression logic 4114 then adds the compression boost to the maximum desired output level to determine the compression limit for the portion of the audio signal. Depending upon the implementation, determining the compression boost as a function of the overload comprises applying a function that increases the compression boost as the overload increases.

Figure 42:
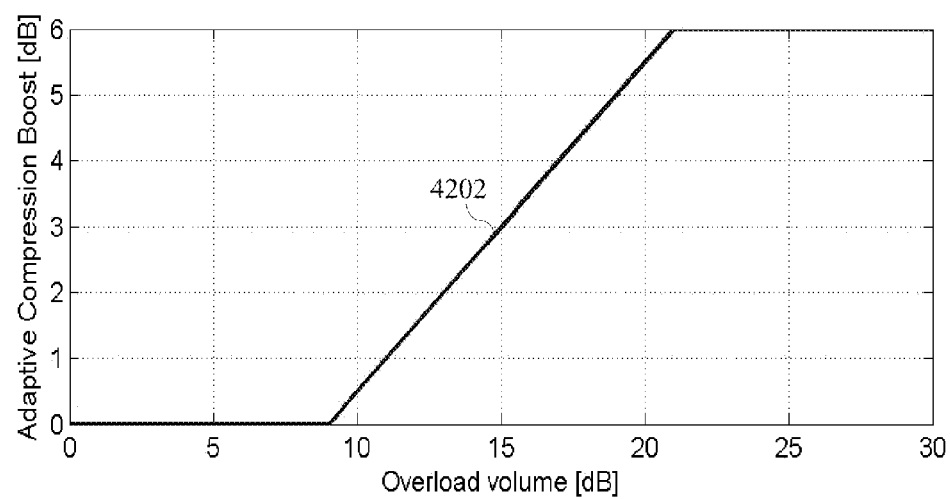
FIG. 42 depicts a graph that illustrates a mapping that may be used to determine a compression boost based on an overload associated with a portion of an audio signal in accordance with an embodiment of the present invention.

By way of example, FIG. 42 is a graph that illustrates an example mapping that may be used by compression logic 4114 to determine a compression boost based on an overload associated with a portion of an audio signal. The compression boost and overload are both represented in decibels. The mapping is represented by the line denoted 4202, which includes two flat portions and a sloped portion. As shown in FIG. 42, for an overload between 0 and 9 dB, a compression boost of zero is used. In this case, the compression limit will be the maximum desired output level. For an overload between 21 dB and 30 dB, a compression boost of 6 dB is used. In this case, the compression limit will be the maximum desired output level plus 6 dB. For an overload between 9 dB and 21 dB, a compression boost that increases linearly as a function of the overload will be used in accordance with the sloping portion of line 4202. In this case, the compression limit will be the sum of the maximum desired output level plus some value between 0 and 6 dB depending upon the overload. Note that the mapping shown in FIG. 42 is provided by way of example only and other functions may be used to determine a compression boost based on an overload.

After compression logic 4114 has adaptively determined the compression limit associated with the portion of the audio signal, compression logic 4114 then compresses the portion of the audio signal to generate a compressed portion of the audio signal having a level that does not exceed the compression limit. As will be understood by persons skilled in the relevant art(s), the term compression refers to the application of a time-varying gain to the portion of the audio signal such that more attenuation is applied to larger waveform peaks than to lower peaks. In effect, compression logic 4114 amplifies the low-amplitude regions of the portion of the audio signal relative to the high-amplitude regions without exceeding the adaptively-determined compression limit. In determining the time-varying gain, compression logic 4114 takes into account the gain provided by gain determination logic 4016.

In one embodiment, compression logic 4114 applies compression by applying the gain determined by gain determination logic 4016 to the portion of the audio signal. After application of the gain, segments of the portion of the audio signal are analyzed to determine a level associated therewith. If the level of a segment is less than a first predefined threshold, then the segment is output without modification. If the level of the segment is greater than the first predefined threshold but less than a second predefined threshold, then limited compression is applied to the segment, wherein the limited compression is characterized by a constant slew rate and wherein the level of the modified segment remains below the compression limit. If the level of the segment is greater than the second predefined threshold, then unlimited compression is applied to the segment in order to ensure that the level of the modified segment remains at the compression limit. One example of such a compression scheme is described in commonly-owned co-pending U.S. patent application Ser. No. 12/109,017 (entitled "Audio Signal Shaping for Playback by Audio Devices" and filed Apr. 24, 2008), the entirety of which is incorporated by reference herein. Note that this scheme is provided by way of example only and other compression schemes may be used.

Figure 43:
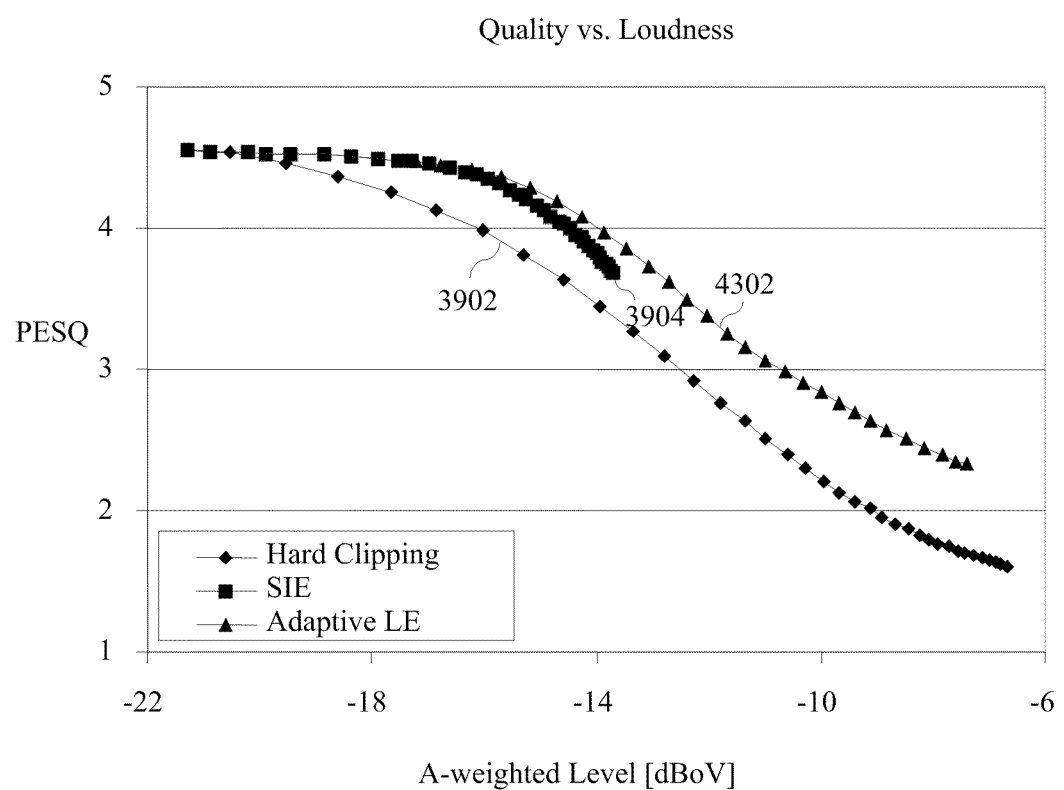
FIG. 43 depicts a graph that demonstrates a relationship between a perceived quality and loudness of an audio signal played back by an audio device that implements an approach to loudness enhancement in accordance with an embodiment of the present invention.

By applying compression to an adaptively-determined limit that is equal to or exceeds the maximum desired output level, compression logic 4114 advantageously allows loudness enhancement logic 4018 to produce an audio signal for playback that is louder than that produced by the SIE approach to loudness enhancement discussed above in reference to FIGS. 36, 38 and 39 and that includes less distortion than that produced by the hard clipping and SIE approaches discussed above in reference to FIGS. 36-39. This is demonstrated by the graph shown in FIG. 43, which includes a curve 4302 that represents the relationship between the quality and loudness of a played-back audio signal for an audio device that implements the foregoing approach of applying compression to an adaptively-determined limit above a maximum desired output level in addition to the techniques associated with the previously-mentioned SIE approach. This approach is referred to as "adaptive LE" for the purposes of the graph. As shown in the graph of FIG. 43, this approach yields better quality at similar volumes than the hard clipping and SIE approaches, represented by curves 3902 and 3904 respectively, and also can achieve greater loudness than the SIE approach.

It has been observed that there is a relationship between the overload associated with a portion of an audio signal and the benefit to be obtained in terms of increased loudness and quality from increasing the compression limit above the desired maximum output level for that portion of the audio signal. In particular, at very low levels of overload, there is very little advantage to be obtained from increasing the compression limit above the desired maximum output level. In contrast, at very high levels of overload, there is a fairly significant advantage to be obtained from increasing the compression limit above the desired maximum output level. Thus, in one embodiment of the present invention little or no compression boost above the maximum desired output level is used at lower levels of overload, a relatively low compression boost above the maximum desired output level is used at low to moderate levels of overload, and a higher compression boost above the maximum desired output level is used at moderate to high levels of overload. Such an approach may be implemented for example by using the overload to compression boost mapping previously described in reference to the graph of FIG. 42.

3. Soft Clipping Logic 4116

Soft clipping logic 4116 is configured to receive the compressed portion of the audio signal generated by compression logic 4114 and to apply soft clipping thereto to generate a soft-clipped portion of the audio signal. In an embodiment, soft clipping is applied such that the soft-clipped portion of the audio signal has a level that does not exceed a soft-clipping limit that is lower than the compression limit used by compression logic 4114. For example, the soft clipping limit may be the level at which digital saturation or hard clipping of the compressed portion of the audio signal would occur, or some other maximum desired output level. The soft clipping applied by soft clipping logic 4116 has the effect of improving the intelligibility and/or perceived quality of the compressed audio signal when the compressed audio signal exceeds the maximum digital amplitude supported by audio device 4000. However, because soft clipping will attenuate waveform peaks that come close to or exceed the soft clipping limit, the application of soft clipping may result in some reduction in loudness.

In one embodiment, soft clipping logic 4116 performs soft clipping on a sample-by-sample basis as follows. First, soft clipping logic 4116 determines a magnitude of a sample in the compressed portion of the audio signal. If the magnitude of the sample does not exceed a low bound, then no attenuation is applied and the sample is output by soft clipping logic 4116 without modification. However, if the magnitude of the sample exceeds the low bound, then soft clipping logic 4116 determines if the magnitude of the sample exceeds a high bound. If the magnitude of the sample does not exceed the high bound, then soft clipping logic 4116 attenuates the sample in accordance with a smoothing function, which in one embodiment comprises a quadratic type function, and outputs the modified sample. However, if the magnitude of the sample exceeds the high bound, then soft clipping logic 4116 attenuates the sample to the soft clipping limit and outputs the modified sample. One example of such a soft clipping scheme is described in commonly-owned co-pending U.S. patent application Ser. No. 12/109,017 (entitled "Audio Signal Shaping for Playback by Audio Devices" and filed Apr. 24, 2008), the entirety of which has been incorporated by reference herein. Note that this scheme is provided by way of example only and other soft clipping schemes may be used.

Figure 44:
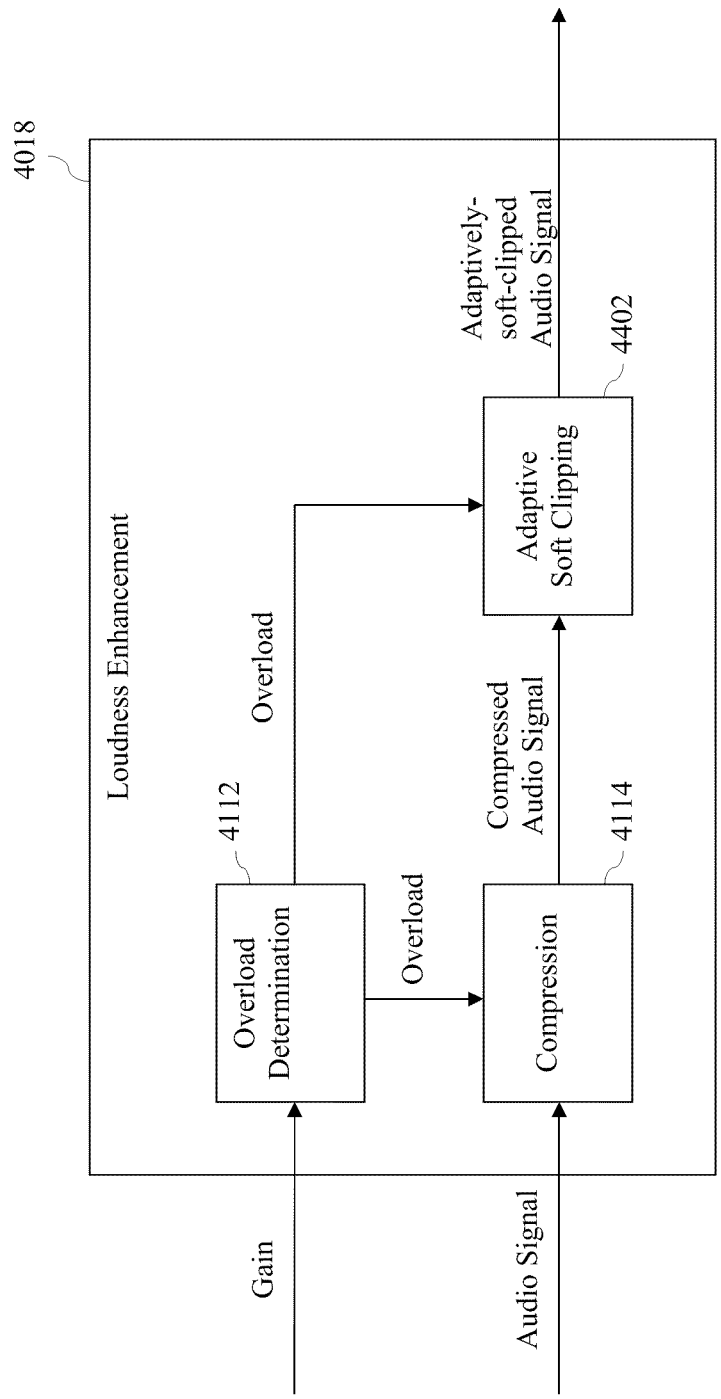
FIG. 44 is a block diagram of loudness enhancement logic in accordance with an alternate embodiment of the present invention.

In an alternate embodiment of the present invention, adaptive soft clipping rather than fixed soft clipping is applied to the compressed audio signal produced by compression logic 4114. Such an embodiment is depicted FIG. 44, which depicts an implementation of loudness enhancement logic 4018 in which soft clipping logic 4116 has been replaced by adaptive soft clipping logic 4402. Adaptive soft clipping logic 4402 is configured to apply adaptive soft clipping to the compressed portion of the audio signal to generate an adaptively-soft-clipped portion of the audio signal. In an embodiment, adaptive soft clipping is applied such that the adaptively-soft-clipped portion of the audio signal has a level that does not exceed a soft clipping limit that is lower than the compression limit used by compression logic 4114. For example, the soft clipping limit may be the level at which digital saturation or hard clipping of the compressed portion of the audio signal would occur, or some other maximum desired output level.

In one embodiment, adaptive soft clipping logic 4402 is configured to apply adaptive soft clipping by adaptively modifying a soft clipping function to be applied to the compressed audio signal output by compression logic 4114 over time. The adaptation of the soft clipping function may be based on one or more characteristics associated with the audio signal or on various other factors. For example, in one embodiment, adaptive soft clipping logic 4402 receives an overload associated with a compressed portion of the audio signal and then modifies the soft clipping function to be applied to the compressed portion of the audio signal based on the overload. Such overload may be determined by overload determination logic 4112 in a manner that was previously described and then provided to adaptive soft clipping logic 4402. Note that the overload provided to adaptive soft clipping logic 4402 may be the same as or different from the overload that is provided to compression logic 4114. For example, in one implementation, the overload provided to compression logic 4114 is determined using a longer-term level of the audio signal whereas the overload provided to adaptive soft clipping logic 4402 is determined using a shorter-term level of the audio signal. However, this is only one example, and other methods may be used for determining the overload(s) provided to compression logic 4114 and adaptive soft clipping logic 4402.

Figure 45:
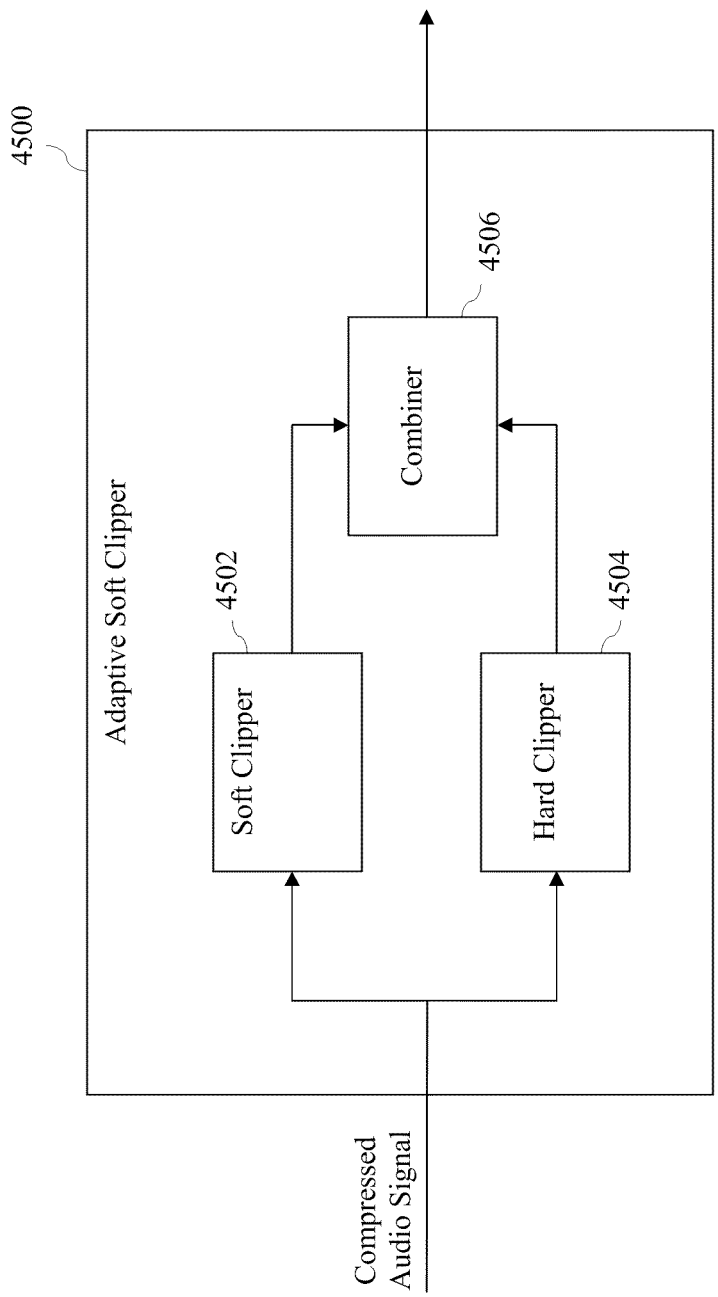
FIG. 45 is a block diagram of an adaptive soft clipper in accordance with an embodiment of the present invention.

In an alternate embodiment, adaptive soft clipping logic 4402 combines a soft-clipped version of the compressed audio signal with a hard-clipped version of the compressed audio signal to generate an output audio signal, wherein the proportion of each signal included in the output audio signal is adaptively determined based on the overload. Such an embodiment is depicted in FIG. 45, which is a block diagram of an adaptive soft clipper 4500 that may be used to implement adaptive soft clipping logic 4402 shown in FIG. 44. As shown in FIG. 45, adaptive soft clipper 4500 includes a soft clipper 4502, a hard clipper 4504, and a combiner 4506.

Soft clipper 4502 is configured to apply fixed soft clipping to a compressed portion of the audio signal produced by compression logic 4114 to generate a soft-clipped portion of the audio signal having a level that does not exceed a maximum desired output level. Hard clipper 4504 is configured to apply hard clipping to the compressed portion of the audio signal to generate a hard-clipped portion of the audio signal having a level that does not exceed the maximum desired output level. Combiner 4506 is configured to weight the soft-clipped portion of the audio signal to generate a weighted version of the soft-clipped portion of the audio signal and to weight the hard-clipped portion of the audio signal to generate a weighted version of the hard-clipped portion of the audio signal. Combiner 4506 is further configured to combine the weighted version of the soft-clipped portion of the audio signal with the weighted version of the hard-clipped portion of the audio signal to generate an adaptively-soft-clipped portion of the audio signal.

Generally speaking, it has been observed that the benefit of applying soft clipping to the compressed portion of the audio signal in terms of improved intelligibility and/or perceived quality increases as the overload associated with the portion of the audio signal increases. Thus, in one embodiment, combiner 4506 increases the weight applied to the soft-clipped portion of the audio signal as the overload increases and reduces the weight applied to the hard-clipped portion of the audio signal as the overload increases. This has the effect of adaptively increasing the amount of soft clipping applied to the compressed audio signal generated by compressor 4114 as the overload increases. In further accordance with such an embodiment, combiner 4506 is also configured to reduce the weight applied to the soft-clipped portion of the audio signal as the overload decreases and to increase the weight applied to the hard-clipped portion of the audio signal as the overload decreases. This has the effect of adaptively increasing the amount of hard clipping applied to the compressed audio signal generated by compressor 4114 as the overload decreases. This helps to conserve loudness by reducing the amount of soft clipping applied when the application of such soft clipping is less beneficial.

For example, combiner 4506 may generate an adaptively-soft-clipped audio signal $y_{adaptive}(n)$ by combining the soft clipped audio signal produced by soft clipper 4502, denoted $y_{soft\text{-}clip}(n)$, with the hard clipped audio signal produced by hard clipper 4504, denoted $y_{hard\text{-}clip}(n)$ in accordance with the following:

$$y_{adaptive}(n) = \beta \cdot y_{soft\text{-}clip}(n) + (1-\beta) \cdot y_{hard\text{-}clip}(n),$$

wherein $\beta$ is a scaling factor that is a function of overload and increases as the overload increases.

Figure 46:
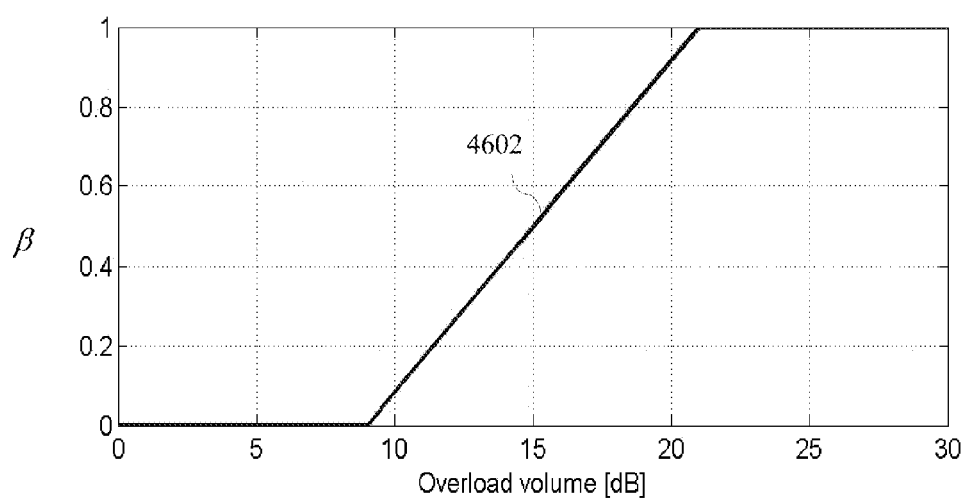
FIG. 46 depicts a graph that illustrates a mapping that may be used to determine an adaptive soft clipping scaling factor based on overload associated with a portion of an audio signal in accordance with an embodiment of the present invention.

By way of example, FIG. 46 is a graph that illustrates an example mapping that may be used by combiner 4506 to determine the scaling factor $\beta$ based on overload. The overload is represented in decibels. The mapping is represented by the line denoted 4602, which includes two flat portions and a sloped portion. As shown in FIG. 46, for an overload between 0 and 9 dB, a scaling factor $\beta$ of zero is used. In this case, the audio signal output by combiner 4506 will essentially be the output of hard clipper 4504. For an overload between 21 dB and 30 dB, a scaling factor $\beta$ of one is used. In this case, the audio signal output by combiner 4506 will essentially be the output of soft clipper 4502. For an overload between 9 dB and 21 dB, a scaling factor $\beta$ that increases linearly as a function of the overload will be used in accordance with the sloping portion of line 4602. In this case, the audio signal output by combiner 4506 will be a mix of the output of soft clipper 4502 and hard clipper 4504, wherein the proportion included from each is determined based on the scaling factor. Note that the mapping shown in FIG. 46 is provided by way of example only and other functions may be used to determine a scaling factor used for adaptive soft compression based on an overload.

Figure 47:
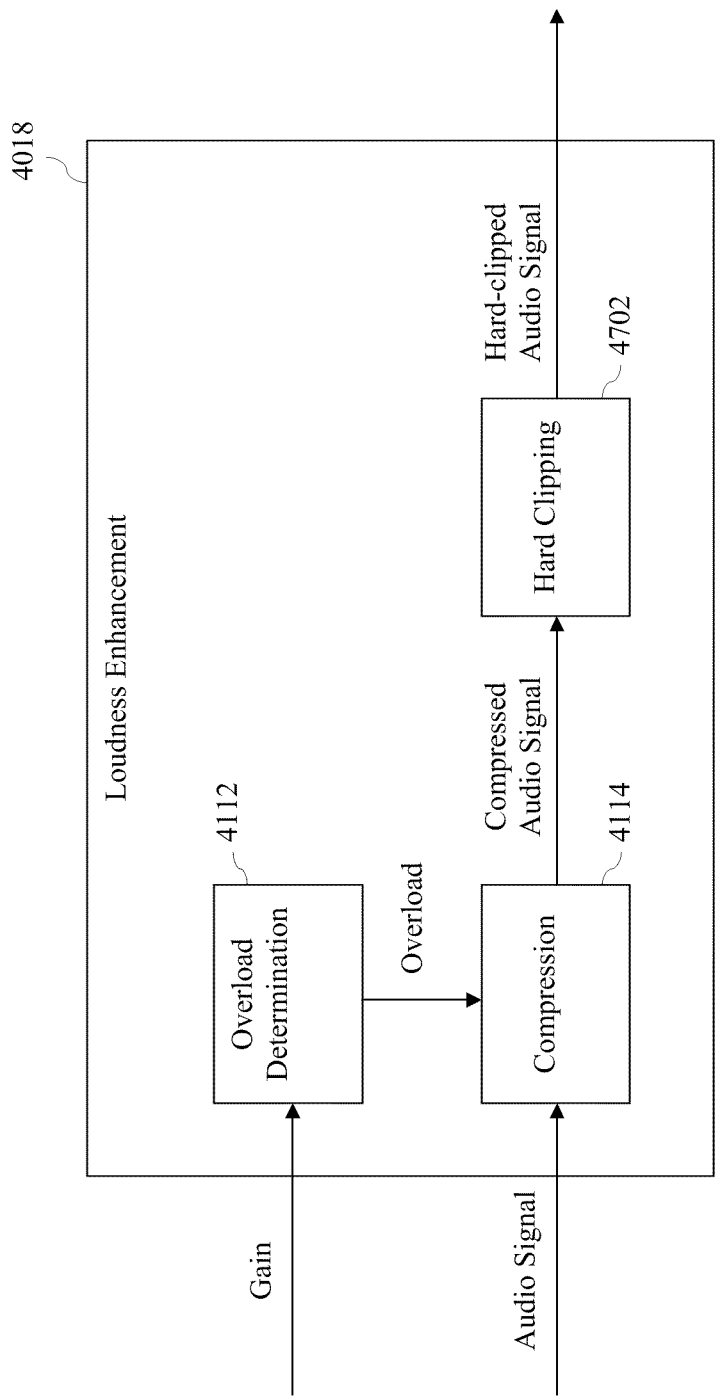
FIG. 47 is a block diagram of loudness enhancement logic in accordance with a further alternate embodiment of the present invention.

In a still further embodiment of the present invention, hard clipping rather than soft clipping may be applied to the compressed audio signal produced by compression logic 4114. Such an embodiment is depicted FIG. 47, which depicts an implementation of loudness enhancement logic 4018 in which soft clipping logic 4116 has been replaced by hard clipping logic 4702. Hard clipping logic 4702 is configured to apply hard clipping to a compressed portion of the audio signal received from compression logic 4114 to generate a hard-clipped portion of the audio signal having a level that does not exceed a hard clipping limit, which may be the digital saturation level of some other maximum desired output level.

Figure 48:
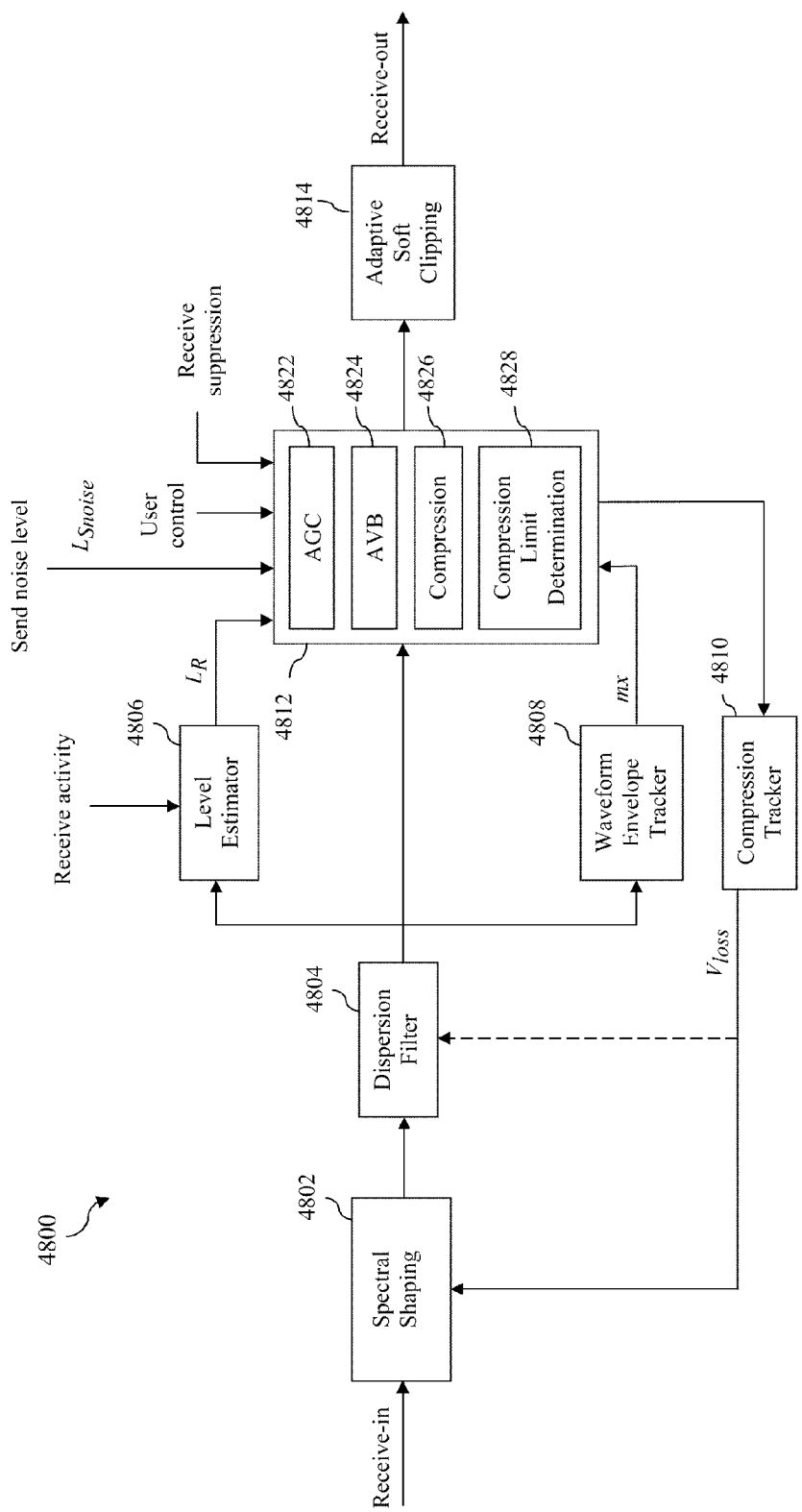
FIG. 48 is a block diagram of an example system that integrates SIE features and a loudness enhancement technique in accordance with an embodiment of the present invention.

FIG. 48 is a block diagram of an example system 4800 that integrates SIE features, such as those described above in Section II, with a loudness enhancement technique in accordance with an embodiment of the present invention. As shown in FIG. 48, system 4800 includes a spectral shaping block 4802, a dispersion filter 4804, a level estimator 4806, a waveform envelope tracker 4808, a compression tracker 4810, an AGC/AVB/compression block 4812 and an adaptive soft clipping block 4814. As further shown in FIG. 48, AGC/AVB/compression block 4812 includes AGC logic 4822, AVB logic 4824, compression logic 4826 and compression limit determination logic 4828.

Spectral shaping block 4802, dispersion filter 4804, level estimator 4806, waveform envelope tracker 4808, compression tracker 4810, AGC logic 4822 and AVB logic 4824 operate in a substantially similar manner to like-named components shown in system 700 of FIG. 7. The manner in which such components operate was previously described and thus will not be repeated here for the sake of brevity.

Compression logic 4826 operates in a like manner to compression logic 726 of system 700 except that the compression limit used by compression logic 4826 is adaptively determined by compression limit determination logic 4828. In particular, compression limit determination logic 4828 is configured to determine an overload associated with a portion of the audio signal output by spectral shaping block 4802/dispersion filter 4804 and then to determine a compression limit associated with the portion of the audio signal based on the overload, wherein the compression limit is greater than or equal to a maximum desired output level. The maximum desired output level may be, for example, a level at which digital saturation or hard clipping of the audio signal occurs. Compression logic 4826 then compresses the portion of the audio signal to generate a compressed portion of the audio signal having a level that does not exceed the compression limit. This approach to performing compression based on an adaptively-determined compression limit was also described above in reference to compression logic 4114.

Adaptive soft clipping block 4814 is connected to AGC/AVB/compression block 4812 and receives the compressed portion of the audio signal therefrom. Adaptive soft clipping block 4814 is configured to apply adaptive soft clipping to the compressed portion of the audio signal to generate an adaptively-soft-clipped portion of the audio signal having a level that does not exceed the maximum desired output level. The adaptively-soft-clipped portion of the audio signal is then output as part of the "receive-out" audio signal shown in FIG. 48. Various methods for performing such adaptive soft clipping were described above in reference to adaptive soft clipping logic 4402 of FIG. 44. In alternate embodiments, adaptive soft clipping block 4814 may be replaced by a fixed soft clipping block that operates in a like manner to soft clipping logic 4116 of FIG. 41 or a hard clipping block that operates in a like manner to hard clipping logic 4702 of FIG. 47.

In addition to helping to enhance the intelligibility of speech, certain components of system 4800 also help to improve the performance of the loudness enhancement technique as implemented through the operation of compression logic 4826, compression limit determination logic 4828 and adaptive soft clipping block 4814. For example, it has been observed that the operation of dispersion filter 4804 may further boost the loudness achieved by the loudness enhancement technique. Another benefit of dispersion filter 4804 is that it may reduce or eliminate "click"-like distortions that arise due to the instant attack of compression logic 4826. This issue was described above in Section II.B.5. As another example, the operation of spectral shaping block 4802 can compensate for a muffling effect that can occur due to severe hard clipping of the output speech signal, thereby making the receive-out signal sound more natural.

C. Example Loudness Enhancement Methods

Example methods for processing a portion of an audio signal to be played back by an audio device in a manner that enhances the loudness thereof will now be described in reference to flowcharts depicted in FIGS. 49 and 50.

Figure 49:
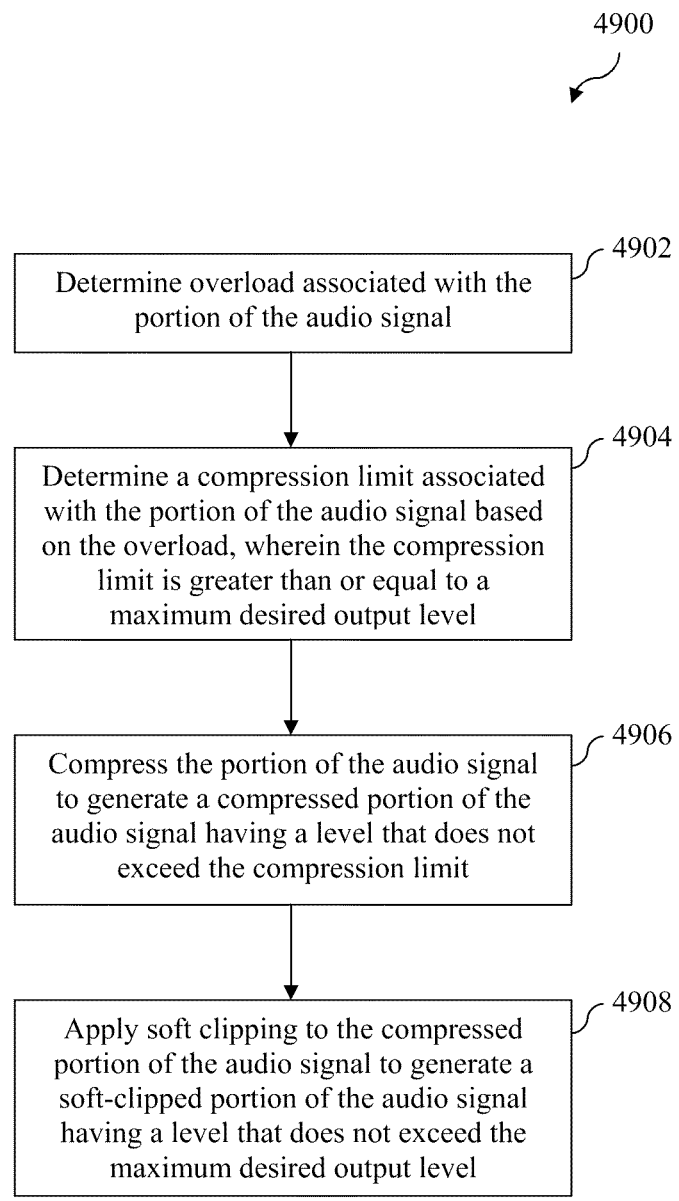
FIG. 49 depicts a flowchart of a method for processing a portion of a speech signal to be played back by an audio device in a manner that enhances the loudness thereof in accordance with an embodiment of the present invention.

In particular, FIG. 49 depicts a flowchart 4900 of a method for processing a portion of a speech signal to be played back by an audio device in a manner that enhances the loudness thereof. As shown in FIG. 49, the method of flowchart 4900 begins at step 4902 in which an overload associated with the portion of the audio signal is determined. In one embodiment, determining the overload associated with the portion of the audio signal includes determining a level of the audio signal after application of a gain thereto and subtracting the maximum desired output level from the determined level. The gain may include all applicable gains to be applied to the portion of the audio signal by a digital signal processing component and may include, for example, one or more of a user volume gain, an automatic gain control gain, an automatic volume boost gain, and an echo suppression gain.

At step 4904, a compression limit associated with the portion of the audio signal is determined based on the overload, wherein the compression limit is greater than or equal a maximum desired output level. In one embodiment, determining the compression limit comprises determining a compression boost as a function of the overload and then adding the compression boost to the maximum desired output level. Determining the compression boost as a function of the overload may include, for example, applying a function that increases the compression boost as the overload increases.

At step 4906, the portion of the audio signal is compressed to generate a compressed portion of the audio signal having a level that does not exceed the compression limit.

At step 4908, soft clipping is applied to the compressed portion of the audio signal to generate a soft-clipped portion of the audio signal having a level that does not exceed the maximum desired output level. Instead of applying soft clipping to the compressed portion of the audio signal as described above in reference to step 4908, an alternate embodiment of the invention applies adaptive soft clipping to the compressed portion of the audio signal. This may include modifying a soft clipping function to be applied to the compressed portion of the audio signal based on the overload. Alternatively, this may include performing the following steps. First, soft clipping is applied to the compressed portion of the audio signal to generate a soft-clipped portion of the audio signal having a level that does not exceed the maximum desired output level. Hard clipping is also applied to the compressed portion of the audio signal to generate a hard-clipped portion of the audio signal having a level that does not exceed the maximum desired output level. The soft-clipped portion of the audio signal and the hard-clipped portion of the audio signal are each weighted based on the overload to generate weighted versions thereof. The weighted versions of the soft-clipped portion of the audio signal and the hard-clipped portion of the audio signal are then combined.

In one implementation, weighting the soft-clipped portion of the audio signal and the hard-clipped portion of the audio signal based on the overload includes increasing a weight applied to the soft-clipped portion of the audio signal as the overload increases and reducing a weight applied to the hard-clipped portion of the audio signal as the overload increases.

In another alternate implementation of the method of flowchart 4900, rather than applying soft clipping to the compressed portion of the audio signal in step 4908, hard clipping may instead be applied to generate a hard-clipped portion of the audio signal having a level that does not exceed the maximum desired output level.

Figure 50:
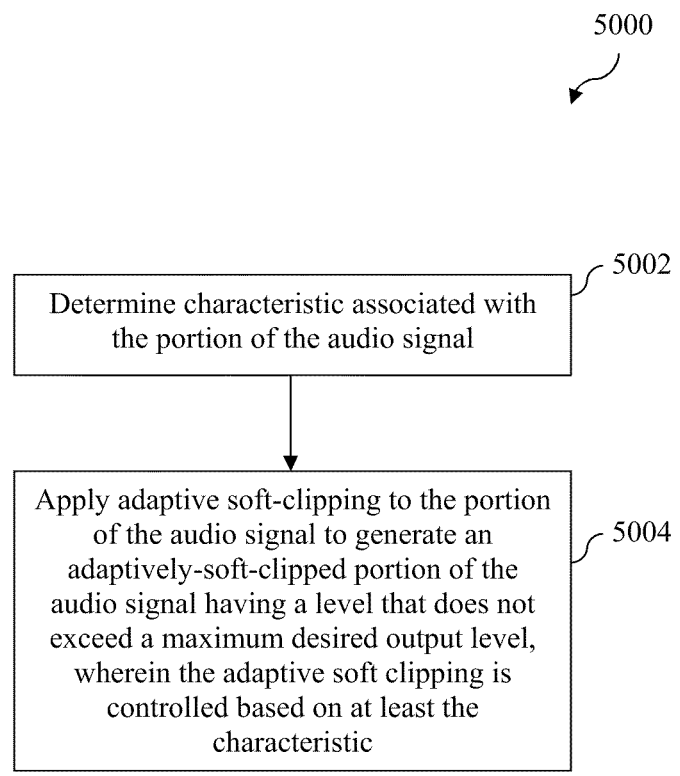
FIG. 50 depicts a flowchart of an alternate method for processing a portion of a speech signal to be played back by an audio device in a manner that enhances the loudness thereof in accordance with an embodiment of the present invention.

FIG. 50 depicts a flowchart 5000 of an alternate method for processing a portion of a speech signal to be played back by an audio device in a manner that enhances the loudness thereof. As shown in FIG. 50, the method of flowchart 5000 begins at step 5002 in which a characteristic associated with the portion of the audio signal is determined.

At step 5004, adaptive soft clipping is applied to the portion of the audio signal to generate an adaptively-soft-clipped portion of the audio signal having a level that does not exceed a maximum desired output level, wherein the adaptive soft clipping is controlled based on at least the characteristic.

In one embodiment, step 5002 may comprise determining an overload associated with the portion of the audio signal. The overload may be determined by determining a level of the audio signal after application of a gain thereto and subtracting a maximum desired output level from the determined level. In accordance with such an embodiment, applying adaptive soft clipping to the compressed portion of the audio signal may include modifying a soft clipping function to be applied to the compressed portion of the audio signal based on the overload. In further accordance with such an embodiment, applying adaptive soft clipping to the compressed portion of the audio signal may include several steps as follows. First, soft clipping is applied to the compressed portion of the audio signal to generate a soft-clipped portion of the audio signal having a level that does not exceed the maximum desired output level. Hard clipping is also applied to the compressed portion of the audio signal to generate a hard-clipped portion of the audio signal having a level that does not exceed the maximum desired output level. The soft-clipped portion of the audio signal and the hard-clipped portion of the audio signal are each weighted based on the overload to generate weighted versions thereof. The weighted versions of the soft-clipped portion of the audio signal and the hard-clipped portion of the audio signal are then combined.

In one implementation, weighting the soft-clipped portion of the audio signal and the hard-clipped portion of the audio signal based on the overload includes increasing a weight applied to the soft-clipped portion of the audio signal as the overload increases and reducing a weight applied to the hard-clipped portion of the audio signal as the overload increases.

IV. Example Computer System Implementations

It will be apparent to persons skilled in the relevant art(s) that various elements and features of the present invention, as described herein, may be implemented in hardware using analog and/or digital circuits, in software, through the execution of instructions by one or more general purpose or special-purpose processors, or as a combination of hardware and software.

Figure 51:
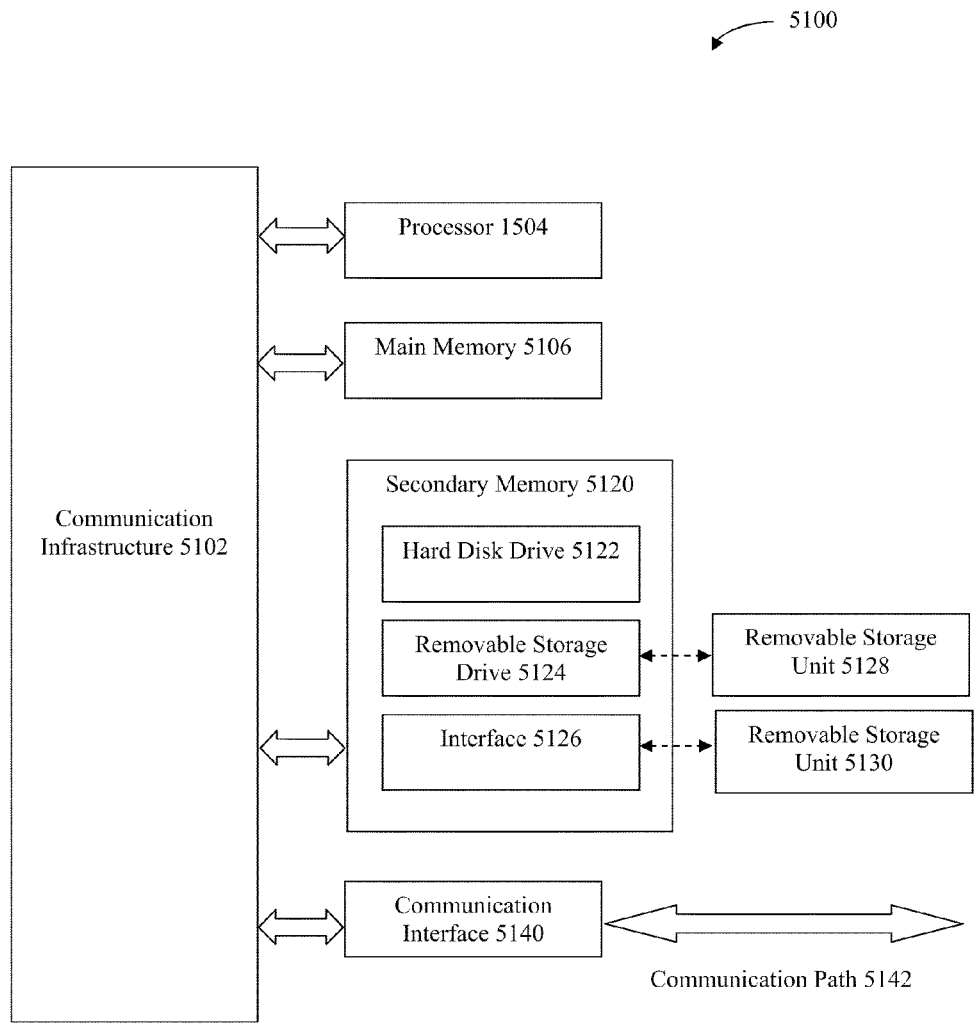
FIG. 51 is a block diagram of an example computer system that may be configured to implement various features of the present invention.

The following description of a general purpose computer system is provided for the sake of completeness. Embodiments of the present invention can be implemented in hardware, or as a combination of software and hardware. Consequently, embodiments of the invention may be implemented in the environment of a computer system or other processing system. An example of such a computer system 5100 is shown in FIG. 51. All of the signal processing blocks depicted in FIGS. 7, 8, 13-17, 40, 41, 44, 45, 47 and 48 for example, can execute on one or more distinct computer systems 5100. Furthermore, all of the steps of the flowcharts depicted in FIGS. 18-26, 49 and 50 can be implemented on one or more distinct computer systems 5100.

Computer system 5100 includes one or more processors, such as processor 5104. Processor 5104 can be a special purpose or a general purpose digital signal processor. Processor 5104 is connected to a communication infrastructure 5102 (for example, a bus or network). Various software implementations are described in terms of this exemplary computer system. After reading this description, it will become apparent to a person skilled in the relevant art(s) how to implement the invention using other computer systems and/or computer architectures.

Computer system 5100 also includes a main memory 5106, preferably random access memory (RAM), and may also include a secondary memory 5120. Secondary memory 5120 may include, for example, a hard disk drive 5122 and/or a removable storage drive 5124, representing a floppy disk drive, a magnetic tape drive, an optical disk drive, or the like. Removable storage drive 5124 reads from and/or writes to a removable storage unit 5128 in a well known manner. Removable storage unit 5128 represents a floppy disk, magnetic tape, optical disk, or the like, which is read by and written to by removable storage drive 5124. As will be appreciated by persons skilled in the relevant art(s), removable storage unit 5128 includes a computer usable storage medium having stored therein computer software and/or data.

In alternative implementations, secondary memory 5120 may include other similar means for allowing computer programs or other instructions to be loaded into computer system 5100. Such means may include, for example, a removable storage unit 5130 and an interface 5126. Examples of such means may include a program cartridge and cartridge interface (such as that found in video game devices), a removable memory chip (such as an EPROM, or PROM) and associated socket, and other removable storage units 5130 and interfaces 5126 which allow software and data to be transferred from removable storage unit 5130 to computer system 5100.

Computer system 5100 may also include a communications interface 5140. Communications interface 5140 allows software and data to be transferred between computer system 5100 and external devices. Examples of communications interface 5140 may include a modem, a network interface (such as an Ethernet card), a communications port, a PCM-CIA slot and card, etc. Software and data transferred via communications interface 5140 are in the form of signals which may be electronic, electromagnetic, optical, or other signals capable of being received by communications interface 5140. These signals are provided to communications interface 5140 via a communications path 5142. Communications path 5142 carries signals and may be implemented using wire or cable, fiber optics, a phone line, a cellular phone link, an RF link and other communications channels.

As used herein, the terms "computer program medium" and "computer usable medium" are used to generally refer to media such as removable storage units 5128 and 5130 or a hard disk installed in hard disk drive 5122. These computer program products are means for providing software to computer system 5100.

Computer programs (also called computer control logic) are stored in main memory 5106 and/or secondary memory 5120. Computer programs may also be received via communications interface 5140. Such computer programs, when executed, enable the computer system 5100 to implement the present invention as discussed herein. In particular, the computer programs, when executed, enable processor 5100 to implement the processes of the present invention, such as any of the methods described herein. Accordingly, such computer programs represent controllers of the computer system 5100. Where the invention is implemented using software, the software may be stored in a computer program product and loaded into computer system 5100 using removable storage drive 5124, interface 5126, or communications interface 5140.

In another embodiment, features of the invention are implemented primarily in hardware using, for example, hardware components such as application-specific integrated circuits (ASICs) and gate arrays. Implementation of a hardware state machine so as to perform the functions described herein will also be apparent to persons skilled in the relevant art(s).

V. Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention. For example, although embodiments of the present invention are described herein as operating within the context of a telephony terminal, the present invention is not so limited and embodiments of the present invention may be implemented in any device capable of processing an audio signal for playback. Furthermore, the processing of an audio signal for playback as described herein may encompass processing the audio signal for immediate playback, processing the audio signal for storage followed by subsequent retrieval and playback, processing the audio signal for playback by the same device on which such processing occurs, or processing the audio signal for transmission to and playback by a different device.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A method for processing a portion of an audio signal to be played back by an audio device, comprising:
   determining an overload associated with the portion of the audio signal, wherein the overload comprises an amount by which a level of the audio signal exceeds a maximum desired output level, the maximum desired output level being a level that when exceeded introduces distortion;
   determining a compression limit associated with the portion of the audio signal as a function of the overload, wherein the compression limit exceeds the maximum desired output level; and
   compressing the portion of the audio signal to generate a compressed portion of the audio signal having a level that exceeds the maximum desired output level and that does not exceed the compression limit.

2. The method of claim 1, wherein determining the overload associated with the portion of the audio signal comprises:
   determining a level of the audio signal after application of a gain thereto; and
   subtracting the maximum desired output level from the determined level.

3. The method of claim 2, wherein the gain comprises all applicable gains to be applied to the portion of the audio signal by a digital signal processing component.

4. The method of claim 2, wherein the gain comprises at least one of an automatic gain control gain, an automatic volume boost gain, a user volume gain and an echo suppression gain.

5. The method of claim 1, wherein determining the compression limit associated with the portion of the audio signal as a function of the overload comprises:
   determining a compression boost as a function of the overload; and
   adding the compression boost to the maximum desired output level.

6. The method of claim 5, wherein determining the compression boost as a function of the overload comprises applying a function that increases the compression boost as the overload increases.

7. The method of claim 1, further comprising:
   applying soft clipping to the compressed portion of the audio signal to generate a soft-clipped portion of the audio signal having a level that does not exceed the maximum desired output level.

8. The method of claim 1, further comprising:
   applying hard clipping to the compressed portion of the audio signal to generate a hard-clipped portion of the audio signal having a level that does not exceed the maximum desired output level.

9. The method of claim 1, further comprising:
   applying adaptive soft clipping to the compressed portion of the audio signal to generate an adaptively-soft-clipped portion of the audio signal having a level that does not exceed the maximum desired output level.

10. The method of claim 9, wherein applying adaptive soft clipping to the compressed portion of the audio signal comprises modifying a soft clipping function to be applied to the compressed portion of the audio signal based on the overload.

11. The method of claim 9, wherein applying adaptive soft clipping to the compressed portion of the audio signal comprises:
    applying soft clipping to the compressed portion of the audio signal to generate a soft-clipped portion of the audio signal having a level that does not exceed the maximum desired output level;
    applying hard clipping to the compressed portion of the audio signal to generate a hard-clipped portion of the audio signal having a level that does not exceed the maximum desired output level;
    weighting the soft-clipped portion of the audio signal and the hard-clipped portion of the audio signal based on the overload to generate weighted versions thereof; and
    combining the weighted versions of the soft-clipped portion of the audio signal and the hard-clipped portion of the audio signal.

12. The method of claim 11, wherein weighting the soft-clipped portion of the audio signal and the hard-clipped portion of the audio signal based on the overload comprises increasing a weight applied to the soft-clipped portion of the audio signal as the overload increases and reducing a weight applied to the hard-clipped portion of the audio signal as the overload increases.

13. The method of claim 1, further comprising:
    applying one or more of spectral shaping and dispersion filtering to the portion of the audio signal.

14. The method of claim 1, further comprising:
applying one or more of spectral shaping and dispersion filtering to the compressed portion of the audio signal.

15. The method of claim 1, further comprising:
constraining a rate at which a waveform envelope associated with the audio signal increases towards digital saturation.

16. The method of claim 1, wherein compressing the portion of the audio signal comprises:
adaptively adjusting a compression attack speed.

17. The method of claim 16, wherein adaptively adjusting the compression attack speed comprises adaptively adjusting the compression attack speed based at least on background noise information.

18. The method of claim 16, further comprising applying adaptive soft clipping to the compressed portion of the audio signal, wherein the adaptive soft clipping is controlled based at least on the compression attack speed.

19. A system for processing a portion of an audio signal to be played back by an audio device, comprising:
overload determination logic configured to determine an overload associated with the portion of the audio signal, wherein determining the overload comprises determining an amount by which a level of the audio signal exceeds a maximum desired output level, the maximum desired output level being a level that when exceeded introduces distortion; and
compression logic configured to determine a compression limit associated with the portion of the audio signal as a function of the overload, wherein the compression limit is greater than a maximum desired output level, and to compress the portion of the audio signal to generate a compressed portion of the audio signal having a level that exceeds the maximum desired output level and that does not exceed the compression limit.

20. The system of claim 19, wherein the overload determination logic is configured to determine the overload associated with the portion of the audio signal by determining a level of the audio signal after application of a gain thereto and subtracting the maximum desired output level from the determined level.

21. The system of claim 19, wherein the compression logic is configured to determine the compression limit by determining a compression boost as a function of the overload and adding the compression boost to the maximum desired output level.

22. The system of claim 21, wherein the compression logic is configured to determine the compression boost as a function of the overload by applying a function that increases the compression boost as the overload increases.

23. The system of claim 19, further comprising:
soft clipping logic configured to apply soft clipping to the compressed portion of the audio signal to generate a soft-clipped portion of the audio signal having a level that does not exceed the maximum desired output level.

24. The system of claim 19, further comprising:
hard clipping logic configured to apply hard clipping to the compressed portion of the audio signal to generate a hard-clipped portion of the audio signal having a level that does not exceed the maximum desired output level.

25. The system of claim 19, further comprising:
adaptive soft clipping logic configured to apply adaptive soft clipping to the compressed portion of the audio signal to generate an adaptively-soft-clipped portion of the audio signal having a level that does not exceed the maximum desired output level.

26. The system of claim 25, wherein the adaptive soft clipping logic is configured to modify a soft clipping function to be applied to the portion of the compressed audio signal based on the overload.

27. The system of claim 25, wherein the adaptive soft clipping logic comprises:
soft clipping logic configured to apply soft clipping to the compressed portion of the audio signal to generate a soft-clipped portion of the audio signal having a level that does not exceed the maximum desired output level;
hard clipping logic configured to apply hard clipping to the compressed portion of the audio signal to generate a hard-clipped portion of the audio signal having a level that does not exceed the maximum desired output level; and
a combiner configured to weight the soft-clipped portion of the audio signal and the hard-clipped portion of the audio signal based on the overload to generate weighted versions thereof and to combine the weighted versions of the soft-clipped portion of the audio signal and the hard-clipped portion of the audio signal.

28. The system of claim 27 wherein the combiner is configured to increase a weight applied to the soft-clipped portion of the audio signal as the overload increases and to reduce a weight applied to the hard-clipped portion of the audio signal as the overload increases.

29. A method for processing a portion of an audio signal to be played back by an audio device, comprising:
determining a characteristic associated with the audio signal; and
applying adaptive soft clipping to the portion of the audio signal to generate an adaptively-soft-clipped portion of the audio signal having a level that does not exceed a maximum desired output level, wherein the adaptive soft clipping is controlled based on at least the characteristic, adaptive soft clipping comprising:
combining a weighted version of the soft-clipped portion of the audio signal and a weighted version of a hard-clipped portion of the audio signal.

30. The method of claim 29, wherein determining the characteristic comprises:
determining an overload associated with the audio signal.

31. The method of claim 30, wherein applying adaptive soft clipping to the portion of the audio signal comprises modifying a soft clipping function to be applied to the portion of the audio signal based on the overload.

32. The method of claim 30, wherein applying adaptive soft clipping to the portion of the audio signal based on the overload comprises:
applying soft clipping to the portion of the audio signal to generate the soft-clipped portion of the audio signal having a level that does not exceed the maximum desired output level;
applying hard clipping to the portion of the audio signal to generate the hard-clipped portion of the audio signal having a level that does not exceed a maximum desired output level; and
weighting the soft-clipped portion of the audio signal and the hard-clipped portion of the audio signal based on the overload to generate the weighted versions thereof.

33. The method of claim 32, wherein weighting the soft-clipped portion of the audio signal and the hard-clipped portion of the audio signal based on the overload comprises increasing a weight applied to the soft-clipped portion of the audio signal as the overload increases and reducing a weight applied to the hard-clipped portion of the audio signal as the overload increases.

34. The method of claim 29, further comprising:
applying one or more of spectral shaping and dispersion filtering to the portion of the audio signal.

35. The method of claim 29, further comprising:
applying one or more of spectral shaping and dispersion filtering to the adaptively-soft-clipped portion of the audio signal.

36. The method of claim 29, further comprising:
constraining a rate at which a waveform envelope associated with the audio signal increases towards digital saturation.

37. The method of claim 29, wherein compressing the portion of the audio signal comprises:
adaptively adjusting a compression attack speed.

38. The method of claim 37, wherein adaptively adjusting the compression attack speed comprises adaptively adjusting the compression attack speed based at least on background noise information.

39. The method of claim 37, further comprising applying adaptive soft clipping to the compressed portion of the audio signal, wherein the adaptive soft clipping is controlled based at least on the compression attack speed.

40. The method of claim 29, further comprising:
compressing the portion of the audio signal prior to applying adaptive soft clipping thereto.

41. A system for processing a portion of an audio signal to be played back by an audio device, comprising:
characteristic determination logic configured to determine a characteristic associated with the portion of the audio signal; and
adaptive soft clipping logic configured to apply adaptive soft clipping to the compressed portion of the audio signal to generate an adaptively-soft-clipped portion of the audio signal having a level that does not exceed a maximum desired output level, wherein the adaptive soft clipping is controlled based on at least the characteristic, the adaptive soft clipping logic comprising:
a combiner configured to combine a weighted version of the soft-clipped portion of the audio signal and a weighted version of a hard-clipped portion of the audio signal.

42. The system of claim 41, wherein the characteristic determination logic comprises:
overload determination logic configured to determine an overload associated with the portion of the audio signal.

43. The system of claim 42, wherein the adaptive soft clipping logic is configured to modify a soft clipping function to be applied to the compressed portion of the audio signal based on the overload.

44. The system of claim 42, wherein the adaptive soft clipping logic comprises:
soft clipping logic configured to apply soft clipping to the compressed portion of the audio signal to generate the soft-clipped portion of the audio signal having a level that does not exceed the maximum desired output level; and
hard clipping logic configured to apply hard clipping to the compressed portion of the audio signal to generate the hard-clipped portion of the audio signal having a level that does not exceed a maximum desired output level;
wherein the combiner is further configured to weight the soft-clipped portion of the audio signal and the hard-clipped portion of the audio signal based on the overload to generate the weighted versions thereof.

45. The system of claim 44, wherein the combiner is configured to increase a weight applied to the soft-clipped portion of the audio signal as the overload increases and to reduce a weight applied to the hard-clipped portion of the audio signal as the overload increases.

* * * * *